(12) United States Patent
Hirose et al.

(10) Patent No.: US 9,431,240 B2
(45) Date of Patent: *Aug. 30, 2016

(54) METHOD OF MANUFACTURING SEMICONDUCTOR DEVICE

(71) Applicant: HITACHI KOKUSAI ELECTRIC INC., Tokyo (JP)

(72) Inventors: Yoshiro Hirose, Toyama (JP); Atsushi Sano, Toyama (JP); Katsuyoshi Harada, Toyama (JP); Satoshi Shimamoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 411 days.

This patent is subject to a terminal disclaimer.

(21) Appl. No.: 14/021,239

(22) Filed: Sep. 9, 2013

(65) Prior Publication Data

US 2014/0073142 A1 Mar. 13, 2014

(30) Foreign Application Priority Data

Sep. 11, 2012 (JP) ................................. 2012-199536

(51) Int. Cl.
*H01L 21/02* (2006.01)
*H01L 21/67* (2006.01)
(Continued)

(52) U.S. Cl.
CPC ......... *H01L 21/02271* (2013.01); *C23C 16/30* (2013.01); *C23C 16/45531* (2013.01); *C23C 16/45553* (2013.01); *H01L 21/0217* (2013.01); *H01L 21/0228* (2013.01); *H01L 21/02167* (2013.01); *H01L 21/02211* (2013.01);
(Continued)

(58) Field of Classification Search
CPC .............. H01L 21/02; H01L 21/02104; H01L 21/02271
See application file for complete search history.

(56) References Cited

U.S. PATENT DOCUMENTS 8,785,333 B2 * 7/2014 Hashimoto ............. C23C 16/30 118/715
2004/0119132 A1 * 6/2004 Akiyama .......... H01L 21/76275 257/501

(Continued)

FOREIGN PATENT DOCUMENTS

JP 2004-136661 A 5/2004
JP 2007-324536 A 12/2007
(Continued)

OTHER PUBLICATIONS

Su, Kai, et al., "Synthesis, Characterization, and Ceramic Conversion Reactions of Borazine-Modified Hydridopolysilazanes: New Polymeric Precursors to SiNCB Ceramic Composites." Chem. Mater. 1993, 5, 547-556.*

(Continued)

*Primary Examiner* — Bret Chen
(74) *Attorney, Agent, or Firm* — Volpe and Koenig, P.C.

(57) ABSTRACT

A method of manufacturing a semiconductor is provided. The method includes forming a thin film including a predetermined element and a borazine ring skeleton is formed on a substrate by performing a cycle a predetermined number of times. The cycle includes supplying a source gas including the predetermined element and a halogen group to the substrate and supplying a reaction gas including a borazine compound to the substrate under a condition where the borazine ring skeleton in the borazine compound is maintained.

11 Claims, 23 Drawing Sheets

(51) Int. Cl.
*C23C 16/30* (2006.01)
*C23C 16/455* (2006.01)

(52) U.S. Cl.
CPC ......... *H01L21/02274* (2013.01); *H01L 21/67* (2013.01); *H01L 21/67109* (2013.01)

(56) References Cited

U.S. PATENT DOCUMENTS

2009/0130860 A1* 5/2009 Miya ................... C23C 16/4405 438/778
2009/0286402 A1 11/2009 Xia et al.
2012/0184110 A1 7/2012 Hirose et al.

FOREIGN PATENT DOCUMENTS

| JP | 2011-521452 A | 7/2011 |
|----|---------------|--------|
| JP | 2011-181599 A | 9/2011 |
| JP | 2012-160704 A | 8/2012 |

OTHER PUBLICATIONS

Fanny Schurz, Martin Jansen. Borazine based molecular single source precursors for Si/B/N/C ceramics. Zeitschrift für Anorganische und Allgemeine Chemie, 2010, 636 (7), pp. 1199:1-8.*

Li, Bin, et al "Fabrication and properties of borazine derived boron nitride bonded porous silicon aluminum oxynitride wave-transparent composite". Journal of the European Ceramic Society 34 (2014) 3591-3595.*

Kane et al. "Use of SiBN and SiBON Films Prepared by Plasma Enhanced Chemical Vapor Deposition from Borazine as Interconnection Dielectrics" Journal of the Electrochemical Society, Feb. 1997, vol. 144, No. 2, p. 658-663.

* cited by examiner

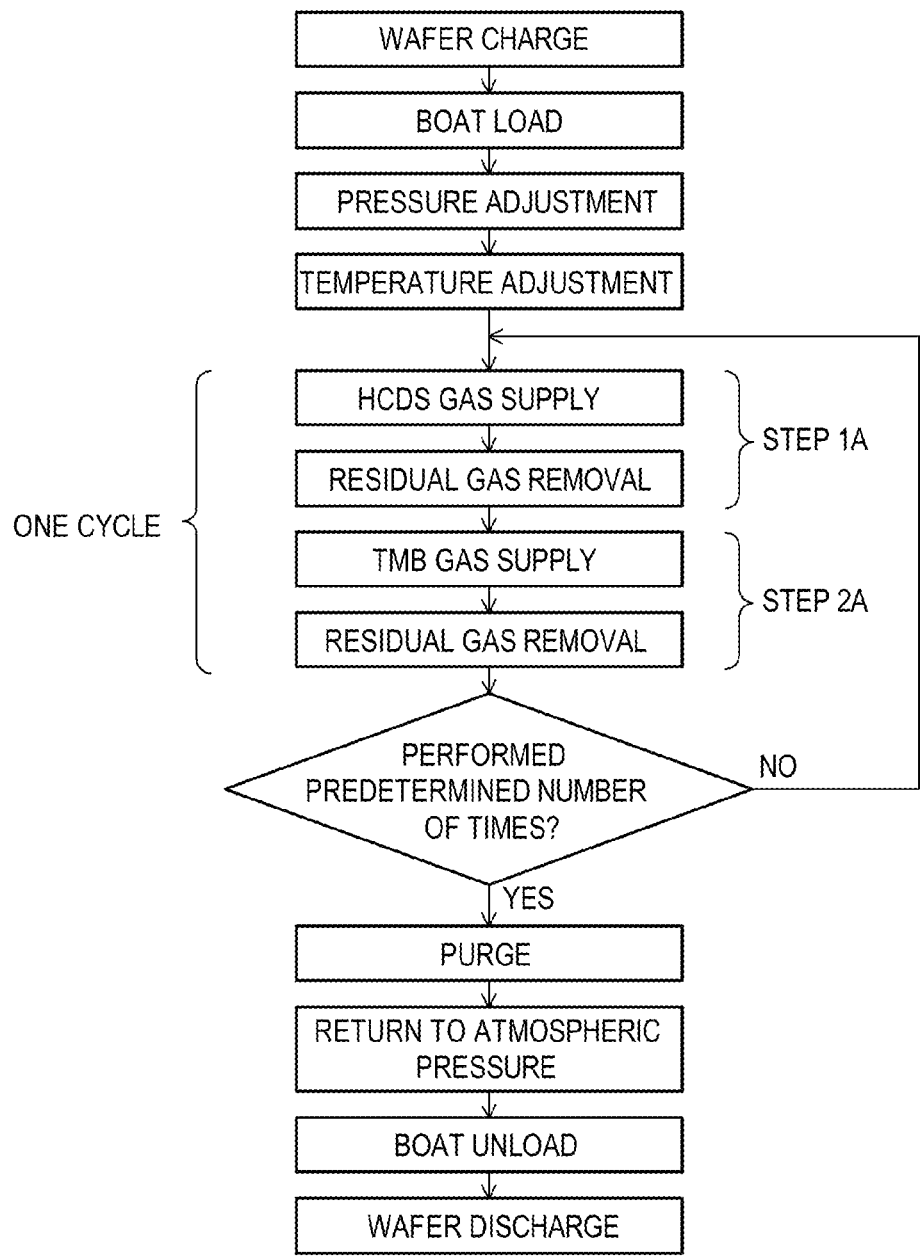

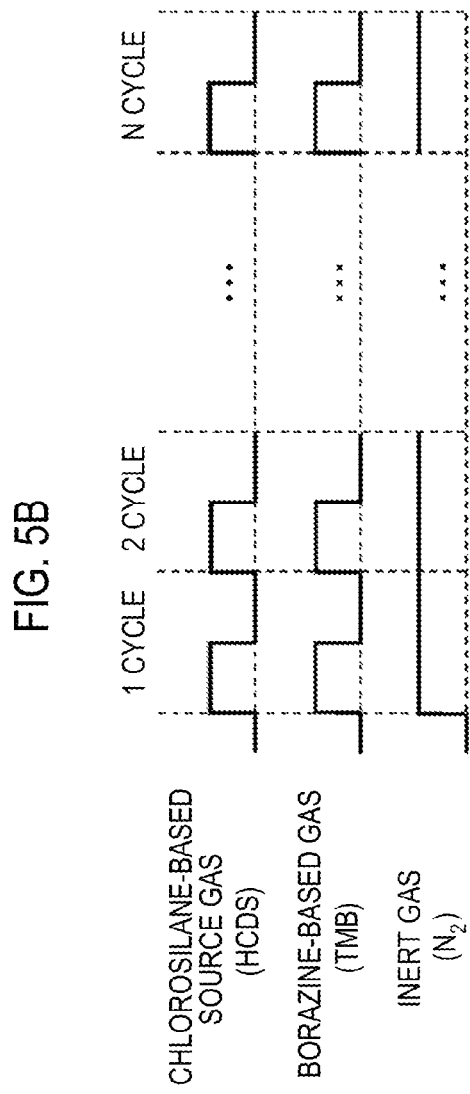

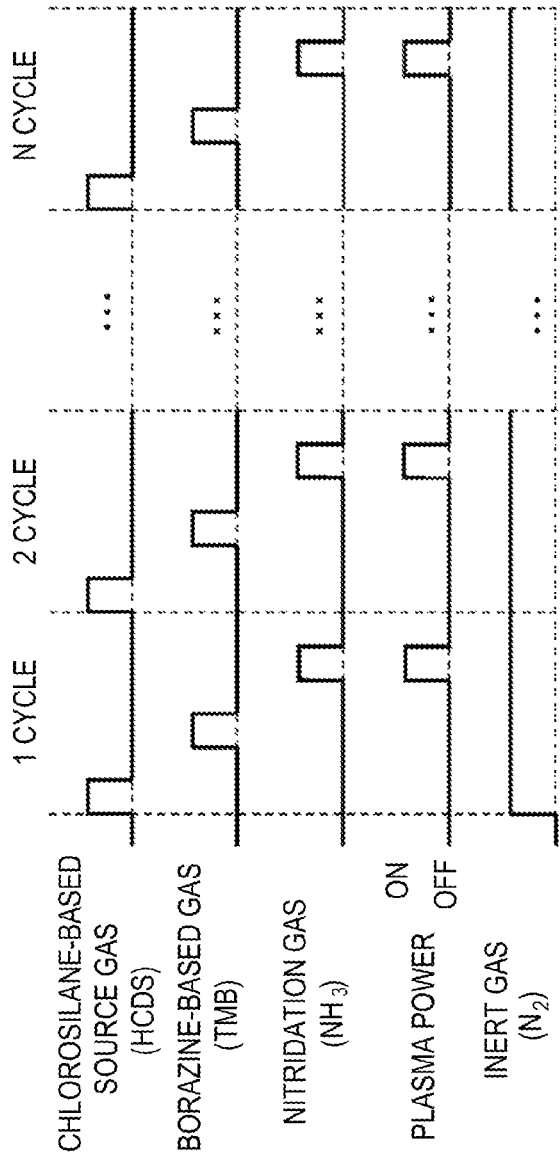

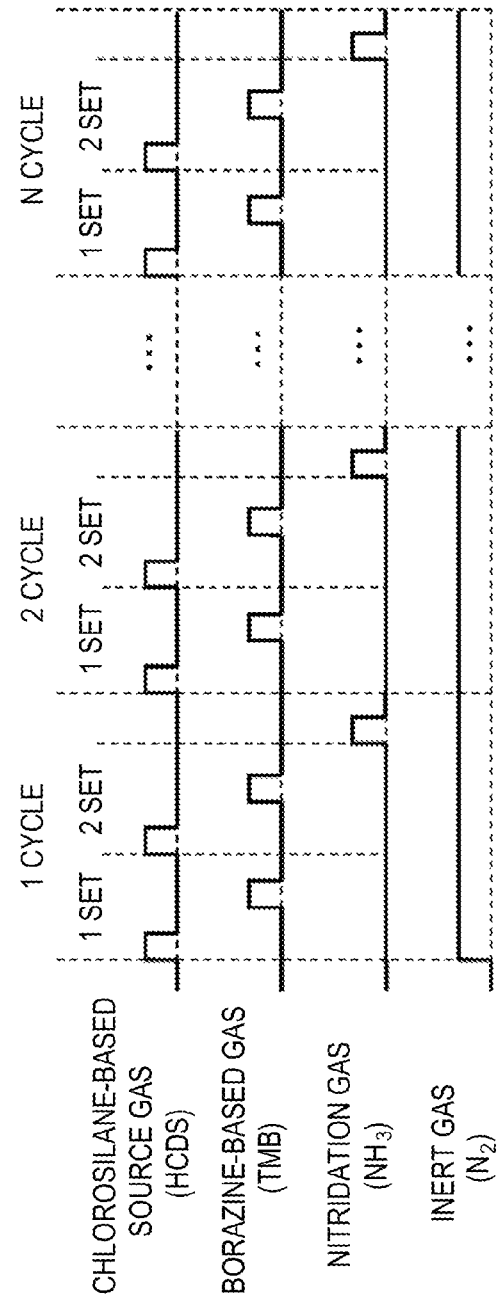

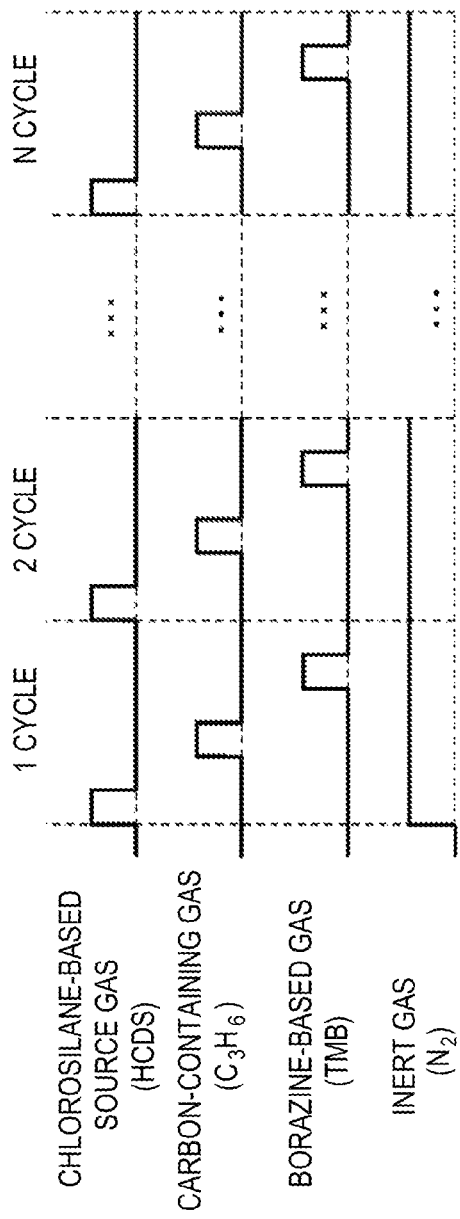

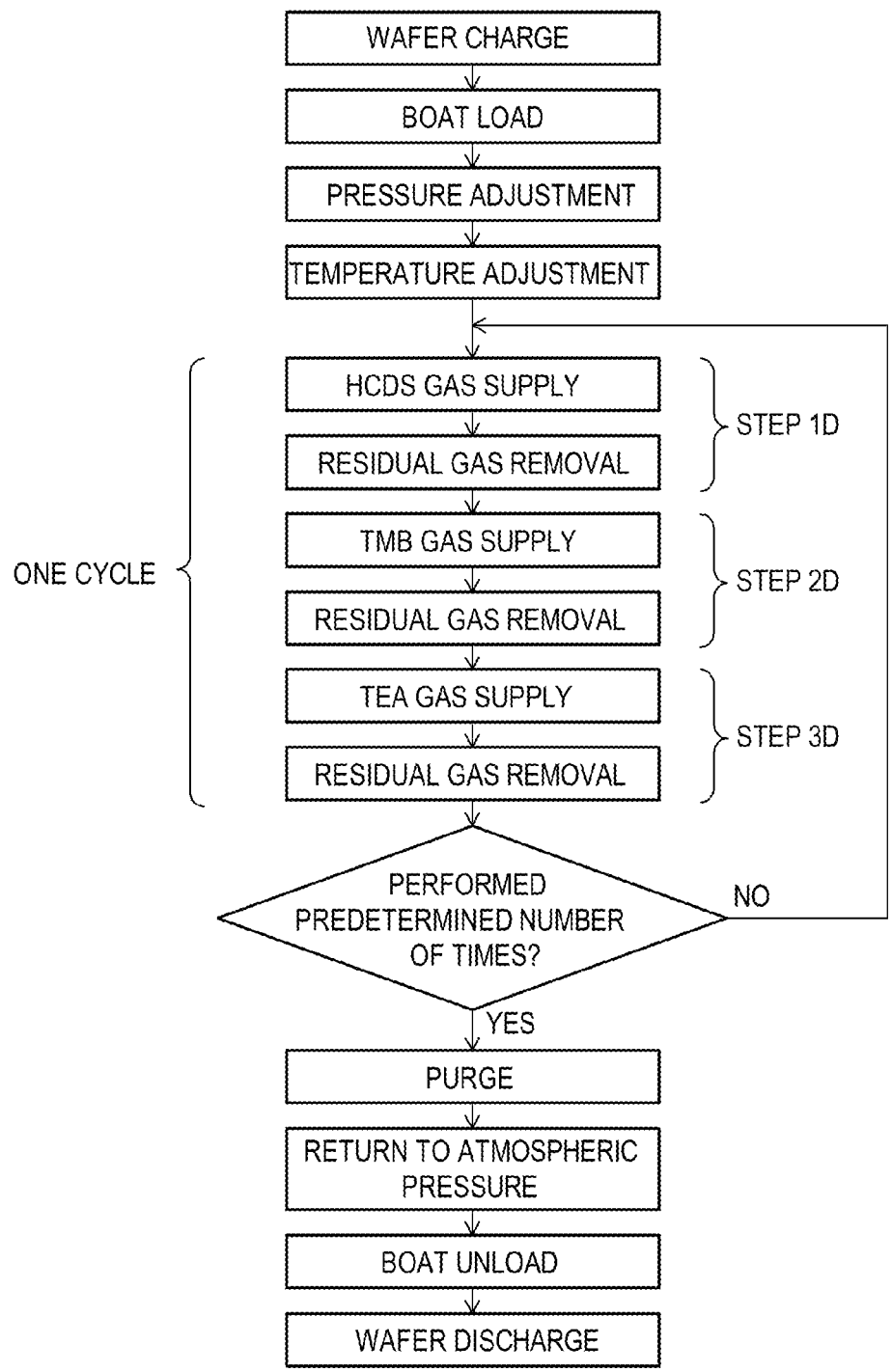

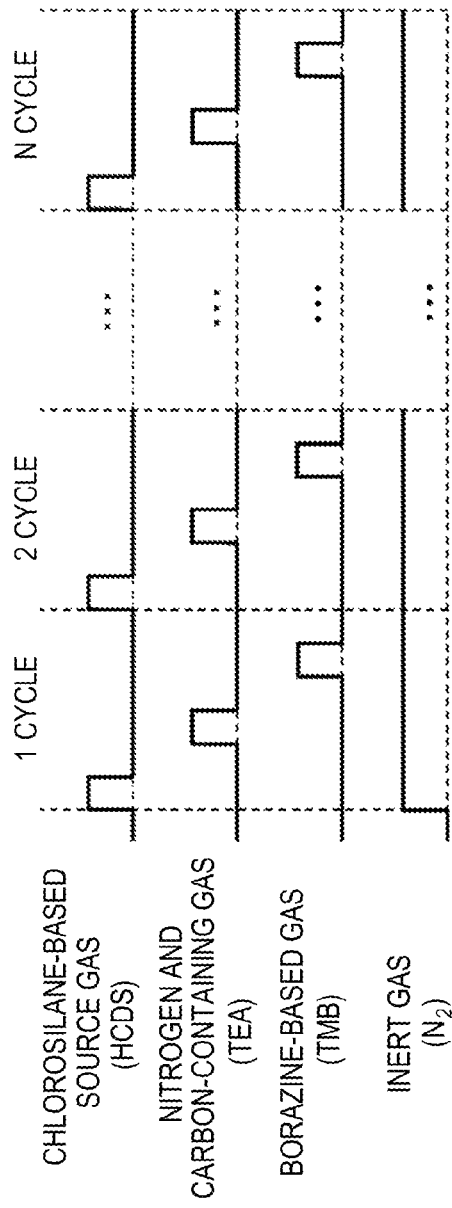

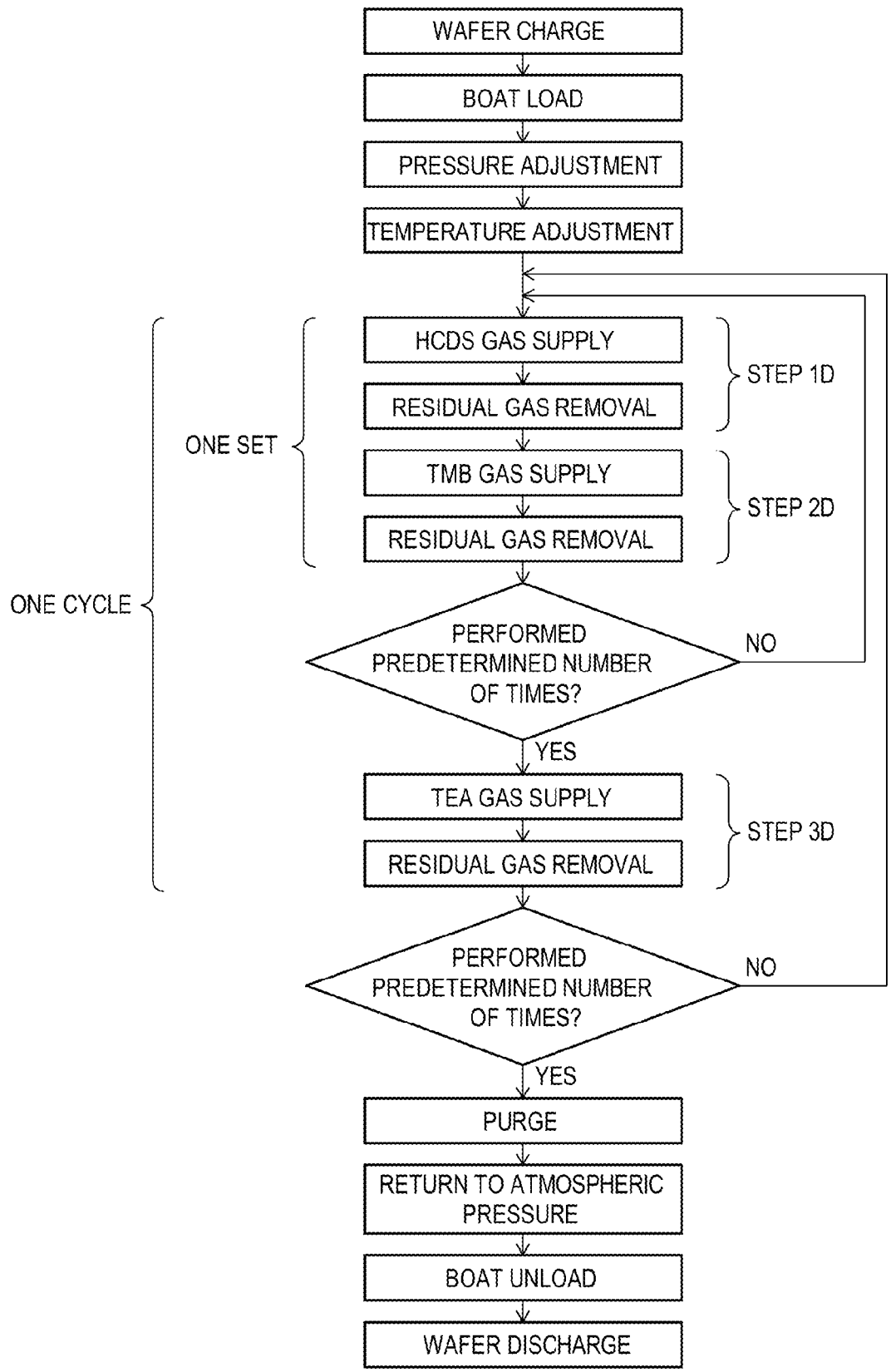

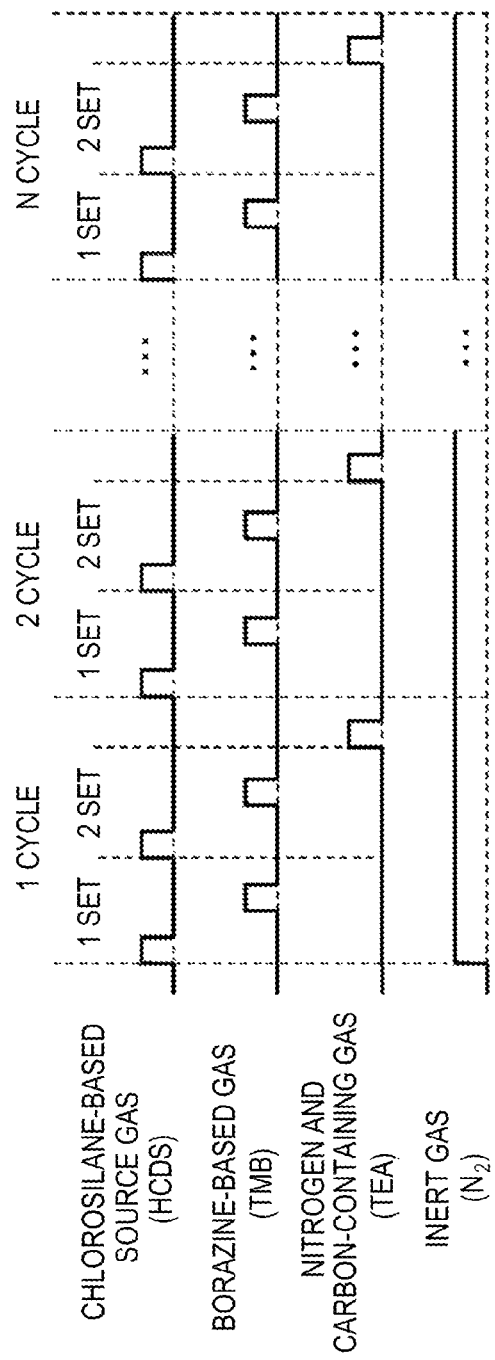

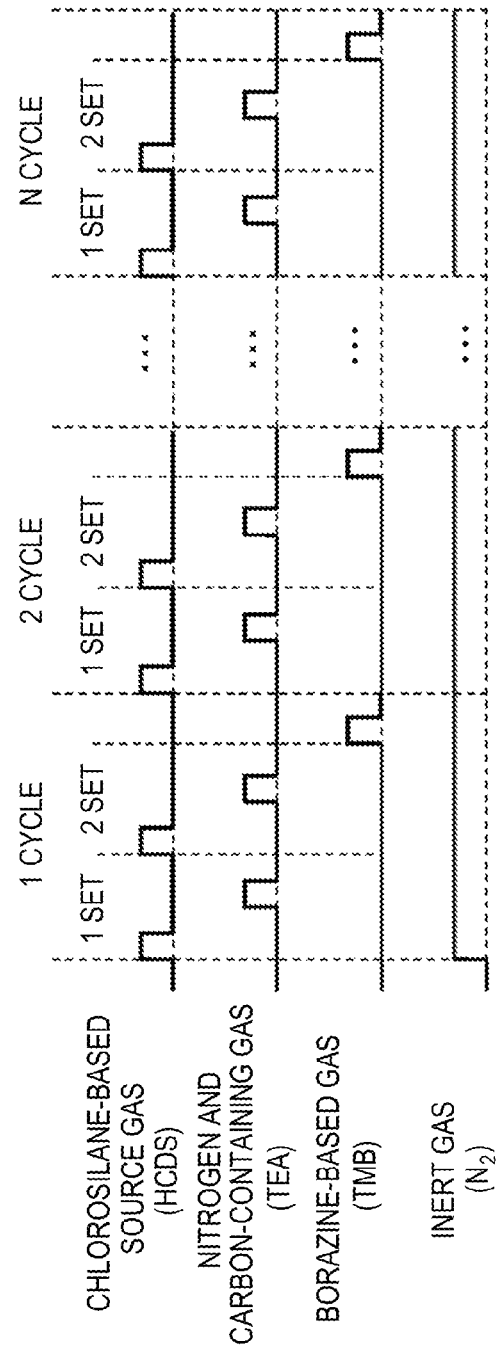

METHOD OF MANUFACTURING SEMICONDUCTOR DEVICE

CROSS-REFERENCE TO RELATED APPLICATION

This application is based upon and claims the benefit of priority from Japanese Patent Application No. 2012-199536, filed on Sep. 11, 2012, the entire content of which is incorporated herein by reference.

TECHNICAL FIELD

The present disclosure relates to a method of manufacturing a semiconductor device including a process of forming a film on a substrate, a substrate processing apparatus, and a recording medium.

BACKGROUND

As sizes of transistors decrease, forming a thin film such as an insulating film which constitutes a sidewall spacer (SWS) of a gate electrode may require low temperature for film forming, increased resistance to hydrogen fluoride (HF), and a small dielectric constant. To this end, it has been studied to use, as an insulating film, a silicon boronitride (SiBN) film (i.e., a silicon nitride (SiN) film to which boron is added) or a silicon borocarbonitride (SiBCN) film (i.e., a silicon nitride (SiN) film to which carbon as well as boron is added).

Such an insulating film is often formed by an alternating supply method that alternately supplies several kinds of process gases because a high step coverage is required. For example, using a silicon (Si)-containing gas as a source gas, boron trichloride ($BCl_3$) gas or diborane ($B_2H_6$) gas as a boron source, ammonia ($NH_3$) gas as a nitrogen source, and ethylene ($C_2H_4$) gas or propylene ($C_3H_6$) gas as a carbon source, a SiBCN film can be formed on a substrate by performing a cycle, which sequentially supplies the above process gases to the substrate, a predetermined number of times. However, this method that separately supplies the boron source, the nitrogen source, and the carbon source leads to a long time for a single cycle, which results in a low productivity of a film forming process.

SUMMARY

The present disclosure provides some embodiments of a method of manufacturing a semiconductor device, a substrate processing apparatus, and a recording medium, which are capable of forming a thin film having high HF resistance and a low dielectric constant in a low temperature range with a high productivity.

According to an aspect, there is provided a method of manufacturing a semiconductor device, the method including forming a thin film including a predetermined element and a borazine ring skeleton on a substrate by performing a cycle a first predetermined number of times, the cycle including supplying a source gas including the predetermined element and a halogen group to the substrate; and supplying a reaction gas including a borazine compound to the substrate, wherein the cycle is performed under a condition where the borazine ring skeleton in the borazine compound is maintained.

According another aspect, there is provided a substrate processing apparatus including a process chamber configured to accommodate a substrate; a source gas supply system configured to supply a source gas including a predetermined element and a halogen group to the substrate in the process chamber; a reaction gas supply system configured to supply a reaction gas including a borazine compound to the substrate in the process chamber; a heater configured to heat the substrate in the process chamber; a pressure adjustor configured to adjust an internal pressure of the process chamber; and a controller configured to control the source gas supply system, the reaction gas supply system, the heater, and the pressure adjustor such that a thin film including the predetermined element and a borazine ring skeleton is formed on the substrate by performing a cycle a predetermined number of times, the cycle including supplying the source gas including the predetermined element and the halogen group to the substrate; and supplying the reaction gas including the borazine compound to the substrate, wherein the cycle is performed under a condition where the borazine ring skeleton in the borazine compound is maintained.

According to still another aspect, there is provided a non-transitory computer-readable recording medium storing a program that causes a computer to perform a process of forming a thin film including a predetermined element and a borazine ring skeleton on a substrate by performing a cycle a predetermined number of times, the cycle including supplying a source gas including the predetermined element and a halogen group to the substrate; and supplying a reaction gas including a borazine compound to the substrate, wherein the cycle is performed under a condition where the borazine ring skeleton in the borazine compound is maintained.

BRIEF DESCRIPTION OF THE DRAWINGS

FIG. 4 illustrates a flowchart for forming a film in a film forming sequence, according to a first embodiment of the present disclosure.

FIG. 5B illustrates a modified timing diagram for supplying a plurality of gases in a film forming sequence according to the first embodiment of the present disclosure.

FIG. 7B illustrates another timing diagram for supplying a plurality of gases and a plasma power in a plasma film forming sequence according to the first sequence of the second embodiment.

FIG. 9A illustrates a timing diagram for supplying a plurality of gases in a non-plasma film forming sequence according to the second sequence of the second embodiment.

FIG. 11 illustrates a timing diagram for supplying a plurality of gases in a film forming sequence according to the third embodiment of the present disclosure.

FIG. 12 illustrates a flowchart for forming a film in a first sequence, according to a fourth embodiment of the present disclosure.

FIG. 13B illustrates a modified timing diagram for supplying a plurality of gases in the first sequence according to the fourth embodiment of the present disclosure.

FIG. 14 illustrates a flowchart for forming a film in a second sequence, according to the fourth embodiment of the present disclosure.

FIG. 15A illustrates a timing diagram for supplying a plurality of gases in the second sequence according to the fourth embodiment of the present disclosure.

FIG. 15B illustrates a modified timing diagram for supplying a plurality of gases in the second sequence according to the fourth embodiment of the present disclosure.

DETAILED DESCRIPTION

First Embodiment of the Present Disclosure

Hereinafter, a first embodiment will be described later with reference to the drawings.

(1) Configuration of Substrate Processing Apparatus

Figure 1:
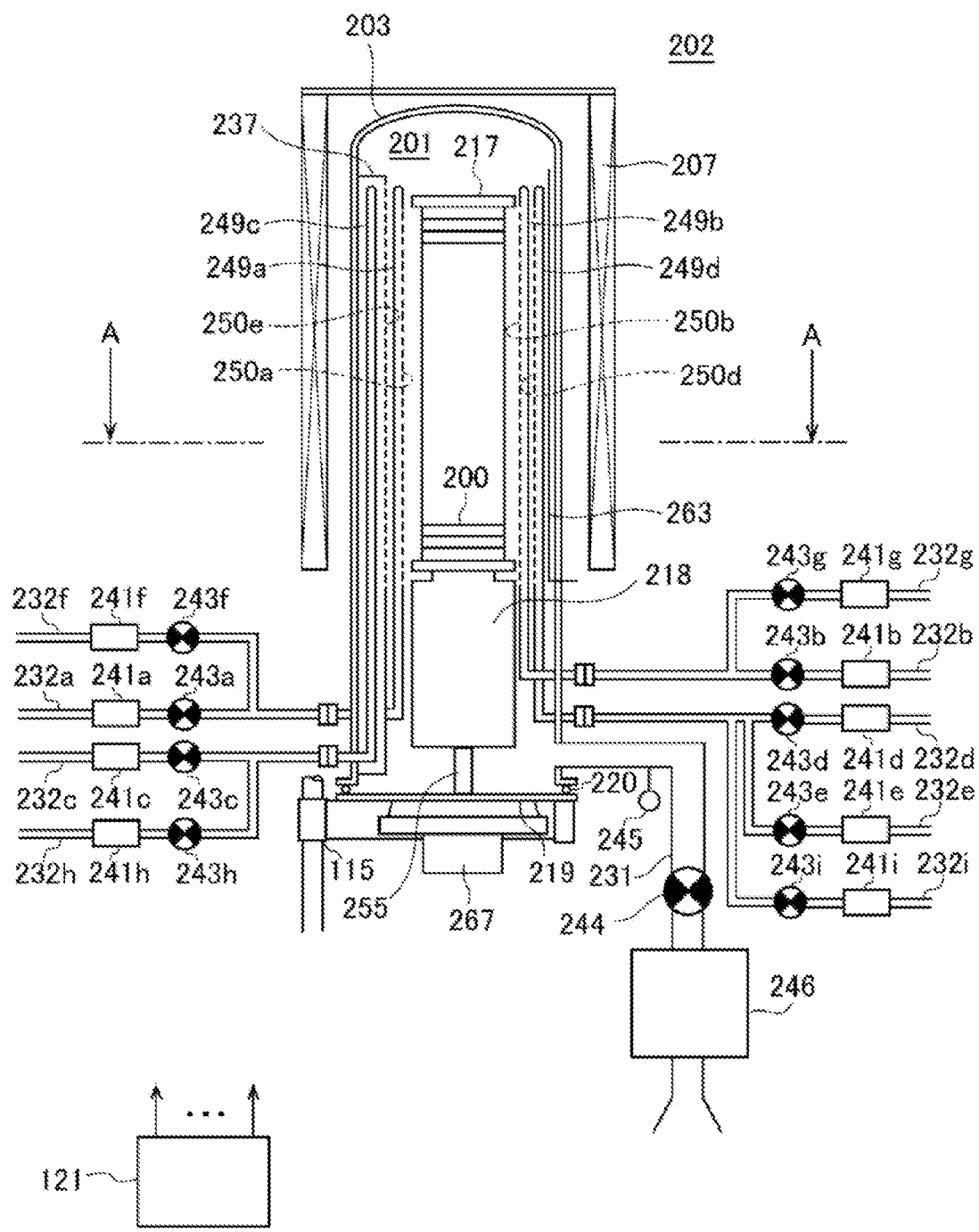
FIG. 1 schematically illustrates a configuration of a vertical process furnace of a substrate processing apparatus, in which a portion of the process furnace is shown by a longitudinal sectional view, according to one embodiment of the present disclosure.
Figure 2:
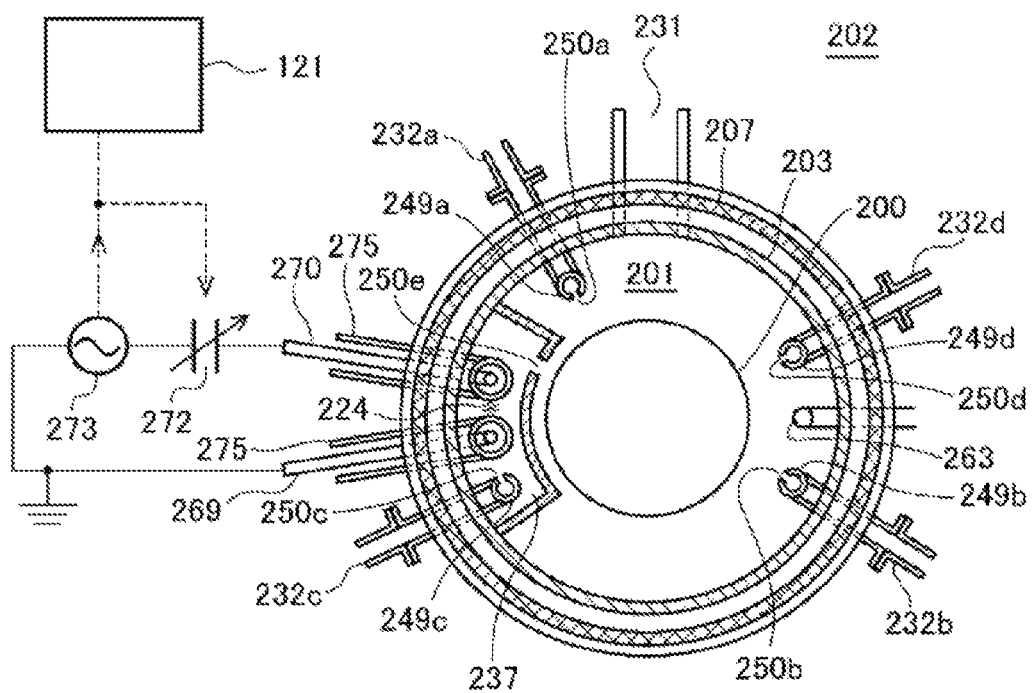
FIG. 2 schematically illustrates a configuration of the vertical process furnace of the substrate processing apparatus, in which a portion of the process furnace is shown by a sectional view taken along a line A-A in FIG. 1, according to one embodiment of the present disclosure.

FIG. 1 schematically illustrates a configuration of a vertical process furnace 202 of a substrate processing apparatus, in which a portion of the process furnace 202 is shown by a longitudinal sectional view, according to one embodiment of the present disclosure. FIG. 2 schematically illustrates a configuration of the vertical process furnace 202 of the substrate processing apparatus, in which a portion of the process furnace 202 is shown by a sectional view taken along a line A-A in FIG. 1, according to one embodiment of the present disclosure. The present disclosure is not limited to the substrate processing apparatus according to this embodiment but may be properly applied to other substrate processing apparatuses including a process furnace of a single wafer type, a hot wall type, or a cold wall type.

As illustrated in FIG. 1, the vertical process furnace 202 includes a heater 207 serving as a heating unit (heating mechanism). The heater 207 has a cylindrical shape and is supported by a heater base (not shown) serving as a support plate so that the heater 207 is vertically installed. The heater 207 acts as an activation mechanism to activate gas by heat, as will be described later.

A reaction tube 203 forming a reaction vessel (process vessel) is installed inside the heater 207 in a concentric form along the heater 207. The reaction tube 203 is made of a heat resistant material such as quartz ($SiO_2$) or silicon carbide (SiC) and has a cylindrical shape with its upper end closed and its lower end opened. A process chamber 201 is installed in a hollow cylindrical portion of the reaction tube 203 and is configured to accommodate a plurality of wafers 200 as substrates. The wafers 200 are horizontally stacked in multiple stages to be aligned in a vertical direction in a boat 217 which will be described later.

A first nozzle 249a, a second nozzle 249b, a third nozzle 249c, and a fourth nozzle 294d are installed in the process chamber 201 to penetrate through a lower side of the reaction tube 203. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. Further, a fifth gas supply pipe 232e is connected to the fourth gas supply pipe 232d. In this way, the four nozzles 249a, 249b, 249c, and 294d and the five gas supply pipes 232a, 232b, 232c, 232d, and 232e are installed to the reaction tube 203 to allow several kinds (five kinds in this example) of gases to be supplied into the process chamber 201.

A metal manifold may be installed below the reaction tube 203 to support the reaction tube 203, and each nozzle may be installed to penetrate through a side wall of the metal manifold. In this case, an exhaust pipe 231, which will be described later, may be installed at the metal manifold. Alternatively, the exhaust pipe 231 may be installed at a lower portion of the reaction tube 203, rather than the metal manifold. As such, a furnace opening of the process furnace 202 may be formed of metal and the nozzles and the like may be mounted to the metal furnace opening.

A mass flow controller (MFC) 241a serving as a flow rate controller (a flow rate control unit) and a valve 243a serving as an opening/closing valve are installed in the first gas supply pipe 232a sequentially from an upstream side. In addition, a first inert gas supply pipe 232f is connected to the first gas supply pipe 232a at a more downstream side of the valve 243a. A mass flow controller (MFC) 241f serving as a flow rate controller (a flow rate control unit) and a valve 243f serving as an opening/closing valve are installed in the first inert gas supply pipe 232f sequentially from an upstream side. In addition, the above-mentioned first nozzle 249a is connected to a front end of the first gas supply pipe 232a. In an arc-shaped space between an inner wall of the reaction tube 203 and the wafers 200, the first nozzle 249a is installed to ascend upward in a direction of the stacked wafers 200 toward an upper portion of the inner wall of the reaction tube 203 from a lower portion of the inner wall of the reaction tube 203. Thus, the first nozzle 249a is installed along a wafer arrangement region where the wafers 200 are arranged, in a region that horizontally surrounds the wafer arrangement region at a side of the wafer arrangement region. The first nozzle 249a is configured as an L-shape, and its horizontal portion is installed to penetrate through a lower side wall of the reaction tube 203 while its vertical portion is installed to ascend at least from one end portion to the other end portion of the wafer arrangement region. A gas supply hole 250a for supplying a gas is installed at a side surface of the first nozzle 249a. The gas supply hole 250a is opened toward a center of the reaction tube 203 to allow the gas to be supplied to the wafers 200. A plurality of the gas supply holes 250a is installed at a predetermined opening pitch from a lower portion to an upper portion of the reaction tube 203. Each of the gas supply holes 250a may have the same opening area. A first gas supply system mainly includes the first gas supply pipe 232a, the mass flow controller 241a, and the valve 243a. The first gas supply system may also include the first nozzle 249a. In addition, a first inert gas supply system mainly includes the first inert gas supply pipe 232f, the mass flow controller 241f, and the valve 243f. The first inert gas supply system also functions as a purge gas supply system.

A mass flow controller (MFC) 241b serving as a flow rate controller (a flow rate control unit) and a valve 243b serving as an opening/closing valve are installed in the second gas supply pipe 232b sequentially from an upstream side. In addition, a second inert gas supply pipe 232g is connected to the second gas supply pipe 232b at a more downstream side of the valve 243b. A mass flow controller (MFC) 241g serving as a flow rate controller (a flow rate control unit) and a valve 243g serving as an opening/closing valve are disposed in the second inert gas supply pipe 232g sequentially from an upstream side. In addition, the above-mentioned second nozzle 249b is connected to a front end of the second gas supply pipe 232b. In an arc-shaped space between the inner wall of the reaction tube 203 and the wafers 200, the second nozzle 249b is installed to ascend upward in the direction of the stacked wafers 200 toward an upper portion from a lower portion of the inner wall of the reaction tube 203. Thus, the second nozzle 249b is installed along the wafer arrangement region where the wafers 200 are arranged, in a region that horizontally surrounds the wafer arrangement region at a side of the wafer arrangement region. The second nozzle 249b is configured as an L-shape, and its horizontal portion is installed to penetrate through a lower side wall of the reaction tube 203 while its vertical portion is installed to ascend at least from one end portion to the other end portion of the wafer arrangement region. A gas supply hole 250b for supplying gas is installed at a side surface of the second nozzle 249b. The gas supply hole 250b is opened toward the center of the reaction tube 203 to allow the gas to be supplied to the wafers 200. A plurality of the gas supply holes 250b is installed at a predetermined opening pitch from a lower portion to an upper portion of the reaction tube 203. Each of the gas supply holes 250b may have the same opening area. A second gas supply system mainly includes the second gas supply pipe 232b, the mass flow controller 241b, and the valve 243b. The second gas supply system may also include the second nozzle 249b. In addition, a second inert gas supply system mainly includes the second inert gas supply pipe 232g, the mass flow controller 241g, and the valve 243g. The second inert gas supply system also functions as a purge gas supply system.

A mass flow controller (MFC) 241c serving as a flow rate controller (a flow rate control unit) and a valve 243c serving as an opening/closing valve are installed in the third gas supply pipe 232c sequentially from an upstream side. In addition, a third inert gas supply pipe 232h is connected to the third gas supply pipe 232c at a more downstream side of the valve 243c. A mass flow controller 241h serving as a flow rate controller (a flow rate control unit) and a valve 243h serving as an opening/closing valve are installed in the third inert gas supply pipe 232h sequentially from an upstream side. In addition, the above-mentioned third nozzle 249c is connected to a front end of the third gas supply pipe 232c. The third nozzle 249c is installed within a buffer chamber 237 serving as a gas dispersion space.

The buffer chamber 237 is installed along the direction of the stacked wafers 200 in an arc-shaped space between the inner wall of the reaction tube 203 and the wafers 200 and in a region spanning from a lower portion to an upper portion of the inner wall of the reaction tube 203. Thus, the buffer chamber 237 is installed along the wafer arrangement region where the wafers 200 are arranged, in a region that horizontally surrounds the wafer arrangement region at a side of the wafer arrangement region. A gas supply hole 250e for supplying gas is installed at an end portion in a wall of the buffer chamber 237 adjacent to the wafers 200. The gas supply hole 250e is opened toward the center of the reaction tube 203 to allow the gas to be supplied to the wafers 200. A plurality of the gas supply holes 250e is installed at a predetermined opening pitch from a lower portion to an upper portion of the reaction tube 203. Each of the gas supply holes 250e may have the same opening area.

The third nozzle 249c is installed at an end portion in the buffer chamber 237, which opposes the other end portion where the gas supply holes 250e are formed, to ascend upward in the direction of the stacked wafers 200 toward an upper portion from a lower portion of the inner wall of the reaction tube 203. Thus, the third nozzle 249c is installed along the wafer arrangement region where the wafers 200 are arranged, in a region that horizontally surrounds the wafer arrangement region at a side of the wafer arrangement region. The third nozzle 249c is configured as an L-shape, and its horizontal portion is installed to penetrate through a lower side wall of the reaction tube 203 while its vertical portion is installed to ascend in the direction at least from one end portion to the other end portion of the wafer arrangement region. Gas supply holes 250c for supplying gas is installed in a side surface of the third nozzle 249c. The gas supply holes 250c are opened toward a center of the buffer chamber 237. Similar to the gas supply holes 250e of the buffer chamber 237, the gas supply holes 250c are installed from a lower portion to an upper portion of the reaction tube 203. When a pressure difference between an inside of the buffer chamber 237 and an inside of the process chamber 201 is small, the plurality of gas supply holes 250c may be configured to have a constant opening area and a constant opening pitch from an upstream side (lower portion) to a downstream side (upper portion). On the other hand, when the pressure difference is large, the opening area may become larger and the opening pitch may become smaller in a direction from the upstream side to the downstream side.

In this embodiment, by adjusting the opening area or the opening pitch of each of the gas supply holes 250c in the third nozzle 249c from the upstream side to the downstream side as described above, gas is flown out from the individual gas supply holes 250c at an almost constant flow rate although there may be a flow velocity difference according to the gas supply holes 250c. The gas flown out from the individual gas supply holes 250c is introduced into the buffer chamber 237 and the flow velocity difference of the gas then becomes uniform within the buffer chamber 237. In this case, particle velocities of the gas flown out from the individual gas supply holes 250c of the third nozzle 249c into the buffer chamber 237 are mitigated within the buffer chamber 237, and the gas is then flown out from the individual gas supply holes 250e of the buffer chamber 237 into the process chamber 201. Thus, the gas which has been flown out from the individual gas supply holes 250c of the third nozzle 249c into the buffer chamber 237 can have a substantially uniform flow rate and a substantially uniform flow velocity when it is flown out from the gas supply holes 250e of the buffer chamber 237 into the process chamber 201.

A third gas supply system mainly includes the third gas supply pipe 232c, the mass flow controller 241c, and the valve 243c. The third gas supply system may also include the third nozzle 249c and the buffer chamber 237. In addition, a third inert gas supply system mainly includes the third inert gas supply pipe 232h, the mass flow controller 241h, and the valve 243h. The third inert gas supply system also functions as a purge gas supply system.

A mass flow controller (MFC) 241d serving as a flow rate controller (a flow rate control unit) and a valve 243d serving as an opening/closing valve are installed in the fourth gas supply pipe 232d sequentially from an upstream side. In addition, a fifth gas supply pipe 232e is connected to the fourth gas supply pipe 232d at a more downstream side of the valve 243d. A mass flow controller (MFC) 241e serving as a flow rate controller (a flow rate control unit) and a valve 243e serving as an opening/closing valve are installed in the fifth gas supply pipe 232e sequentially from an upstream side. In addition, a fourth inert gas supply pipe 232i is connected to the fourth gas supply pipe 232d at a more downstream side of a position where the fifth gas supply pipe 232e is connected to the fourth gas supply pipe 232d. A mass flow controller (MFC) 241i serving as a flow rate controller (a flow rate control unit) and a valve 243i serving as an opening/closing valve are installed in the fourth inert gas supply pipe 232i sequentially from an upstream side. In addition, the above-mentioned fourth nozzle 249d is connected to a front end of the fourth gas supply pipe 232d. In an arc-shaped space between the inner wall of the reaction tube 203 and the wafers 200, the fourth nozzle 249d is installed to ascend upward in the direction of the stacked wafers 200 toward an upper portion from a lower portion of the inner wall of the reaction tube 203. Thus, the fourth nozzle 249d is installed along the wafer arrangement region where the wafers 200 are arranged, in a region that horizontally surrounds the wafer arrangement region at a side of the wafer arrangement region. The fourth nozzle 249d is configured as an L-shape, and its horizontal portion is installed to penetrate through a lower side wall of the reaction tube 203 while its vertical portion is installed to ascend in the direction at least from one end portion to the other end portion of the wafer arrangement region. A gas supply hole 250d for supplying gas is installed at a side surface of the fourth nozzle 249d. The gas supply hole 250d is opened toward the center of the reaction tube 203 to allow the gas to be supplied to the wafers 200. A plurality of the gas supply holes 250d is installed at a predetermined opening pitch from a lower portion to an upper portion of the reaction tube 203. Each of the gas supply holes 250d may have the same opening area. A fourth gas supply system mainly includes the fourth gas supply pipe 232d, the mass flow controller 241d, and the valve 243d. The fourth gas supply system may also include the fourth nozzle 249d. In addition, a fifth gas supply system mainly includes the fifth gas supply pipe 232e, the mass flow controller 241e, and the valve 243e. The fifth gas supply system may also include a portion of the fourth nozzle 249d at a more downstream side of the position where the fifth gas supply pipe 232e is connected to the fourth gas supply pipe 232d. A fourth inert gas supply system mainly includes the fourth inert gas supply pipe 232i, the mass flow controller 241i, and the valve 243i. The fourth inert gas supply system also functions as a purge gas supply system.

As described above, the gas supply systems according to the embodiment transfer gases via the nozzles 249a, 249b, 249c, and 249d and the buffer chamber 237, which are arranged in the arc-shaped longitudinal space defined by the inner wall of the reaction tube 203 and end portions of the plurality of stacked wafers 200, and first supplies the gases from the gas supply holes 250a, 250b, 250c, 250d, and 250e (which are opened in the nozzles 249a, 249b, 249c, and 249d and the buffer chamber 237, respectively) into the reaction tube 203, near the wafers 200. Accordingly, the gases supplied into the reaction tube 203 mainly flow within the reaction tube 203 in a direction parallel to surfaces of the wafers 200, i.e., in a horizontal direction. According to such a configuration, the gases can be uniformly supplied to the wafers 200, thereby making a film thickness of a thin film formed in each of the wafers 200 uniform. Further, the gases flowing on the surfaces of the wafers 200 after reaction, i.e., residual gases, flow toward an exhaust port, i.e., the exhaust pipe 231, which will be described later. However, the flow direction of the residual gases may be appropriately specified depending on a position of the exhaust port, and is not limited to a vertical direction.

A source gas including a certain element and a halogen group, for example, a chlorosilane-based source gas including at least a silicon (Si) element and a chloro group, is supplied from the first gas supply pipe 232a into the process chamber 201 via the mass flow controller 241a, the valve 243a, and the first nozzle 249a. As used herein, the chlorosilane-based source refers to a silane-based source including a chloro group while at least silicon (Si) and chlorine (Cl) are included. As such, the chlorosilane-based source described herein may refer to a kind of halide. In addition, as used herein, the term "source" may denote "a liquid source in a liquid state," "a gaseous source produced by vaporizing a liquid source," or both of them. Therefore, in the present disclosure, the term "chlorosilane-based source" may denote "a liquid chlorosilane-based source," "a gaseous chlorosilane-based source," or both of them. An example of a gaseous chlorosilane-based source may include hexachlorodisilane ($Si_2Cl_6$, abbreviated to HCDS) gas. In the case of employing a liquid source such as HCDS which is in a liquid state under normal temperature and pressure, the liquid source (e.g., HCDS) may be vaporized by a vaporizing system such as a vaporizer or a bubbler to be supplied as a gaseous source (e.g., HCDS gas).

A reaction gas including a borazine compound, e.g., the reaction gas including an alkylborazine compound which is an organic borazine compound, i.e., an organic borazine-based gas (a borazine-based gas) is supplied from the second gas supply pipe 232b into the process chamber 201 via the mass flow controller 241b, the valve 243b, and the second nozzle 249b.

Figure 16A:
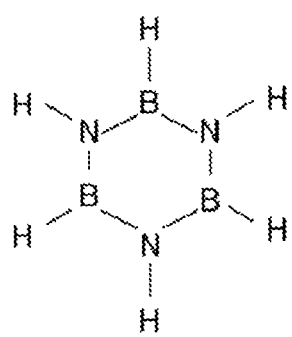
FIG. 16A illustrates chemical structural formula of borazine.
Figure 16B:
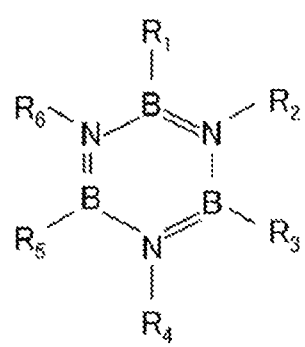
FIG. 16B illustrates a chemical structural formula of a borazine compound.

Here, the borazine compound is a heterocyclic compound including boron, nitrogen, and hydrogen. The borazine compound may be represented by a composition formula of $B_3H_6N_3$, and may be represented by a chemical structural formula shown in FIG. 16A. The borazine compound has a borazine ring skeleton (referred to as a "borazine skeleton") constituting a borazine ring including three boron atoms (B) and three nitrogen atoms (N). The organic borazine compound is a borazine compound including a carbon atom (C) and may also be referred to as a borazine compound including a carbon-containing ligand. An alkylborazine compound is a borazine compound including an alkyl group and may also be referred to as a borazine compound including an alkyl group as a ligand. The alkylborazine compound is a compound in which at least any one of six hydrogen atoms (H) contained in the borazine compound is substituted with hydrocarbon including one or more carbon atoms (C), and may be represented by a chemical structural formula shown in FIG. 16B. In this case, $R_1$ to $R_6$ in the chemical structural formula shown in FIG. 16B are a hydrogen atom (H) or an alkyl group including one to four carbon atoms (C). $R_1$ to $R_6$ may be the same alkyl group or different alkyl groups from each other. However, not all of $R_1$ to $R_6$ should be H. The alkylborazine compound may also indicate a substance having a borazine ring skeleton constituting a borazine ring and containing boron, nitrogen, hydrogen, and carbon. Also, the alkylborazine compound may indicate a substance having a borazine ring skeleton and including an alkyl ligand. In addition, $R_1$ to $R_6$ may be a hydrogen atom (H), or an alkenyl or alkynyl group including one to four carbon atoms (C). $R_1$ to $R_6$ may be the same alkenyl or alkynyl group, or different alkenyl or alkynyl groups from each other. However, not all of $R_1$ to $R_6$ should be H.

Figure 16C:
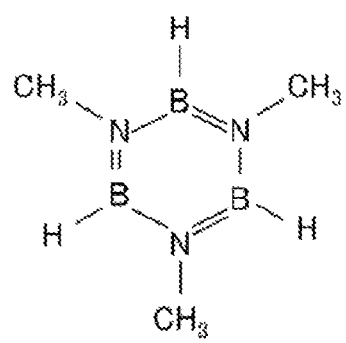
FIG. 16C illustrates a chemical structural formula of n,n', n"-trimethylborazine

For example, an n,n',n"-trimethylborazine (abbreviated to TMB) gas may be used as a reaction gas including a borazine compound. TMB may be represented by a chemical structural formula shown in FIG. 16C in which $R_1$, $R_3$, and $R_5$ of the chemical structural formula in FIG. 16B are H while $R_2$, $R_4$, and $R_6$ of the chemical structural formula in FIG. 16B are a methyl group (—$CH_3$). TMB may also be referred to as a borazine compound having a borazine ring skeleton and including a methyl group as a ligand. In the case of employing a borazine compound such as TMB which is in a liquid state under normal temperature and pressure, the borazine compound in a liquid state may be vaporized by a vaporization system such as a vaporizer or a bubbler to be supplied as a reaction gas including a borazine compound (e.g., TMB gas). Further, the reaction gas including a borazine compound may be simply referred to as a borazine compound gas.

A nitridation gas (nitrogen-containing gas) is supplied from the third gas supply pipe 232c into the process chamber 201 via the mass flow controller 241c, the valve 243c, the third nozzle 249c, and the buffer chamber 237. Ammonia ($NH_3$) gas may be used as an example of the nitridation gas.

A gas including carbon (C) (carbon-containing gas), for example, a hydrocarbon-based gas, is supplied from the fourth gas supply pipe 232d into the process chamber 201 via the mass flow controller 241d, the valve 243d, and the fourth nozzle 249d. A propylene ($C_3H_6$) gas may be used as an example of the carbon-containing gas.

A gas including nitrogen (N) and carbon (C), for example, an amine-based gas, is supplied from the fifth gas supply pipe 232e into the process chamber 201 via the mass flow controller 241e, the valve 243e, the fourth gas supply pipe 232d, and the fourth nozzle 249d. In this example, the amine-based gas refers to a gas including an amine group, which is produced by vaporizing amine or the like, while including carbon (C), nitrogen (N), and hydrogen (H). The amine-based gas includes amine such as ethylamine, methylamine, propylamine, isopropylamine, butylamine, isobutylamine, and the like. As used herein, the term amine indicates a generic term of compounds in which at least one hydrogen atom in ammonia ($NH_3$) is substituted with a hydrocarbon group such as an alkyl group. As such, amine includes a hydrocarbon group such as an alkyl group. Since the amine-based gas contains no silicon (Si), it may be referred to as a silicon-non-containing gas. Further, since the amine-based gas contains no silicon and metal, it may be referred to as a silicon and metal-non-containing gas. Triethylamine (($C_2H_5$)$_3$N, abbreviated to TEA) gas may be used as an example of the amine-based gas. In the case of employing amine such as TEA which is in a liquid state under normal temperature and pressure, the amine in a liquid state may be vaporized by a vaporizing system such as a vaporizer or a bubbler to be supplied as an amine-based gas, in other words, a gas including carbon and nitrogen (e.g., TEA gas).

In one embodiment, nitrogen ($N_2$) gas is supplied from each of the inert gas supply pipes 232f, 232g, 232h, and 232i into the process chamber 201 via the mass flow controllers 241f, 241g, 241h, and 241i, the valves 243f, 243g, 243h, and 243i, the gas supply pipes 232a, 232b, 232c, and 232d, and the nozzles 249a, 249b, 249c and 249d, and the buffer chamber 237.

When the above-mentioned gases are flown from the gas supply pipes, respectively, the first gas supply system is configured as a source supply system which supplies a source including a certain element and a halogen group, e.g., a chlorosilane-based source gas supply system. The chlorosilane-based source gas supply system may also be referred to as a chlorosilane-based source supply system. The second gas supply system may be configured as a reaction gas supply system which supplies a reaction gas including a borazine compound, e.g., an organic borazine-based gas (borazine-based gas) supply system. Further, the reaction gas supply system may also be referred to as a borazine compound gas supply system. The third gas supply system is configured as a nitridation gas (nitrogen-containing gas) supply system. The fourth gas supply system is configured as a hydrocarbon gas supply system serving as a carbon-containing gas supply system. The fifth gas supply system is configured as an amine-based gas supply system serving as a nitrogen and carbon-containing gas supply system.

In the buffer chamber 237, as illustrated in FIG. 2, a first rod-shaped electrode 269 serving as a first electrode that has an elongated structure and a second rod-shaped electrode 270 serving as a second electrode that has an elongated structure are installed from a lower portion to an upper portion of the reaction tube 203 in the direction of the stacked wafers 200. Each of the first rod-shaped electrode 269 and the second rod-shaped electrode 270 is installed in parallel to the third nozzle 249c. Each of the first rod-shaped electrode 269 and the second rod-shaped electrode 270 is covered with and protected by an electrode protection tube 275, which is a protection tube for protecting each electrode from an upper portion to a lower portion thereof. One of the first rod-shaped electrode 269 and the second rod-shaped electrode 270 is connected to a high-frequency power source 273 via a matching unit 272, and the other one of them is connected to a ground corresponding to a reference electric potential. By applying a high-frequency power from the high-frequency power source 273 between the first rod-shaped electrode 269 and the second rod-shaped electrode 270 via the matching unit 272, plasma is generated in a plasma generation region 224 which is between the first rod-shaped electrode 269 and the second rod-shaped electrode 270. A plasma source as a plasma generator (plasma generating unit) mainly includes the first rod-shaped electrode 269, the second rod-shaped electrode 270, and the electrode protection tubes 275. The plasma source may also include the matching unit 272 and the high-frequency power source 273. Also, as described later, the plasma source functions as an activating mechanism (exciting unit) that activates (excites) gas by plasma.

Each of the electrode protection tubes 275 has a structure in which either the first rod-shaped electrode 269 or the second rod-shaped electrode 270 can be inserted into the buffer chamber 237 in a state where the inserted rod-shaped electrode is isolated from an internal atmosphere of the buffer chamber 237. In this case, when internal oxygen concentrations in the electrode protection tube 275s are equal to an oxygen concentration in an ambient air (atmosphere), the first rod-shaped electrode 269 and the second rod-shaped electrode 270 inserted into the electrode protection tubes 275 are oxidized by the heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentrations of the electrode protection tubes 275 decrease and thus, oxidation of the first rod-shaped electrode 269 and the second rod-shaped electrode 270 can be prevented.

The exhaust pipe 231 for exhausting an internal atmosphere of the process chamber 201 is installed at the reaction tube 203. A vacuum-exhaust device, for example, a vacuum pump 246, is connected to the exhaust pipe 231 via a pressure sensor 245, which is a pressure detector (pressure detecting unit) for detecting an internal pressure of the process chamber 201, and an auto pressure controller (APC) valve 244, which is a pressure adjuster (pressure adjusting unit). The APC valve 244 is configured to perform/stop vacuum-exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system mainly includes the exhaust pipe 231, the APC valve 244, and the pressure sensor 245. Also, the exhaust system may also include the vacuum pump 246. The exhaust system is configured to adjust the degree of the valve opening of the APC valve 244 based on pressure information detected by the pressure sensor 245 while operating the vacuum pump 246 such that the internal pressure of the process chamber 201 is vacuum-exhausted to a predetermined pressure (a vacuum level).

A seal cap 219, which functions as a furnace port cover configured to hermetically seal a lower end opening of the reaction tube 203, is installed under the reaction tube 203. The seal cap 219 is configured to contact the lower end portion of the reaction tube 203 from the below in a vertical direction. The seal cap 219, for example, may be formed of metal such as stainless steel and have a disc shape. An O-ring 220 is installed at an upper surface of the seal cap 219 to be configured as a seal member in contact with the lower end portion of the reaction tube 203. A rotation mechanism 267 configured to rotate the boat 217, which is a substrate holder to be described later, is installed below the seal cap 219. A rotary shaft 255 of the rotation mechanism 267 passes through the seal cap 219 to be connected to the boat 217. The rotation mechanism 267 is configured to rotate the wafers 200 by rotating the boat 217. The seal cap 219 is configured to be vertically elevated or lowered by a boat elevator 115, which is an elevation mechanism vertically installed at an outside of the reaction tube 203. The boat elevator 115 is configured to enable the boat 217 to be loaded into or unloaded from the process chamber 201 by elevating or lowering the seal cap 219. As such, the boat elevator 115 is configured as a transfer device (transfer mechanism) that transfers the boat 217, i.e., the wafers 200, into and out of the process chamber 201.

The boat 217, which is used as a substrate support, is made of a heat resistant material such as quartz or silicon carbide and is configured to support the plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that the heat from the heater 207 cannot be transferred to the seal cap 219. Further, the heat insulating member 218 may include a plurality of heat insulating plates formed of a heat resistant material such as quartz or silicon carbide, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electric conduction state to the heater 207 is adjusted such that an interior of the process chamber 201 has a desired temperature distribution. The temperature sensor 263 is configured in an L-shape similar to the nozzles 249a, 249b, 249c, and 249d and is installed along the inner wall of the reaction tube 203.

Figure 3:
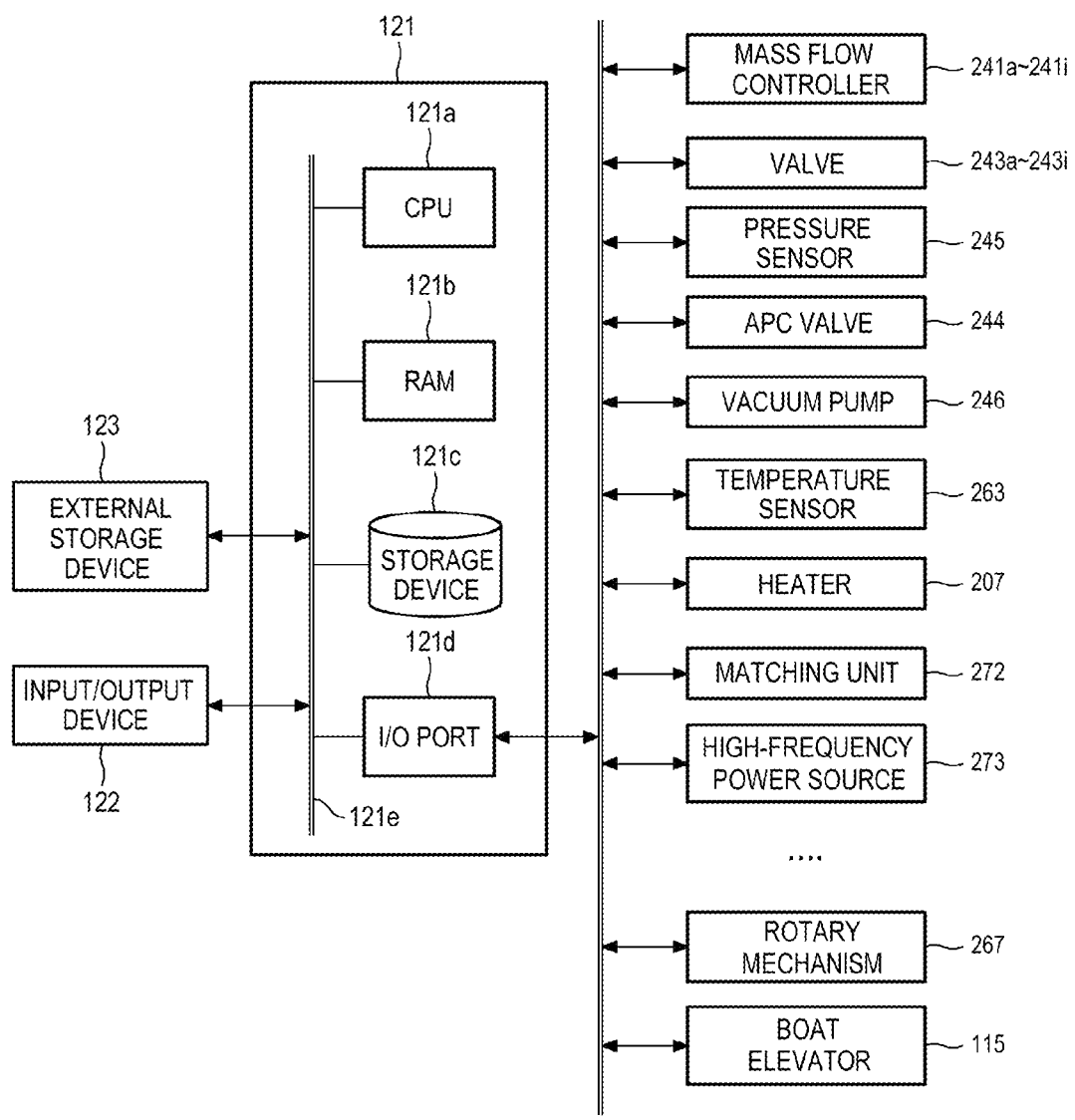
FIG. 3 schematically illustrates a configuration of a controller of a substrate processing apparatus, according to one embodiment of the present disclosure.

As illustrated in FIG. 3, a controller 121, which is a control unit (control part), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122, for example, including a touch panel or the like, is connected to the controller 121.

The memory device 121c is configured with, for example, a flash memory, a hard disc drive (HDD), or the like. A control program for controlling operations of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the mass flow controllers 241a, 241b, 241c, 241d, 241e, 241f, 241g, 241h, and 241i, the valves 243a, 243b, 243c, 243d, 243e, 243f, 243g, 243h, and 243i, the pressure sensor 245, the APC valve 244, the vacuum pump 246, the heater 207, the temperature sensor 263, the high-frequency power source 273, the matching unit 272, the rotation mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control flow rates for controlling operations of various types of gases by the mass flow controllers 241a, 241b, 241c, 241d, 241e, 241f, 241g, 241h, and 241i, the opening/closing operation of the valves 243a, 243b, 243c, 243d, 243e, 243f, 243g, 243h, and 243i, the opening/closing operation of the APC valve 244, the pressure adjusting operation by the APC valve 244 based on the pressure sensor 245, the operation of starting and stopping the vacuum pump 246, the temperature adjusting operation of the heater 207 based on the temperature sensor 263, the operation of supplying power by the high-frequency power source 273, the impedance adjusting operation of the matching unit 272, the rotation and rotation speed adjusting operation of the boat 217 by the rotation mechanism 267, the elevation operation of the boat 217 by the boat elevator 115, and the like, according to contents of the read process recipe.

Moreover, the controller 121 is not limited to being configured as a dedicated computer but may be configured as a general-purpose computer. For example, the controller 121 according to one embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for supplying a program to a computer is not limited to the case in which the program is supplied through the external memory device 123. For example, the program may be supplied using communication means such as the Internet or a dedicated line, rather than through the external memory device 123. Also, the memory device 121*c* or the external memory device 123 is configured as a non-transitory computer-readable recording medium. Hereinafter, the means for supplying the program will be simply referred to as "a recording medium." In addition, when the term "recording medium" is used herein, it may include a case of including only the memory device 121*c*, a case of including only the external memory device 123, or a case of including both the memory device 121*c* and the external memory device 123.

(2) Substrate Processing

Hereinafter, examples of a sequence of forming a thin film on a substrate, which is a part of the processes of manufacturing a semiconductor device by using the process furnace 202 of the above-described substrate processing apparatus, will be described. In addition, in the following description, operations of the respective units constituting the substrate processing apparatus are controlled by the controller 121.

Moreover, in the embodiments, in order to form a composition ratio of a thin film to be of a stoichiometric composition or another predetermined composition ratio different from the stoichiometric composition, supply conditions for a plurality of kinds of gases including a plurality of elements constituting the thin film to be formed are controlled. For example, the supply conditions are controlled such that at least one element of the plurality of elements constituting the thin film to be formed stoichiometrically exceeds another element. Hereinafter, examples of a sequence of forming a thin film while controlling a ratio of the plurality of elements constituting the thin film to be formed, i.e., a composition ratio of the film, will be described.

In the film forming sequence of this embodiment, a thin film including a predetermined element and a borazine ring skeleton is formed on a substrate by performing multiple times a cycle including a process of supplying a source gas including a predetermined element and a halogen group onto the substrate and a process of supplying a reaction gas including a borazine compound onto the substrate under a condition where the borazine ring skeleton in the borazine compound is maintained.

In the process of supplying the source gas, a first layer including the predetermined element and the halogen group is formed. In the process of supplying the reaction gas, a second layer including the predetermined element and the borazine ring skeleton is formed by modifying the first layer through reaction of the first layer including the predetermined element and the halogen group with the borazine compound.

In the process of supplying the reaction gas, the halogen group included in the first layer reacts with a ligand included in the borazine compound. Thus, the process of supplying the reaction gas is performed under a condition where the halogen group included in the first layer reacts with the ligand included in the borazine compound. Accordingly, the halogen group reacted with the ligand is separated from the first layer while the ligand reacted with the halogen group is separated from the borazine compound. Then, the borazine compound with the ligand separated therefrom is bonded with the predetermined element included in the first layer. Specifically, a portion of a borazine ring in the borazine compound from which the ligand is separated is bonded with the predetermined element included in the first layer. More specifically, nitrogen constituting the borazine ring in the borazine compound from which the ligand is separated may be bonded with the predetermined element included in the first layer.

The phrase "performing a cycle multiple times, the cycle including a process of supplying a source gas and a process of supplying a reaction gas" means performing the cycle one or more times, the one cycle alternately or simultaneously performing the process of supplying the source gas and the process of supplying the reaction gas. This means that this cycle is performed one or more times. In other words, a cycle that alternately or simultaneously performs a process of supplying a source gas and a process of supplying a reaction gas is performed once or is repeated multiple times. This cycle is preferably repeated multiple times.

In this embodiment, a wafer such as a silicon wafer or the like serving as a semiconductor substrate is used as a substrate recited in the present disclosure. A chlorosilane-based source gas including a chloro group and silicon is used as a source gas including a predetermined element and a halogen group. A gas of a borazine compound having a borazine ring skeleton and including an alkyl group (methyl group) as a ligand is used as a reaction gas including a borazine compound. A layer including a chloro group (chlorine) and silicon (i.e., a layer including chlorine and silicon) is formed as a first layer including a predetermined element and a halogen group. A layer having a borazine ring-skeleton and containing silicon, boron, carbon, and nitrogen (a silicon borocarbonitride layer) is formed as the second layer having a borazine ring skeleton and including a predetermined element. A thin film having a borazine ring-skeleton and including silicon, boron, carbon, and nitrogen (a silicon borocarbonitride film) is formed as a film having a borazine ring skeleton and including predetermined elements.

Figure 5A:
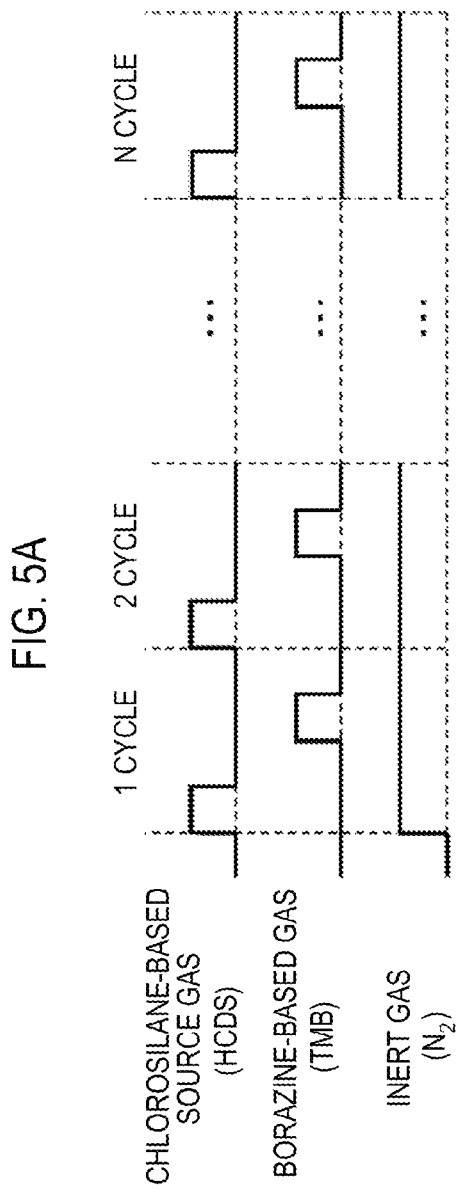
FIG. 5A illustrates a timing diagram for supplying a plurality of gases in a film forming sequence according to the first embodiment of the present disclosure.

The film forming sequence according to the embodiments will be described later in more detail. FIG. 4 illustrates a flowchart for forming a film in a film forming sequence, according to a first embodiment of the present disclosure. FIG. 5A illustrates a timing diagram for supplying a plurality of gases in a film forming sequence according to the first embodiment of the present disclosure.

In the film forming sequence of this embodiment, a silicon borocarbonitride (SiBCN) film having a borazine ring skeleton is formed as a film having a borazine ring skeleton and including silicon, boron, carbon, and nitrogen on the wafer 200 by performing a predetermined number times a cycle including a process of supplying a chlorosilane-based source gas including silicon and a chloro group onto the wafer 200 in the process chamber 201 and forming a silicon (Si)-containing layer including chlorine (Cl) and as a first layer including silicon and a chloro group (chlorine) on the wafer 200 and a process of supplying the reaction gas including a borazine compound onto the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the first layer through reaction of the first layer with the borazine compound under a condition where the borazine ring skeleton in the borazine compound is maintained.

FIGS. 4 and 5A show an example of alternately performing a predetermined number of times a process of supplying a chlorosilane-based source gas and a process of supplying a reaction gas including a borazine compound.

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer which is a laminated body."

Accordingly, the phrase "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, the phrase "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

The film forming sequence of this embodiment will be described later in detail. In this embodiment, an example where a SiBCN film having a borazine ring skeleton is formed on the wafer 200 through the film forming flow of FIG. 4 and the film forming sequence of FIG. 5A using HCDS gas as a chlorosilane-based source gas and TMB gas as a reaction gas including a borazine compound will be described.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end portion of the reaction tube 203 via the O-ring 220.

(Pressure Adjustment and Temperature Adjustment)

The interior of the process chamber 201 is vacuum-exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). Also, the vacuum pump 246 maintains a regular operation state at least until processing on the wafers 200 is terminated. Further, the wafers 200 in the process chamber 201 are heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, the heating of the interior of the process chamber 201 by the heater 207 is continuously performed at least until processing on the wafers 200 is terminated. Next, the boat 217 and wafers 200 begin to be rotated by the rotation mechanism 267 (wafer rotation). Furthermore, the rotation of the boat 217 and wafers 200 by the rotation mechanism 267 is continuously performed at least until processing on the wafers 200 is terminated.

(Process of Forming Silicon Borocarbonitride Film)

Next, the following two steps (Steps 1A and 2A) are sequentially performed.

[Step 1A]

(HCDS Gas Supply)

The valve 243a of the first gas supply pipe 232a is opened to flow HCDS gas into the first gas supply pipe 232a. A flow rate of the HCDS gas flowing into the first gas supply pipe 232a is adjusted by the mass flow controller 241a. The flow rate-adjusted HCDS gas is supplied into the process chamber 201 through the gas supply holes 250a of the first nozzle 249a, and exhausted through the exhaust pipe 231. In this way, the HCDS gas is supplied to the wafer 200 (HCDS gas supply). At the same time, the valve 243f is opened to flow an inert gas such as $N_2$ gas into the first inert gas supply pipe 232f. A flow rate of the $N_2$ gas flowing in the first inert gas supply pipe 232f is adjusted by the mass flow controller 241f. The flow rate-adjusted $N_2$ gas is supplied into the process chamber 201 together with the HCDS gas, and exhausted through the exhaust pipe 231. In this case, in order to prevent infiltration of the HCDS gas into the second nozzle 249b, the third nozzle 249c, the fourth nozzle 249d, and the buffer chamber 237, the valves 243g, 243h, and 243i are opened to flow $N_2$ gas into the second inert gas supply pipe 232g, the third inert gas supply pipe 232h, and the fourth inert gas supply pipe 232i. The $N_2$ gas is supplied into the process chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and exhausted through the exhaust pipe 231.

In this case, the APC valve 244 is appropriately adjusted to set the internal pressure of the process chamber 201 to fall, for example, within a range of 1 to 13,300 Pa, or more preferably, for example, within a range of 20 to 1,330 Pa. A supply flow rate of the HCDS gas controlled by the mass flow controller 241a is set to fall, for example, within a range of 1 to 1,000 sccm. A supply flow rate of the $N_2$ gas controlled by each of the mass flow controllers 241f, 241g, 241h, and 241i is set to fall, for example, within a range of 100 to 10,000 sccm. A time of supplying the HCDS gas to the wafers 200, i.e., a gas supply time (irradiation time), is set to fall, for example, within a range of 1 to 120 seconds, or more preferably, for example, within a range of 1 to 60 seconds. In this case, a temperature of the heater 207 is set such that a temperature of the wafers 200 falls, for example, within a range of 250 to 700 degrees C., more preferably, for example, within a range of 300 to 650 degrees C., or further more preferably, for example, within a range of 350 and 600 degrees C. When the temperature of the wafers 200 is less than 250 degrees C., it becomes difficult for the HCDS to be adsorbed onto the wafers 200 such that a practical film forming rate cannot be obtained. This problem can be solved by increasing the temperature of the wafers 200 to 250 degrees C. or more. Also, the HCDS can be more sufficiently adsorbed onto the wafers 200 and a more sufficient film forming rate can be achieved by increasing the temperature of the wafers 200 to 300 degrees C. or more, or 350 degrees C. or more. Further, when the temperature of the wafers 200 exceeds 700 degrees C., the film thickness uniformity may be easily deteriorated to make it difficult to control the film thickness uniformity as a CVD reaction is strengthened (i.e., a gaseous reaction becomes dominant). By adjusting the temperature of the wafers 200 to 700 degrees C. or less, deterioration of the film thickness uniformity can be suppressed, and thus, it is possible to control the film thickness uniformity. In particular, by setting the temperature of the wafers 200 to 650 degrees C. or less, more preferably, for example, 600 degrees C. or less, a surface reaction becomes dominant, the film thickness uniformity can be easily secured, and thus, it becomes easy to control the film thickness uniformity. Accordingly, the temperature of the wafers 200 may be set to fall, for example, within a range of 250 to 700 degrees C., more preferably, for example, within a range of 300 to 650 degrees C., or further more preferably, for example, within a range of 350 to 600 degrees C.

As the HCDS gas is supplied to the wafers 200 under the above-described conditions, for example, a silicon-containing layer which includes chlorine (Cl) and has a thickness of less than one atomic layer to several atomic layers is formed as a first layer on each wafer 200 (an underlying film of a surface). The silicon-containing layer including chlorine (Cl) may be an adsorption layer of the HCDS gas, a silicon layer (Si layer) including Cl, or both of these.

Also, a layer having a thickness of less than one atomic layer refers to a discontinuously formed atomic layer, while a layer having a thickness of one atomic layer refers to a continuously formed atomic layer. In addition, a layer having a thickness of less than one molecular layer refers to a discontinuously formed molecular layer, while a layer having a thickness of one molecular layer refers to a continuously formed molecular layer.

Under a condition in which the HCDS gas is autolyzed (pyrolyzed), i.e., under a condition in which a pyrolysis reaction of the HCDS gas occurs, the silicon layer including Cl is formed by depositing Si on the wafer 200. Under a condition in which the HCDS gas is not autolyzed (pyrolyzed) (i.e., under a condition in which a pyrolysis reaction of the HCDS gas does not occur), the adsorption layer of the HCDS gas is formed by adsorbing the HCDS gas onto the wafer 200. In addition, the formation of the silicon layer including Cl on the wafer 200 results in a higher film forming rate than the formation of the adsorption layer of the HCDS gas on the wafer 200.

When the thickness of the silicon-containing layer including Cl formed on the wafer 200 exceeds several atomic layers, an effect of the modification reaction in Step 2A, which will be described later, is not applied to the entire silicon-containing layer including Cl. Further, a minimum value of the thickness of the silicon-containing layer including Cl that can be formed on the wafer 200 is less than one atomic layer. Accordingly, the thickness of the silicon-containing layer including Cl may range from less than one atomic layer to several atomic layers. When the thickness of the silicon-containing layer including Cl is one atomic layer or less (i.e., one atomic layer or less than one atomic layer), an effect of the modification reaction in Step 2A, which will be described later, can be relatively increased, and thus a time required for the modification reaction in Step 2 can be reduced. A time required for forming the silicon-containing layer including Cl in Step 1A can also be reduced. As a result, a processing time per one cycle can be reduced, and a total processing time can also be reduced. As such, the film forming rate can be increased. In addition, as the thickness of the silicon-containing layer including Cl is one atomic layer or less, it may become easier to maintain and control the film thickness uniformity.

(Residual Gas Removal)

After the silicon-containing layer including Cl is formed as a first layer, the valve 243a of the first gas supply pipe 232a is closed to stop the supply of the HCDS gas. At this time, while the APC valve 244 of the exhaust pipe 231 is in an open state, the interior of the process chamber 201 is vacuum-exhausted by the vacuum pump 246 to remove the HCDS gas remaining in the process chamber 201, which has not reacted or which remains after contributing to the formation of the silicon-containing layer including Cl, from the process chamber 201 (residual gas removal). In this case, the valves 243f, 243g, 243h, and 243i are in an open state, and the supply of the $N_2$ gas (inert gas) into the process chamber 201 is maintained. The $N_2$ gas acts as the purge gas. Thus, the HCDS gas remaining in the process chamber 201, which has not reacted or which remains after contributing to the formation of the silicon-containing layer including Cl, can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect caused in Step 2A performed thereafter. Here, an amount of the $N_2$ gas supplied into the process chamber 201 need not be a large amount, and for example, approximately the same amount of the $N_2$ gas as a volume of the reaction tube 203 (the process chamber 201) may be supplied to perform the purge such that there is no adverse effect caused in Step 2A. As described above, as the interior of the process chamber 201 is not completely purged, the purge time can be reduced, thereby improving the throughput. In addition, the consumption of the $N_2$ gas can also be suppressed to a minimal necessity.

The chlorosilane-based source gas may include an inorganic source gas such as a tetrachlorosilane, i.e., silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas, or the like, in addition to the hexachlorodisilane ($Si_2Cl_6$, abbreviated to HCDS) gas. The inert gas may include a rare gas such as Ar gas, He gas, Ne gas, Xe gas, and the like, in addition to the $N_2$ gas.

[Step 2A]

(TMB Gas Supply)

After Step 1A is terminated and the residual gas in the process chamber 201 is removed, the valve 243b of the second gas supply pipe 232b is opened to flow TMB gas into the second gas supply pipe 232b. A flow rate of the TMB gas flowing in the second gas supply pipe 232b is adjusted by the mass flow controller 241b. The flow rate-adjusted TMB gas is supplied into the process chamber 201 through the gas supply holes 250b of the second nozzle 249b, and exhausted through the exhaust pipe 231. In this way, the TMB gas is supplied to the wafer 200 (TMB gas supply). At the same time, the valve 243g is opened to flow $N_2$ gas (inert gas) into the second inert gas supply pipe 232g. A flow rate of the $N_2$ gas flowing in the second inert gas supply pipe 232g is adjusted by the mass flow controller 241g. The flow rate-adjusted $N_2$ gas is supplied into the process chamber 201 together with the TMB gas, and exhausted through the exhaust pipe 231. In this case, in order to prevent infiltration of the TMB gas into the first nozzle 249a, the third nozzle 249c, the fourth nozzle 249d, and the buffer chamber 237, the valves 243f, 243h, and 243i are opened to flow $N_2$ gas into the first inert gas supply pipe 232f, the third inert gas supply pipe 232h, and the fourth inert gas supply pipe 232i. The $N_2$ gas is supplied into the process chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and exhausted through the exhaust pipe 231.

In this case, the APC valve 244 is appropriately adjusted to set the internal pressure of the process chamber 201 to fall, for example, within a range of 1 to 13,300 Pa, or more preferably, for example, within a range of 500 to 5,000 Pa. A supply flow rate of the TMB gas controlled by the mass flow controller 241*b* is set to fall, for example, within a range of 1 to 1,000 sccm. A supply flow rate of the N$_2$ gas controlled by each of the mass flow controllers 241*g*, 241*f*, 241*h*, and 241*i* is set to fall, for example, within a range of 100 to 10,000 sccm. A time of supplying the TMB gas to the wafers 200, i.e., a gas supply time (irradiation time), is set to fall, for example, within a range of 1 to 200 seconds, or more preferably, for example, within a range of 1 to 60 seconds. In this case, similar to Step 1A, the temperature of the heater 207 is set such that a temperature of the wafers 200 falls, for example, within a range of 250 to 700 degrees C., more preferably, for example, within a range of 300 to 650 degrees C., or further more preferably, for example, within a range of 350 to 600 degrees C.

As the TMB gas is supplied to the wafer 200 under the above-described conditions, the silicon-containing layer including Cl which is formed as the first layer on the wafer 200 in Step 1A reacts with the TMB gas. As such, Cl (a chloro group) contained in the first layer may react with a ligand (a methyl group) included in the TMB. Accordingly, Cl of the first layer reacted with the ligand of the TMB can be separated (extracted) from the first layer, and the ligand of the TMB reacted with Cl of the first layer can also be separated from the TMB. Then, the TMB from which the ligand is separated can be bonded to Si of the first layer. Specifically, a portion of a borazine ring of the TMB from which a ligand is separated can be bonded to Si of the first layer. More specifically, nitrogen constituting the borazine ring of the TMB from which the ligand is separated can be bonded to Si of the first layer. Thus, N subjected to having a dangling bond due to separation of the methyl ligand, among B and N constituting the borazine ring of the TMB, can be bonded to Si subjected to having a dangling bond or having had a dangling bond that is included in the first layer, thereby enabling formation of Si—N bonding. Here, the borazine ring skeleton constituting the borazine ring of the TMB is maintained without being broken.

As the TMB gas is supplied under the above-described conditions, the first layer including Cl can appropriately react with the TMB while the borazine ring skeleton in the TMB is maintained without being broken, and thus, it is possible to cause a series of the above-described reactions. In addition, the most important factors (conditions) for causing the series of above-described reactions in a state where the borazine ring skeleton of the TMB is maintained are the temperature of the wafer 200 and the internal pressure of the process chamber 201, particularly, the temperature of the wafer 200. Thus, it is possible to cause suitable reactions by appropriately controlling the factors.

Through the series of reactions, the borazine ring is newly introduced into the first layer, and the first layer is changed (modified) into a second layer having the borazine ring skeleton and including silicon (Si), boron (B), carbon (C), and nitrogen (N), i.e., a silicon borocarbonitride layer (SiBCN layer) having a borazine ring skeleton. The second layer becomes a SiBCN layer having a borazine ring skeleton with a thickness of, for example, less than one atomic layer to several atomic layers. The SiBCN layer including a borazine ring skeleton may be referred to as a layer including silicon (Si), carbon (C), and a borazine ring skeleton.

As the borazine ring is newly introduced into the first layer, a boron (B) component constituting the borazine ring is newly introduced into the first layer. Further, a nitrogen (N) component constituting the borazine ring is also introduced into the first layer. Furthermore, a carbon (C) component included in the ligand of the TMB is introduced into the first layer. As such, when the borazine ring is introduced into the first layer by causing the first layer including Cl to react with the TMB, the B component is newly added to the first layer while the N component is newly added to the first layer. Further, in this case, the C component is also newly added to the first layer. Thus, as the borazine ring is introduced into the first layer by causing the first layer including Cl to react with the TMB, it is possible to newly add the B component, the N component, and the C component into the second layer.

In addition, when the first layer including Cl reacts with the TMB, impurities such as Cl in the first layer are extracted or desorbed from the first layer by the above-described reactions, thereby being separated from the first layer. Accordingly, the second layer becomes to have fewer impurities such as Cl when compared with the first layer.

Further, when the first layer is modified to form the second layer including Si, B, C, and N and having a borazine ring skeleton (SiBCN layer including a borazine ring skeleton) by causing the first layer including Cl to react with the alkylborazine compound such as the TMB, the borazine ring skeleton constituting the borazine ring included in the borazine compound (TMB) is maintained without being broken, whereby the central space of the borazine ring can be maintained and thus the porous SiBCN layer can be formed.

(Residual Gas Removal)

Thereafter, the valve 243*b* of the second gas supply pipe 232*b* is closed to stop the supply of the TMB gas. At this time, while the APC valve 244 of the exhaust pipe 231 is in an open state, the interior of the process chamber 201 is vacuum-exhausted by the vacuum pump 246, and the TMB gas remaining in the process chamber 201, which has not reacted or which remains after contributing to the reaction, or reaction byproducts are removed from the process chamber 201 (residual gas removal). In this case, the valves 243*g*, 243*f*, 243*h*, and 243*i* are in an open state, and the supply of the N$_2$ gas as the inert gas into the process chamber 201 is maintained. The N$_2$ gas acts as a purge gas, and thus, the TMB gas remaining in the process chamber 201, which has not reacted or which remains after contributing to the formation of the second layer, or reaction byproducts can be more effectively removed from the process chamber 201.

Moreover, in this case, the gas remaining in the process chamber 201 may not be completely removed, and the interior of the process chamber 201 may not be completely purged. When the gas remaining in the process chamber 201 is very small in amount, there is no adverse effect caused in Step 1A performed thereafter. Here, an amount of the N$_2$ gas supplied into the process chamber 201 need not be a large amount, and for example, approximately the same amount of the N$_2$ gas as a volume of the reaction tube 203 (the process chamber 201) may be supplied to perform the purge such that there is no adverse effect caused in Step 1A. In this way, as the interior of the process chamber 201 is not completely purged, the purge time can be reduced, thereby improving the throughput. In addition, the consumption of the N$_2$ gas can also be suppressed to a minimal necessity.

Figure 16D:
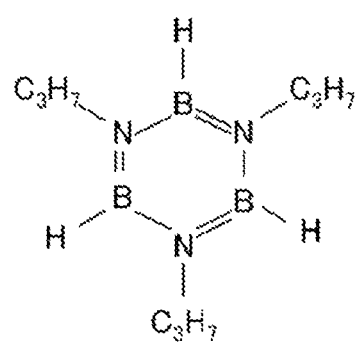
FIG. 16D illustrates a chemical structural formula of n,n', n"-tri-n-propylborazine.

The reaction gas including the borazine compound may include, for example, n,n',n"-triethylborazine (abbreviated to TEB) gas, n,n',n"-tri-n-propylborazine (abbreviated to TPB) gas, n,n',n"-triisopropylborazine (abbreviated to TIPB) gas, n,n',n"-tri-n-butylborazine (abbreviated to TBB) gas, n,n',n"-triisobutylborazine (abbreviated to TIBB) gas, and the like, in addition to the TMB gas. For example, the TPB may be represented by the chemical structural formula shown in FIG. 16B, wherein $R_1$, $R_3$, and $R_5$ are H while $R_2$, $R_4$, and $R_6$ are a propyl group (—$C_3H_7$), or a chemical structural formula shown in FIG. 16D. In addition, the TMB is a borazine compound having a borazine ring skeleton and including a methyl group as a ligand, the TEB is a borazine compound having a borazine ring skeleton and including an ethyl group as a ligand, the TPB is a borazine compound having a borazine ring skeleton and including a propyl group as a ligand, the TIPB is a borazine compound having a borazine ring skeleton and including an isopropyl group as a ligand, the TBB is a borazine compound having a borazine ring skeleton and including a butyl group as a ligand, and the TIBB is a borazine compound having a borazine ring skeleton and including an isobutyl group as a ligand. The inert gas may include a rare gas such as Ar gas, He gas, Ne gas, Xe gas, and the like, in addition to the $N_2$ gas.

(Performing Predetermined Number of Times)

Above-mentioned Steps 1A and 2A may be set as one cycle and the cycle may be performed one or more times (i.e., a predetermined number of times), i.e., Steps 1A and 2A may be alternately performed one or more times (i.e., a predetermined number of times). As a result, a silicon borocarbonitride film (SiBCN film) having a borazine ring skeleton and including a predetermined composition with a predetermined film thickness on the wafer 200, i.e., a thin film having a borazine ring skeleton and including silicon (Si), boron (B), carbon (C), and nitrogen (N), can be formed. Also, the above-described cycle may be performed multiple times. That is, it is possible that a thickness of the SiBCN layer containing the borazine ring skeleton formed per cycle is set to be smaller than a desired film thickness, and the above-described cycle is repeated multiple times until the film of a desired thickness is obtained. In this case, the formed SiBCN film including a borazine ring skeleton may be referred to as a thin film including silicon (Si), carbon (C), and a borazine ring skeleton.

In this case, a ratio of respective element components of the SiBCN layer having a borazine ring skeleton, i.e., ratios of a silicon component, a boron component, a carbon component, and a nitrogen component, i.e., a silicon concentration, a boron concentration, a carbon concentration, and a nitrogen concentration, may be adjusted by controlling the processing conditions such as the internal pressure of the process chamber 201 or the gas supply time in each step. Thus, a composition ratio of the SiBCN film having a borazine ring skeleton can be controlled.

Also, when the cycle is performed multiple times, the phrase "a predetermined gas is supplied to the wafer 200" in each step from at least two cycles means that a predetermined gas is supplied to a layer formed on the wafer 200, i.e., the uppermost surface of the wafer 200, which is a laminated body. The phrase "a predetermined layer is formed on the wafer 200" means that a predetermined layer is formed on a layer formed on the wafer 200, i.e., the uppermost surface of the wafer 200, which is a laminated body. Also, above-described matters are similar in other embodiment or individual modifications described later.

(Purge and Return to Atmospheric Pressure)

When the SiBCN film having a borazine ring skeleton and including the predetermined composition with a predetermined film thickness has been formed, the valves 243f, 243g, 243h, and 243i are opened to supply $N_2$ gas as the inert gas from each of the first inert gas supply pipe 232g, the second inert gas supply pipe 232g, the third inert gas supply pipe 232h, and the fourth inert gas supply pipe 232i into the process chamber 201 and the $N_2$ gas is then exhausted through the exhaust pipe 231. The $N_2$ gas serves as a purge gas and the interior of the process chamber 201 is purged with the inert gas, so that the gas remaining in the process chamber 201 or reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unload and Wafer Discharge)

Thereafter, the seal cap 219 is lowered by the boat elevator 115 to open the lower end portion of the reaction tube 203, and the processed wafers 200 supported by the boat 217 are unloaded to the outside of the reaction tube 203 through the lower end portion of the reaction tube 203 (boat unload). Then, the processed wafers 200 are discharged from the boat 217 (wafer discharge).

(3) Effects According to the Embodiment

According to the embodiment, one or more effects are shown as described later.

According to the film forming sequence of this embodiment, by performing a predetermined number of times a cycle including Steps 1A and 2A, it is possible to form a SiBCN film having high resistance to hydrogen fluoride (HF) and a small dielectric constant on the wafer 200 in a low temperature range, when compared with a conventional SiCN film, SiOCN film, and the like. Thus, it is possible to form a thin film which realizes increasing resistance to HF and decreasing a dielectric constant, which may be in a trade-off relationship, in a low temperature range.

In addition, according to the film forming sequence of this embodiment, a gas including a borazine compound such as TMB or the like which easily reacts with halogen elements such as Cl or the like (e.g., TMB gas) is used as a reaction gas to be highly-reductive. Accordingly, in Step 2A, the first layer including a halogen element (Cl) can efficiently react with the reaction gas and the second layer having a borazine ring skeleton and including Si, B, C, and N (i.e., SiBCN layer having a borazine ring skeleton) can be efficiently formed, which can result in higher productivity of the SiBCN film forming process. It should be appreciated that a borazine compound reacts with a silicon-based halide such as chlorosilane or the like, a reaction of the borazine compound with the silicon-based halide such as chlorosilane or like is increased under specific conditions, and a SiBCN film having a proper characteristic can be efficiently by this reaction.

In addition, according to the film forming sequence of this embodiment, it is possible to form a SiBCN film including silicon, boron, nitrogen, and carbon by using two kinds of gases, e.g., a source gas including Si and Cl (e.g., HCDS gas) and a reaction gas including a borazine compound (e.g., TMB gas). As such, there is no need to a boron source, a nitrogen source, and a carbon source separately for film formation. This makes it possible to reduce time taken per one cycle and further improve a productivity of the film forming process.

In addition, in Step 2A according to the film forming sequence of this embodiment, when the first layer including Cl reacts with the TMB gas, impurities such as Cl can be extracted or desorbed from the first layer by the above reaction. This allows the second layer to have fewer impurities than the first layer. Accordingly, it is possible to reduce an impurity concentration in the SiBCN film formed by performing a predetermined number of times a cycle including Steps 1A and 2A and further improve the HF resistance of the SiBCN film.

In addition, in Step 2A according to the film forming sequence of this embodiment, when the first layer including Cl (a silicon-containing layer including Cl) is modified by supplying an alkylborazine compound such as TMB or the like to the first layer, thereby forming the second layer (e.g., SiBCN layer), since the borazine ring skeleton constituting the borazine ring included in the borazine compound is maintained without being broken, the central space of the borazine ring can be maintained, thereby forming a porous second SiBCN layer. Accordingly, it is possible to make the SiBCN film, which is formed by performing a cycle including Steps 1A and 2A a predetermined number of times, porous, and further decrease a dielectric constant of the SiBCN film. Thus, it is possible to form a very low dielectric constant (low-k) film having a porous structure.

In addition, in Step 2A according to the film forming sequence of this embodiment, when the first layer including Cl (a silicon-containing layer including Cl) is modified by supplying an alkylborazine compound such as TMB or the like to the first layer, thereby forming the second layer (e.g., SiBCN layer), the central space of the borazine ring can be dismantled, for example, by increasing the wafer temperature or the internal pressure of the process chamber over the above-mentioned process conditions to break at least a portion of the borazine ring skeleton constituting the borazine ring included in the borazine compound without being maintained. This can change a state (density) of the borazine ring skeleton in the second layer, and in turn, a porous state (density) of the second layer. Accordingly, it is possible to change the state (density)) of the borazine ring skeleton in the SiBCN film formed by performing the cycle including Steps 1A and 2A a predetermined number of times, and in turn, a porous state (density) of the SiBCN film, and finely adjust a dielectric constant of the SiBCN film.

In this manner, according to the film forming sequence of this embodiment, by changing the state of the borazine ring skeleton in the SiBCN film, that is, by either maintaining the borazine ring skeleton or breaking at least a portion of the borazine ring skeleton, it is possible to control the dielectric constant of the SiBCN film. In addition, by changing the state of the borazine ring skeleton in the film, it is possible to control a film stress.

In addition, according to the film forming sequence of this embodiment, since the chlorosilane-based source is supplied to form the first layer including Cl (silicon-containing layer including Cl) on the wafer 200 in Step 2A and then, the borazine-based gas is supplied to modify the first layer including Cl to form the second layer (e.g., SiBCN layer), a boron concentration, a nitrogen concentration, and a carbon concentration in the second layer can be adjusted to desired values. Accordingly, it is possible to easily control a composition of the SiBCN film formed by performing the cycle including Steps 1A and 2A one or more times (i.e., a predetermined number of times) and form a SiBCN film having a desired characteristic.

In addition, by adjusting a boron concentration and a carbon concentration in the SiBCN film, it is possible to control resistance of the SiBCN film to HF and hot phosphoric acid. For example, HF can have a lower wet etching rate (WER) than that of a SiN film (i.e., the HF resistance can be higher than the SiN film resistance) by increasing a boron concentration and a carbon concentration in the SiBCN film, whereas HF can have a higher WER than that of the SiN film (i.e., the HF resistance can be lower than the SiN film resistance) by decreasing a boron concentration and a carbon concentration in the SiBCN film. Further, if the boron concentration in the film is changed, a change in hot phosphoric acid resistance tends to show a behavior different from a change in the HF resistance. If the carbon concentration in the film is changed, a change in the hot phosphoric acid resistance tends to show the same behavior as a change in HF resistance. Accordingly, the hot phosphoric acid can have a higher WER than that of a SiN film (i.e., the hot phosphoric acid resistance can be lower than the SiN film resistance) by increasing the boron concentration in the SiBCN film, whereas the hot phosphoric acid can have a lower WER than that of the SiN film (i.e., the hot phosphoric acid resistance can be higher than the SiN film resistance) by decreasing the boron concentration in the film. In addition, the hot phosphoric acid can have a lower WER than that of a SiN film (i.e., the hot phosphoric acid resistance can be higher than the SiN film resistance) by increasing the carbon concentration in the SiBCN film, whereas the hot phosphoric acid can have a higher WER than that of the SiN film (i.e., the hot phosphoric acid resistance can be lower than the SiN film resistance) by decreasing the carbon concentration in the film.

Modification 1

Figure 5C:
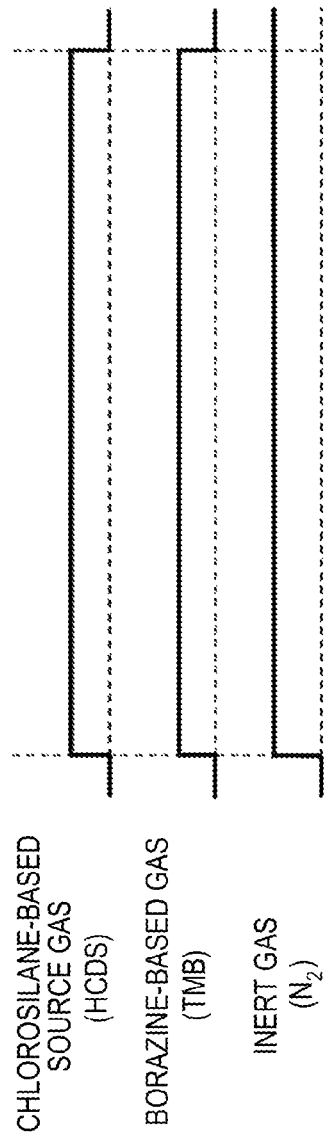
FIG. 5C illustrate another modified timing diagram for supplying a plurality of gases in a film forming sequence according to the first embodiment of the present disclosure.

Although it is described in the above film forming sequence shown in FIGS. 4 and 5A that the SiBCN film is formed on the wafer 200 by performing the cycle alternately performing Steps 1A and 2A one or more times (i.e., a predetermined number of times), i.e., by alternately supplying the source gas and the reaction gas, this embodiment is not limited thereto. For example, the SiBCN film may be formed on the wafer 200 by performing a cycle simultaneously performing Steps 1A and 2A one or more times (i.e., a predetermined number of times), i.e., by simultaneously supplying the source gas and the reaction gas. FIG. 5B shows an example of performing a cycle simultaneously performing Steps 1A and 2A multiple times (i.e., n times), while FIG. 5C shows an example of performing a cycle once simultaneously performing Steps 1A and 2A. In the film forming sequence shown in FIG. 5B, it is possible to control a thickness of the SiBCN film formed on the wafer 200 by mainly adjusting the number of times for performing the cycle. In the film forming sequence shown in FIG. 5C, it is possible to control a thickness of the SiBCN film formed on the wafer 200 by mainly adjusting the time of performing for the cycle (gas supply time). Process conditions in both cases may be set to be equal to the process conditions in the above film forming sequence shown in FIGS. 4 and 5A.

In this manner, even when the source gas and the reaction gas are supplied to the wafer 200 in the process chamber 201 simultaneously instead of sequentially, the same operations and effects as the above-described embodiment can be achieved. However, it is preferable to sequentially supply the source gas and the reaction gas, i.e., alternately supply the source gas and the reaction gas with a purge in the process chamber 201 put therebetween, as in the above-described embodiment, in that the source gas and the reaction gas can properly react with each other under a condition where a surface reaction is dominant and controllability of film thickness can be increased.

Modification 2

Although it is described in the above film forming sequence shown in FIGS. 4 and 5A that the SiBCN film is formed on the wafer 200 by using the TMB gas including an organic borazine compound as the reaction gas including the borazine compound, this embodiment is not limited thereto. For example, the TMB gas including an inorganic borazine compound may be used as the reaction gas including the borazine compound. By using such a gas including an inorganic borazine compound, i.e., a borazine compound gas including no carbon (C), as the reaction gas, when the first layer is modified in Step 2A, no carbon (C) component is introduced into the first layer and the first layer is changed (modified) into the second layer having a borazine ring skeleton and including silicon (Si), boron (B), and nitrogen (Ni), i.e., a silicon boronitride layer (SiBN layer) having a borazine ring skeleton. As a result, instead of a SiBCN film having a borazine ring skeleton, a SiBN film having a borazine ring skeleton is formed on the wafer 200. The SiBN layer, which is formed according to this case, having a borazine ring skeleton may also referred to as a layer having silicon (Si) and a borazine ring skeleton. Further, the SiBN film, which is formed according to this case, having a borazine ring skeleton may also referred to as a thin film having silicon (Si) and a borazine ring skeleton.

Second Embodiment of the Present Disclosure

Hereinafter, a second embodiment will be described later.

Although it is described in the first embodiment that a film having a borazine ring skeleton and including a certain element, boron, carbon, and nitrogen (e.g., SiBCN film) is formed on a substrate by performing a cycle including Steps 1A and 2A a predetermined number of times, the second embodiment describes an example where a thin film having a borazine ring skeleton and including a certain element, boron, carbon, and nitrogen (e.g., SiBCN film), or a thin film having a borazine ring skeleton and including a certain element, boron, and nitrogen (e.g., SiBN film) is formed on a substrate by performing a cycle a predetermined number of times. The cycle further includes Step 3B which supplies a nitridation gas (e.g., $NH_3$ gas) to the substrate, in addition to Steps 1B and 2B that perform the same operations as those of the above-described Steps 1A and 2A.

In the film forming sequence of this embodiment, a thin film having a borazine ring skeleton and including a predetermined element, boron, carbon, and nitrogen or a thin film having a borazine ring skeleton and including a predetermined element, boron, and nitrogen is formed on a substrate by performing a cycle a predetermined number of times. The cycle includes a process of supplying a source gas including a predetermined element and a halogen group to the substrate, a process of supplying a reaction gas including a borazine compound to the substrate, and a process of supplying a nitridation gas to the substrate under a condition where the borazine ring skeleton in the borazine compound is maintained.

Specifically, a thin film having a borazine ring skeleton and including a certain element, boron, carbon, and nitrogen or a thin film having a borazine ring skeleton and including a certain element, boron, and nitrogen is formed on a substrate by performing a cycle a predetermined number of times. The cycle includes a process of forming a first layer including a predetermined element and a halogen group on the substrate by supplying a source gas including the predetermined element and the halogen group to the substrate, a process of supplying a reaction gas including a borazine compound to the substrate and forming a second layer having a borazine ring skeleton and including a predetermined element, boron, carbon, and nitrogen on the substrate by modifying the first layer through reaction of the first layer with the borazine compound under a condition where the borazine ring skeleton in the borazine compound is maintained, and a process of supplying a nitridation gas to the substrate and forming a third layer having a borazine ring skeleton and including a certain element, boron, carbon, and nitrogen or a third layer having a borazine ring skeleton and including a certain element, boron, and nitrogen on the substrate by modifying the second layer through nitridation of the second layer under a condition where the borazine ring skeleton in the second layer is maintained.

The process of supplying the source gas and the process of supplying the reaction gas are performed in the same manner as those in the first embodiment. That is, the process of forming the first layer and the process of forming the second layer are performed in the same manner as those in the first embodiment.

In the process of forming the third layer, the second layer is modified by nitriding the second layer using the nitridation gas under the condition where the borazine ring skeleton in the second layer is maintained. Thus, nitrogen is also added to the second layer by the nitridation of the second layer. In addition, at least some of carbons contained in the second layer are separated (extracted) from the second layer.

In this embodiment, in the process of forming the third layer, a layer having a borazine ring skeleton and including silicon, boron, carbon, and nitrogen (i.e., silicon borocarbonitride layer) is formed as the third layer having a borazine ring skeleton and including a certain element, boron, carbon, and nitrogen, or a layer having a borazine ring skeleton and including silicon, boron and nitrogen (i.e., silicon boronitride layer) is formed as the third layer having a borazine ring skeleton and including a certain element, boron, and nitrogen. In addition, by performing the above cycle a predetermined number of times, a thin film having a borazine ring skeleton and including silicon, boron, carbon, and nitrogen (i.e., silicon borocarbonitride film) is formed as a thin film having a borazine ring skeleton and including a certain element, boron, carbon and nitrogen, or a thin film having a borazine ring skeleton and including silicon, boron, and nitrogen (i.e., silicon boronitride film) is formed as a thin film having a borazine ring skeleton and including a certain element, boron and nitrogen.

(First Sequence)

Figure 6:
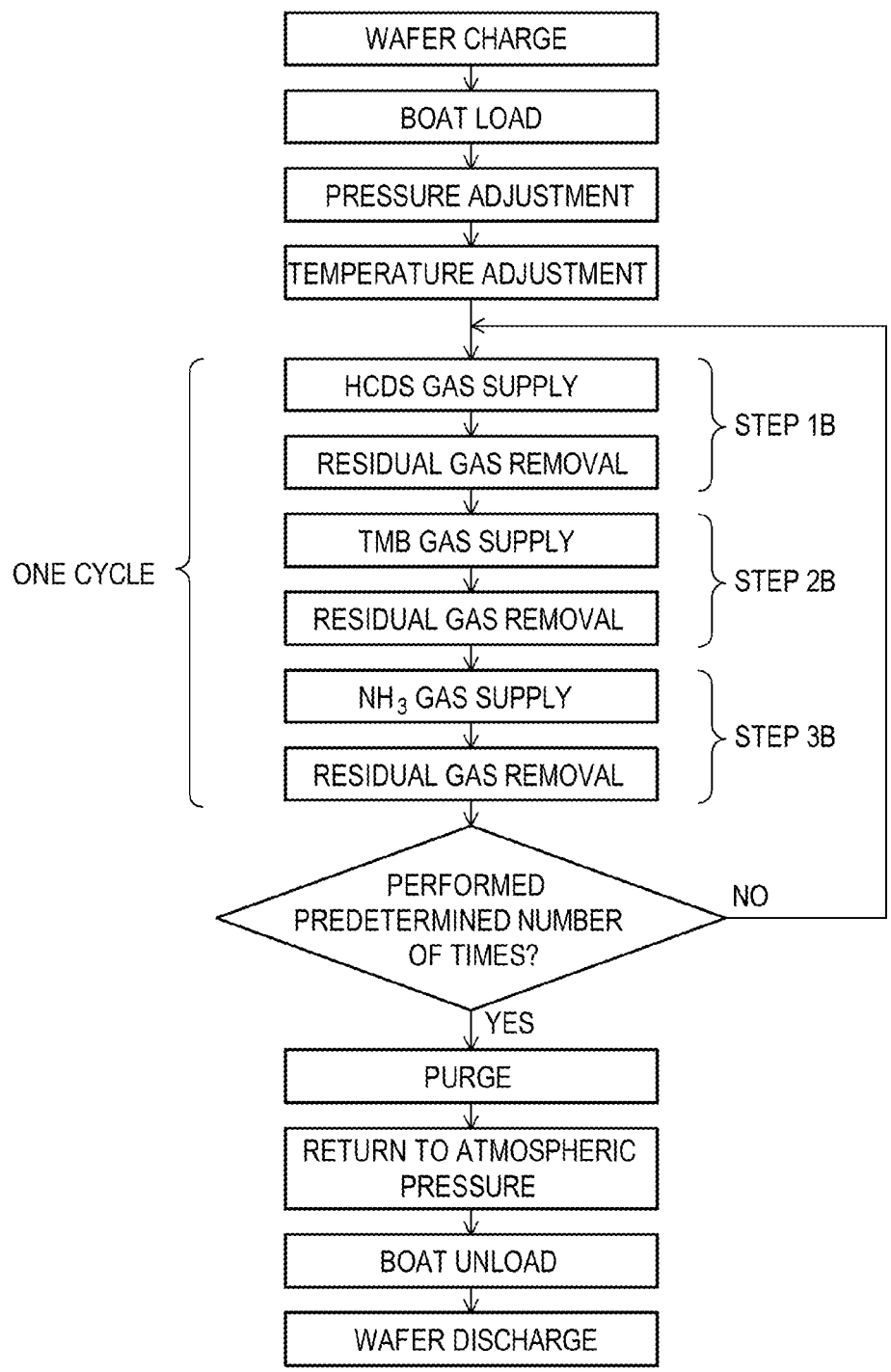
FIG. 6 illustrates a flowchart for forming a film in a first sequence, according to a second embodiment of the present disclosure.
Figure 7A:
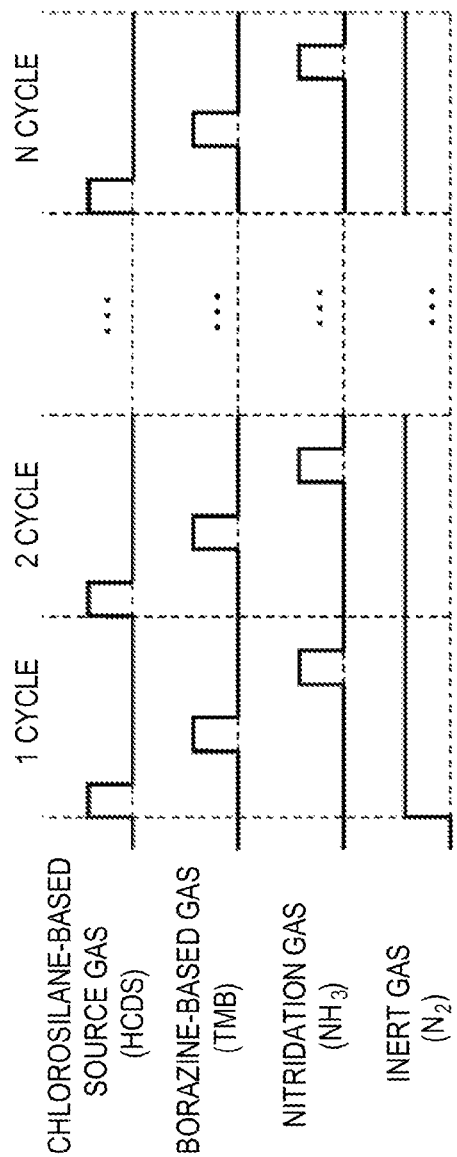
FIG. 7A illustrates a timing diagram for supplying a plurality of gases in a non-plasma film forming sequence according to the first sequence of the second embodiment.

A first sequence of this embodiment will be described. FIG. 6 illustrates a flowchart for forming a film in the first sequence, according to the second embodiment. FIG. 7A illustrates a timing diagram for supplying a plurality of gases according in a non-plasma film forming sequence according to the first sequence of the second embodiment. FIG. 7B illustrates another timing diagram for supplying a plurality of gases and a plasma power in a plasma film forming sequence according to the first sequence of the second embodiment.

In the first sequence of this embodiment, a silicon borocarbonitride (SiBCN) film having a borazine ring skeleton is formed as a thin film having a borazine ring skeleton and including silicon, boron, carbon, and nitrogen on the wafer 200 or a silicon boronitride (SiBN) film having a borazine ring skeleton is formed as a thin film having a borazine ring skeleton and including silicon, boron, and nitrogen on the wafer 200. The silicon film is formed by performing a cycle a predetermined number of times. The cycle includes a process of supplying a chlorosilane-based source gas including silicon and a chloro group to the wafer 200 in the process chamber 201 and forming a silicon (Si)-containing layer including chlorine (Cl) as a first layer including silicon and a chloro group (chlorine) on the wafer 200, and a process of supplying a reaction gas including a borazine compound to the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the first layer through reaction of the first layer with the borazine compound under a condition where the borazine ring skeleton in the borazine compound is maintained. Further, the cycle includes a process of supplying a nitridation gas to the wafer 200 in the process chamber 201 and forming a silicon borocarbonitride (SiBCN) layer having a borazine ring skeleton as a third layer having a borazine ring skeleton and including silicon, boron, carbon, and nitrogen or a silicon boronitride (SiBN) layer having a borazine ring skeleton as a third layer having a borazine ring skeleton and including silicon, boron, and nitrogen on the wafer 200 by modifying the second layer through nitridation of the second layer under a condition where the borazine ring skeleton in the second layer is maintained.

The first sequence in this embodiment has the same configurations as the film forming sequence of the first embodiment except that the former further includes Step 3B in addition to Steps 1B and 2B performing the same operations as Steps 1A and 2A. An example of using $NH_3$ gas as a nitridation gas in Step 3B will be described later.

[Step 3B]
($NH_3$ Gas Supply)

After Step 2B is terminated and the residual gas in the process chamber 201 is removed, the valve 243c of the third gas supply pipe 232c is opened to flow $NH_3$ gas into the third gas supply pipe 232c. A flow rate of the $NH_3$ gas flowing in the third gas supply pipe 232c is adjusted by the mass flow controller 241c. The flow rate-adjusted $NH_3$ gas is supplied into the buffer chamber 237 through the gas supply holes 250c of the fourth nozzle 249c. At this time, if no high-frequency power is applied between the first rod-shaped electrode 269 and the second rod-shaped electrode 270, the $NH_3$ gas supplied into the buffer chamber 237 is activated by heat, supplied into the process chamber 201 through the gas supply holes 250e, and exhausted through the exhaust pipe 231 (as illustrated in FIG. 7A). Alternatively, if high-frequency power is applied between the first rod-shaped electrode 269 and the second rod-shaped electrode 270 from the high-frequency power source 273 through the matching unit 272, the $NH_3$ gas supplied into the buffer chamber 237 is plasma-excited, supplied as an active species into the process chamber 201 through the gas supply holes 250e, and exhausted through the exhaust pipe 231 (as illustrated in FIG. 7B). In this way, the $NH_3$ gas activated by heat or plasma is supplied to the wafer 200. At the same time, the valve 243h is opened to flow $N_2$ gas into the third inert gas supply pipe 232h. The $N_2$ gas is supplied into the process chamber 201 together with the $NH_3$ gas, and exhausted through the exhaust pipe 231. In this case, in order to prevent infiltration of the $NH_3$ gas into the first nozzle 249a, the second nozzle 249b, and the fourth nozzle 249d, the valves 243f, 243g, and 243i are opened to flow the $N_2$ gas into the first inert gas supply pipe 232f, the second inert gas supply pipe 232g, and the fourth inert gas supply pipe 232i. The $N_2$ gas is supplied into the process chamber 201 through the first gas supply pipe 232a, the second gas supply pipe 232b, the fourth gas supply pipe 232d, the first nozzle 249a, the second nozzle 249b, and the fourth nozzle 249d, and is exhausted through the exhaust pipe 231.

When the $NH_3$ gas is not plasma-excited but is activated by heat and is allowed to flow, the APC valve 244 is appropriately adjusted to set the internal pressure of the process chamber 201 to fall, for example, within a range of 1 to 3,000 Pa. The internal pressure of the process chamber 201 is set to fall within a relatively high pressure range, thereby making it possible to thermally activate the $NH_3$ gas under non-plasma conditions. In addition, if the $NH_3$ gas is activated by heat and supplied, relatively soft reaction can be caused, thereby making it possible to perform the nitriding described later more softly. A partial pressure of the $NH_3$ gas in the process chamber 201 is set to fall, for example, within a range of 0.01 to 2970 Pa. A supply flow rate of the $NH_3$ gas controlled by the mass flow controller 241c is set to fall, for example, within a range of 100 to 10,000 sccm. A supply flow rate of the $N_2$ gas controlled by each of the mass flow controllers 241h, 241f, 241g, and 241i is set to fall, for example, within a range of 100 to 10,000 sccm. A time of supplying the $NH_3$ gas activated by heat to the wafer 200, i.e., a gas supply time (irradiation time), is set to fall, for example, within a range of 1 to 120 seconds, or more preferably, for example, within a range of 1 to 60 seconds. In this case, a temperature of the heater 207 is set such that a temperature of the wafer 200 falls, for example, within a range of 250 to 700 degrees C., more preferably, for example, within a range of 300 to 650 degrees C., or further more preferably, for example, within a range of 350 to 600 degrees C., in the same manner as Steps 1B and 2B.

When the $NH_3$ gas is plasma-excited and allowed to flow as an active species, the APC valve 244 is appropriately adjusted to set the internal pressure of the process chamber 201 to fall, for example, within a range of 1 to 100 Pa. Even though the internal pressure of the process chamber 201 is set to fall within such a relatively low pressure range, it is possible to activate the $NH_3$ gas by using plasma. A partial pressure of the $NH_3$ gas in the process chamber 201 is set to fall, for example, within a range of 0.01 to 100 Pa. A supply flow rate of the $NH_3$ gas controlled by the mass flow controller 241c is set to fall, for example, within a range of 100 to 10,000 sccm. A supply flow rate of the $N_2$ gas controlled by each of the mass flow controllers 241h, 241f, 241g, and 241i is set to fall, for example, within a range of 100 to 10,000 sccm. A time of supplying the active species obtained by plasma-exciting the $NH_3$ gas to the wafer 200, i.e., a gas supply time (irradiation time), is set to fall, for example, within a range of 1 to 120 seconds, or more preferably, for example, within a range of 1 to 60 seconds. In this case, a temperature of the heater 207 is set such that a temperature of the wafer 200 falls, for example, within a range of 250 to 700 degrees C., more preferably, for example, within a range of 300 to 650 degrees C., or further more preferably, for example, within a range of 350 to 600 degrees C., in the same manner as Steps 1B and 2B. The high-frequency power applied between the first rod-shaped electrode 269 and the second rod-shaped electrode 270 from the high-frequency power source 273 is set to fall, for example, within a range of 50 to 1,000 W.

In this case, a gas flown into the process chamber 201 is the $NH_3$ gas thermally activated by increasing the internal pressure of the process chamber 201 or the active species obtained by exciting the $NH_3$ gas with plasma, while neither HCDS gas nor TMB gas flows. Therefore, the thermally activated $NH_3$ gas or the active species reacts with at least a portion of the second layer (having a borazine ring skeleton and including Si, B, C, and N) formed on the wafer 200 in Step 2B, without causing any gaseous reaction. This nitrides the second layer to be modified into the third layer having a borazine ring skeleton and including Si, B, C, and N (i.e., SiBCN layer) or the third layer having a borazine ring skeleton and including Si, B, and N (i.e., SiBN layer). The third layer becomes a SiBCN layer or a SiBN layer having a borazine ring skeleton with a thickness of less than one atomic layer to several atomic layers. The SiBCN layer or the SiBN layer, which is formed according to this case, having a borazine ring skeleton may be referred to as a layer including Si, C, N, and a borazine ring skeleton or a layer including Si, N, and a borazine ring skeleton.

In the process of forming the third layer, the second layer is modified by nitriding the second layer using the nitridation gas under the conditions where the borazine ring skeleton in the second layer is maintained. In this case, nitrogen is added to the second layer by the nitridation of the second layer. In addition, at least some of carbons included in the second layer are separated (extracted) from the second layer. In this case, the borazine ring skeleton constituting the borazine ring included in the second layer is maintained without being broken.

When the $NH_3$ gas is supplied under the above conditions, the second layer can properly react with the $NH_3$ gas while maintaining the borazine ring skeleton of the second layer without being broken, thereby causing the above-described reaction. In addition, it is believed that the most important factors (conditions) for this reaction, with the second layer borazine ring skeleton maintained, are the temperature of the wafer 200 and the internal pressure of the process chamber 201, particularly, the temperature of the wafer 200. Thus, it is possible to cause suitable reactions by appropriately controlling the factors.

In addition, as shown in FIG. 7A, when the thermally-activated $NH_3$ gas is flown into the process chamber 201, the second layer can be thermally nitrided to be modified (changed) into the SiBCN layer or the SiBN layer. In this case, the second layer is modified into the SiBCN layer or the SiBN layer by separating (extracting) at least a portion of the C component from the second layer by energy of the activated $NH_3$ gas while a ratio of the N component in the second layer is being increased. In addition, thermal nitridation by the $NH_3$ gas increases Si—N bonding in the second layer, while decreasing Si—C bonding and Si—Si bonding, resulting in reduced ratios of the C component and the Si component in the second layer. In particular, most of the C component may be separated so that it is decreased to a degree of impurities or substantially non-existing. As such, the second layer can be modified into the SiBCN layer or the SiBN layer while changing a composition ratio in such a manner that the nitrogen concentration is increased whereas the carbon concentration and the silicon concentration are decreased. In addition, when process conditions such as the internal pressure of the process chamber 201, the gas supply time, and the like are controlled, a ratio of the N component in the SiBCN layer or the SiBN layer, i.e., the nitrogen concentration, can be minutely adjusted and a composition ratio of the SiBCN layer or the SiBN layer can be more precisely controlled.

In addition, as shown in FIG. 7B, when the active species obtained by exciting the $NH_3$ gas with plasma is flown into the process chamber 201, the second layer can be plasma-nitrided to be modified (changed) into the SiBCN layer or the SiBN layer. In this case, the second layer is modified into the SiBCN layer or the SiBN layer by separating at least a portion of the C component from the second layer by energy of the active species while a ratio of the N component in the second layer is being increased. In addition, plasma nitridation by the $NH_3$ gas increases Si—N bonding in the second layer, while decreasing Si—C bonding and Si—Si bonding, resulting in reduced ratios of the C component and the Si component in the second layer. In particular, most of the C component can be separated so that it is decreased to a degree of impurities or substantially non-existing. As such, the second layer can be modified into the SiBCN layer or the SiBN layer while changing a composition ratio in such a manner that the nitrogen concentration is increased whereas the carbon concentration and the silicon concentration are decreased. In addition, when process conditions such as the internal pressure of the process chamber 201, the gas supply time, and the like are controlled, a ratio of the N component in the SiBCN layer or the SiBN layer, i.e., the nitrogen concentration, can be minutely adjusted and a composition ratio of the SiBCN layer or the SiBN layer can be more precisely controlled.

At this time, the nitriding reaction of the second layer may not be saturated. For example, in Steps 1B and 2B, when the second layer having a thickness of less than one atomic layer to several atomic layers is formed, the second layer may be partially nitrided. In this case, in order not to nitride the entire of the second layer having a thickness of less than one atomic layer to several atomic layers, the second layer is nitrided under a condition in which the nitriding reaction of the second layer is unsaturated.

In order to unsaturate the nitriding reaction of the second layer, the processing conditions in Step 3B need only be the above-described processing conditions, but, furthermore, it is easy to unsaturate the nitriding reaction of the second layer by employing the below processing conditions as the processing conditions in Step 3B.

[When Flowing $NH_3$ Gas Activated by Heat]
Wafer Temperature: 500 to 650 degrees C.
Internal Pressure of Process Chamber: 133 to 2,666 Pa
Partial Pressure of $NH_3$ Gas: 33 to 2,515 Pa
Supply Flow Rate of $NH_3$ Gas: 1000 to 5,000 sccm
Supply Flow Rate of $N_2$ Gas: 300 to 3000 sccm
Supply Time of $NH_3$ Gas: 6 to 60 seconds
[When Flowing $NH_3$ Gas Activated by Plasma]
Wafer Temperature: 500 to 650 degrees C.
Internal Pressure of Process Chamber: 33 to 80 Pa
Partial Pressure of $NH_3$ Gas: 17 to 75 Pa
Supply Flow Rate of $NH_3$ Gas: 1000 to 5,000 sccm
Supply Flow Rate of $N_2$ Gas: 300 to 1,000 sccm
Supply Time of $NH_3$ Gas: 6 to 60 seconds
(Residual Gas Removal)

Thereafter, the valve 243c of the third gas supply pipe 232c is closed to stop the supply of the $NH_3$ gas. At this time, while the APC valve 244 of the exhaust pipe 231 is in an open state, the interior of the process chamber 201 is vacuum-exhausted by the vacuum pump 246 to remove the $NH_3$ gas remaining in the process chamber 201, which has not reacted or which remains after contributing to the formation of the third layer, and reaction byproducts from the process chamber 201 (residual gas removal). In this case, the valves 243h, 243f, 243g, and 243i are in an open state, and the supply of the $N_2$ gas into the process chamber 201 is maintained. The $N_2$ gas acts as a purge gas which is capable of improving the effect of removing the $NH_3$ gas remaining in the process chamber 201, which has not reacted or which remains after contributing to the formation of the third layer, and the reaction byproducts from the process chamber 201.

Further, the residual gas in the process chamber 201 may not be completely removed and the interior of the process chamber 201 may not be completely purged. When the residual gas in the process chamber 201 is very small in amount, there is no adverse effect caused in Step 1B performed thereafter. Here, an amount of the $N_2$ gas supplied into the process chamber 201 need not be a large amount, and for example, approximately the same amount of the $N_2$ gas as a volume of the reaction tube 203 (the process chamber 201) may be supplied to perform the purge such that there is no adverse effect caused in Step 1B. As described above, as the interior of the process chamber 201 is not completely purged, the purge time can be reduced, thereby improving the throughput. In addition, the consumption of the $N_2$ gas can also be suppressed to a minimal necessity.

Examples of the nitrogen-containing gas may include diazene ($N_2H_2$) gas, hydrazine ($N_2H_4$) gas, $N_3H_8$ gas, a gas including compounds of the above, and the like, in addition to the $NH_3$ gas. Examples of the inert gas may include rare gases such as Ar gas, He gas, Ne gas, Xe gas, and the like, in addition to the $N_2$ gas.

(Performing Predetermined Number of Times)

When one cycle including the above-described Steps 1B to 3B is performed one or more times (i.e., a predetermined number of times), it is possible to form a silicon borocarbonitride (SiBCN) film or a silicon boronitride (SiBN) film having a borazine ring skeleton and including a predetermined composition with a predetermined film thickness, i.e., a thin film having a borazine ring skeleton and including Si, B, C, and N or a thin film having a borazine ring skeleton and including Si, B, and N, on the wafer 200. Also, the above-described cycle may be repeated multiple times. That is, it is possible that a thickness of the SiBCN layer or the SiBN layer containing the borazine ring skeleton formed per cycle is set to be smaller than a desired film thickness, and the above-described cycle is repeated multiple times until the film of a desired thickness is obtained. In this case, the SiBCN film or SiBN film including the formed borazine ring skeleton may be referred to as a thin film including Si, C, N, and a borazine ring skeleton or a thin film including Si, N, and a borazine ring skeleton.

(Second Sequence)

Figure 8:
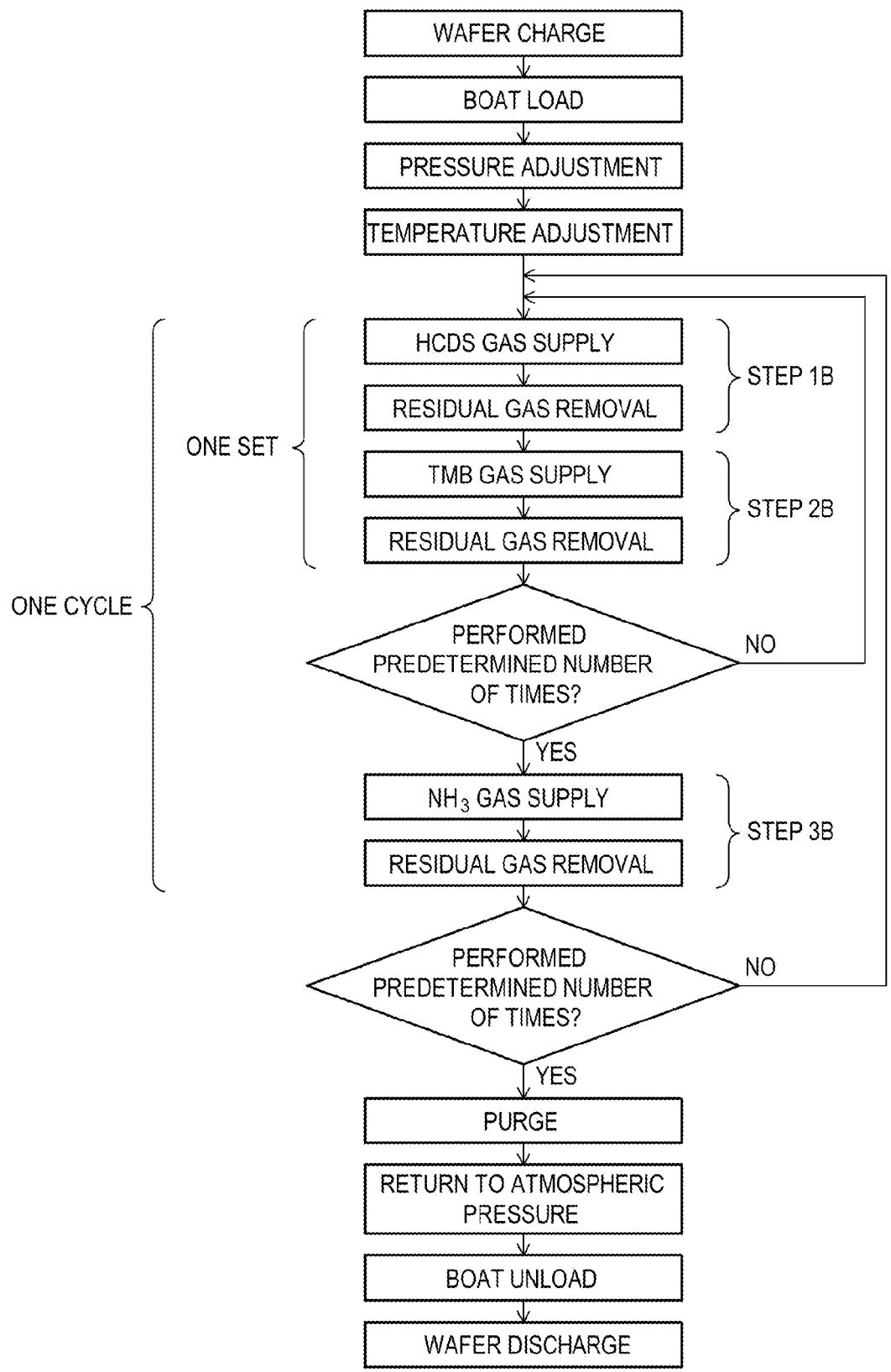
FIG. 8 illustrates a flowchart for forming a film in a second sequence according to the second embodiment of the present disclosure.
Figure 9B:
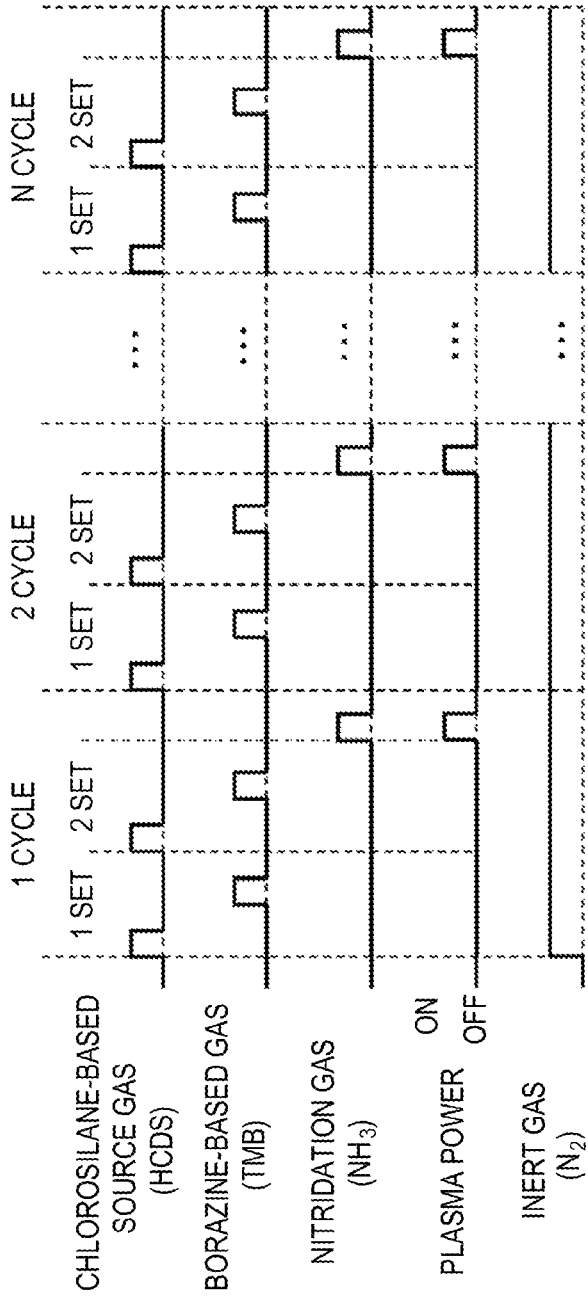
FIG. 9B illustrates another timing diagram for supplying a plurality of gases and a plasma power in a plasma film forming sequence according to the second sequence of the second embodiment.

Next, a second sequence of this embodiment will be described. FIG. 8 illustrates a flowchart for forming a film in the second sequence according to the second embodiment. FIG. 9A illustrates a timing diagram for supplying a plurality of gases according to a non-plasma film forming sequence according to the second sequence of the second embodiment. FIG. 9B illustrates another timing diagram for supplying a plurality of gases and a plasma power according to a plasma film forming sequence according to the second sequence of the second embodiment.

In the second sequence of this embodiment, a film having a borazine ring skeleton and including a predetermined element, boron, carbon, and nitrogen or a film having a borazine ring skeleton and including a predetermined element, boron and nitrogen is formed on a substrate by performing a cycle a predetermined number of times. The cycle in which a process of supplying a source gas including a predetermined element and a halogen group to the substrate and a process of supplying a reaction gas including a borazine compound to the substrate are alternately performed a predetermined number of times, and a process of supplying a nitridation gas to the substrate is then performed, under a condition where the borazine ring skeleton in the borazine compound is maintained.

Specifically, a silicon borocarbonitride (SiBCN) film having a borazine ring skeleton is formed as a thin film having a borazine ring skeleton and including silicon, boron, carbon, and nitrogen on the wafer 200 or a silicon boronitride (SiBN) film having a borazine ring skeleton is formed as a thin film having a borazine ring skeleton and including silicon, boron, and nitrogen on the wafer 200. The silicon film is formed by performing a cycle a predetermined number of times. The cycle includes a process of supplying a chlorosilane-based source gas including silicon and a chloro group to the wafer 200 in the process chamber 201 and forming a silicon (Si)-containing layer including chlorine (Cl) as a first layer including silicon and a chloro group (chlorine) on the wafer 200. The cycle further includes a process of supplying a reaction gas including a borazine compound to the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the first layer through reaction of the first layer with the borazine compound. The above two processes are alternately performed a predetermined number of times (multiple times) under a condition where the borazine ring skeleton in the borazine compound is maintained. In the cycle, a process of supplying a nitridation gas to the wafer 200 in the process chamber 201 and forming a silicon borocarbonitride (SiBCN) layer having a borazine ring skeleton as a third layer having a borazine ring skeleton and including silicon, boron, carbon, and nitrogen or a silicon boronitride (SiBN) layer having a borazine ring skeleton as a third layer having a borazine ring skeleton and including silicon, boron, and nitrogen on the wafer 200 by modifying the second layer through nitridation of the second layer is then performed under a condition where the borazine ring skeleton in the second layer is maintained.

As such, in this sequence, by performing multiple times a cycle in which a set of Steps 1B and 2B in the above-described first sequence is preformed and Step 3B is then performed, a SiBCN film or a SiBN film having a borazine ring skeleton and having a predetermined composition with a predetermined film thickness is formed on the wafer 200. FIGS. 9A and 9B show examples of performing n times a cycle in which a set of Steps 1B and 2B is performed twice and Step 3B is then performed, leading to forming a SiBCN film or a SiBN film having a borazine ring skeleton and including a predetermined composition with a predetermined film thickness on the wafer 200. This second sequence is the same as the first sequence except that Step 3B is performed after repeating the set of Steps 1B and 2B multiple times. In addition, this second sequence may have the same process conditions as the first sequence.

(Effects According to the Embodiment)

The film forming sequence of this embodiment has the same advantages as those of the first embodiment. That is to say, it is possible to form a SiBCN film or a SiBN film having high resistance to hydrogen fluoride (HF) and a small dielectric constant in a low temperature range with a high productivity, when compared with a conventional SiCN film, SiOCN film, and the like. Thus, it is possible to form a thin film which realizes increased resistance for HF and decreased dielectric constant, which may be in a trade-off relationship, in a low temperature range.

In addition, according to the film forming sequence of this embodiment, by performing Step 3B of supplying the $NH_3$ gas to the wafer 200 in the process chamber 201 after performing Steps 1B and 2B to form the second layer on the wafer 200, it is possible to control a composition ratio of the SiBCN layer or the SiBN layer and hence a composition ratio of the SiBCN film or the SiBN film more precisely.

In addition, in Step 3B according to the film forming sequence of this embodiment, when the second layer reacts with the thermally-activated $NH_3$ gas or the active species obtained by exciting the $NH_3$ gas with plasma, impurities such as Cl can be more separated or extracted from the second layer to have a low impurity concentration, which allows the third layer to have less content of impurities. Accordingly, it is possible to reduce an impurity concentration in the SiBCN film or the SiBN film formed by performing a cycle including Steps 1B to 3B a predetermined number of times, and further improve the HF resistance of the SiBCN film or the SiBN film.

In addition, in Step 2B according to the film forming sequence of this embodiment, when the first layer including Cl (a silicon-containing layer including Cl) is modified by supplying an alkylborazine compound such as TMB or the like to the first layer, thereby forming the second layer (SiBCN layer), since the borazine ring skeleton constituting the borazine ring included in the borazine compound is maintained without being broken, the central space of the borazine ring can be maintained, thereby forming a porous second SiBCN layer. In addition, when the second layer is modified to form the third layer (SiBCN layer or SiBN layer), since the borazine ring skeleton constituting the borazine ring included in the second layer is maintained without being broken, the central space of the borazine ring can be maintained, thereby forming a porous third layer. Accordingly, it is possible to make the SiBCN film or the SiBN film, which is formed by performing a cycle including Steps 1B to 3B a predetermined number of times, porous and further decrease a dielectric constant of the SiBCN film or the SiBN film. Thus, it is possible to form a very low dielectric constant (low-k) film having a porous structure.

In addition, in Step 2B according to the film forming sequence of this embodiment, when the first layer including Cl (a silicon-containing layer including Cl) is modified by supplying an alkylborazine compound such as TMB or the like to the first layer, thereby forming the second layer (SiBCN layer), the central space of the borazine ring can be dismantled, for example, by increasing the wafer temperature or the internal pressure of the process chamber over the above-mentioned process conditions to break at least a portion of the borazine ring skeleton constituting the borazine ring included in the borazine compound without being maintained. This can change a state (density) of the borazine ring skeleton in the second layer, and in turn, a porous state (density) of the second layer. In addition, when the second layer is modified to form the third layer (SiBCN layer or SiBN layer), the central space of the borazine ring can be dismantled, for example, by increasing the wafer temperature or the process chamber internal pressure over the above-mentioned process conditions to break at least a portion of the borazine ring skeleton constituting the borazine ring included in the borazine compound without being maintained. This can change a state (density) of the borazine ring skeleton in the third layer, and in turn, a porous state (density) of the third layer. Accordingly, it is possible to change the state (density) of the borazine ring skeleton in the SiBCN film or SiBN film formed by performing a predetermined number of times the cycle including Steps 1B to 3B, and in turn, a porous state (density) of the SiBCN film, and finely adjust a dielectric constant of the SiBCN film or SiBN film.

In this manner, according to the film forming sequence of this embodiment, by changing the state of the borazine ring skeleton in the SiBCN film or SiBN film, that is, by either maintaining the borazine ring skeleton or breaking at least a portion of the borazine ring skeleton, it is possible to control the dielectric constant of the SiBCN film or SiBN film. In addition, by changing the state of the borazine ring skeleton in the film, it is possible to control a film stress.

Modification

Although it is described in the above film forming sequence shown in FIGS. 6 to 9 that the SiBCN film or the SiBN film is formed on the wafer 200 by using the TMB gas including an organic borazine compound as the reaction gas including the borazine compound, this embodiment is not limited thereto. For example, the TMB gas including an inorganic borazine compound may be used as the reaction gas including the borazine compound. By using a gas including an inorganic borazine compound, i.e., a borazine compound gas including no carbon (C), as the reaction gas, when the first layer is modified in Step 2B, no carbon (C) component can be introduced into the first layer and the first layer can changed (modified) into the second layer having a borazine ring skeleton and including silicon (Si), boron (B), and nitrogen (Ni), i.e., a silicon boronitride (SiBN) layer including a borazine ring skeleton. In this case, the second layer modified in Step 3B, i.e., the third layer, becomes a silicon boronitride (SiBN) layer having an increased nitrogen component and a decreased silicon component, so that a SiBN film including a borazine ring skeleton is formed on the wafer 200, instead of a SiBCN film including a borazine ring skeleton. The SiBN layer, which is formed according to this case, having a borazine ring skeleton may also referred to as a layer having silicon (Si), nitrogen (N), and a borazine ring skeleton. Further, the SiBN film, which is formed according to this case, having a borazine ring skeleton may also referred to as a thin film having silicon (Si), nitrogen (N), and a borazine ring skeleton.

Third Embodiment of the Present Disclosure

Hereinafter, a third embodiment will be described later.

Although it is described in the first embodiment that a thin film having a borazine ring skeleton and including a certain element, boron, carbon, and nitrogen (e.g., SiBCN film) is formed on the substrate by performing a cycle including Steps 1A and 2A a predetermined number of times, the third embodiment shows an example where a thin film having a borazine ring skeleton and including a certain element, boron, carbon, and nitrogen (e.g., SiBCN film) is formed on the substrate by performing a cycle a predetermined number of times. The cycle further includes Step 2C for supplying a carbon-containing gas (e.g., $C_3H_6$ gas) to the substrate between Steps 1C and 3C that perform the same operations as those of the above-described Steps 1A and 2A.

In the film forming sequence of this embodiment, a film having a borazine ring skeleton and including a predetermined element, boron, carbon, and nitrogen is formed on a substrate by performing a cycle a predetermined number of times. The cycle includes a process of supplying a source gas including a predetermined element and a halogen group to the substrate, a process of supplying a carbon-containing gas to the substrate, and a process of supplying a reaction gas including a borazine compound to the substrate under a condition where the borazine ring skeleton in the borazine compound is maintained.

Specifically, a film having a borazine ring skeleton and including a predetermined element, boron, carbon, and nitrogen is formed on a substrate by performing a cycle a predetermined number of times. The cycle includes a process of forming a first layer including a predetermined element and a halogen group on the substrate by supplying a source gas including the predetermined element and the halogen group to the substrate, a process of forming a carbon-containing layer on the first layer by supplying a carbon-containing gas to the substrate, and a process of supplying a reaction gas including a borazine compound to the substrate and forming a second layer having a borazine ring skeleton and including a predetermined element, boron, carbon, and nitrogen on the substrate by modifying the carbon-containing layer through reaction of the carbon-containing layer with the borazine compound under a condition where the borazine ring skeleton in the borazine compound is maintained.

The process of supplying the source gas and the process of supplying the reaction gas are performed in the same manner as those in the first embodiment. That is, the process of forming the first layer and the process of forming the second layer are performed in the same manner as those in the first embodiment. In addition, the process of supplying the carbon-containing gas is performed between the process of supplying the source gas and the process of supplying the reaction gas including the borazine compound. That is, the process of supplying the carbon-containing gas is performed before the process of supplying the reaction gas including the borazine compound after the process of supplying the source gas. In other words, the process of supplying the reaction gas including the borazine compound is performed after forming the carbon-containing layer on the first layer.

Figure 10:
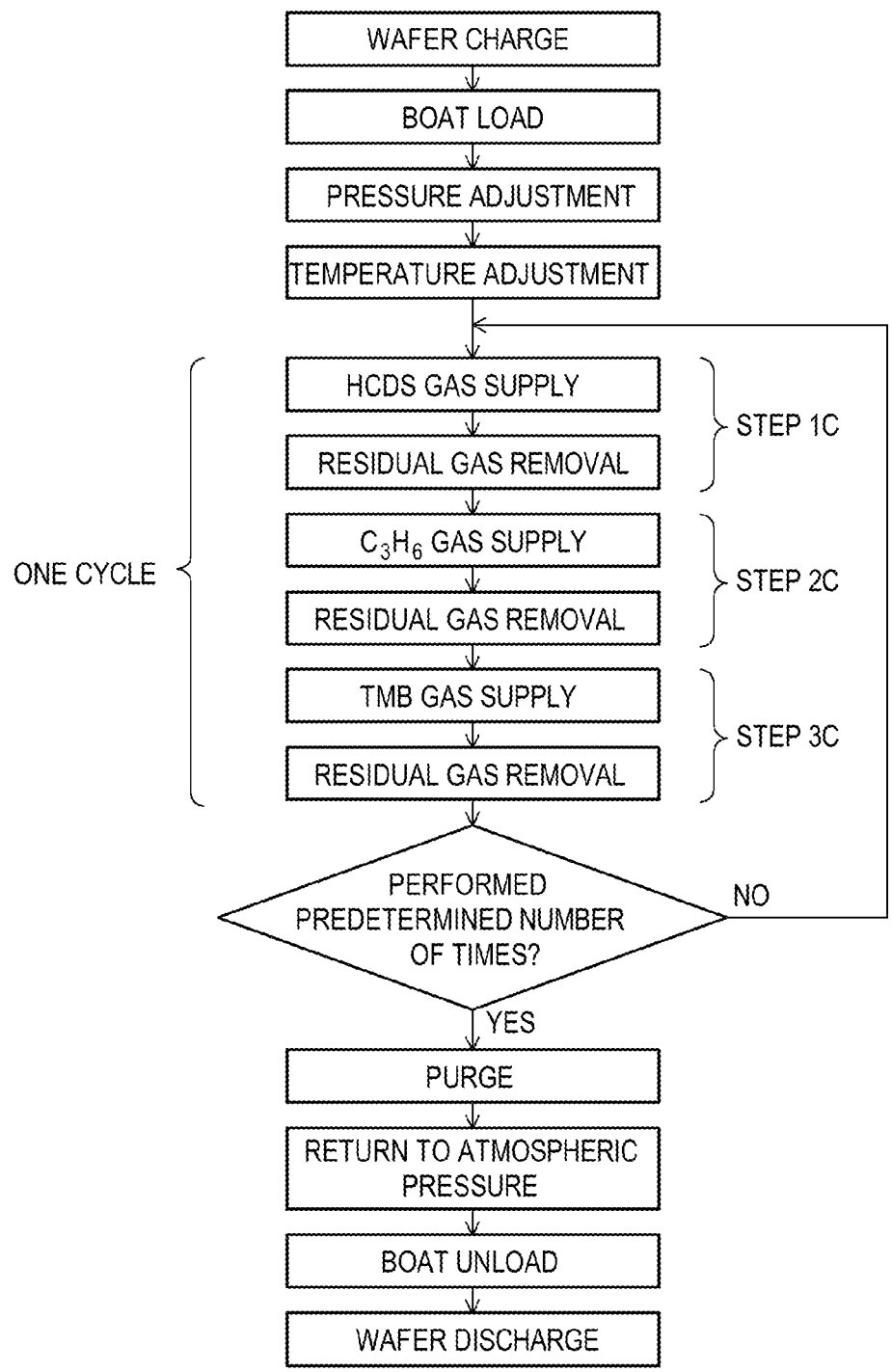
FIG. 10 illustrates a flowchart for forming a film in a first sequence, according to a third embodiment of the present disclosure.

A film forming sequence of this embodiment will be now described. FIG. 10 illustrates a flowchart for forming a film in the film forming sequence according to the third embodiment. FIG. 11 illustrates a timing diagram for supplying a plurality of gases in the film forming sequence of the third embodiment.

In the film forming sequence of this embodiment, a silicon borocarbonitride (SiBCN) film having a borazine ring skeleton is formed as a film having a borazine ring skeleton and including silicon, boron, carbon, and nitrogen on the wafer 200 by performing a cycle a predetermined number of times. The cycle includes a process of supplying a chlorosilane-based source gas including silicon and a chloro group to the wafer 200 in the process chamber 201 and forming a silicon (Si)-containing layer including chlorine (Cl) as a first layer including silicon and a chloro group (chlorine) on the wafer 200, and a process of forming a carbon-containing layer on the first layer by supplying a carbon-containing gas to the wafer 200 in the process chamber 201. Further, the cycle includes a process of supplying a reaction gas including a borazine compound to the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the carbon-containing layer through reaction of the carbon-containing layer with the borazine compound under a condition where the borazine ring skeleton in the borazine compound is maintained.

The film forming sequence of this embodiment has the same configurations as the film forming sequence of the first embodiment except that Step 2C is performed between Steps 1C and 3C performing the same operations as Steps 1A and 2A and the carbon-containing layer is modified through reaction of the carbon-containing layer with the borazine compound in Step 3C. Hereinafter, Steps 2C and 3C in this embodiment will be described. An example of using $C_3H_6$ gas as the carbon-containing gas in Step 2C will be described later.

[Step 2C]

($C_3H_6$ Gas Supply)

After Step 1C is terminated to remove the residual gas from the process chamber 201, the valve 243d of the fourth gas supply pipe 232d is opened to flow $C_3H_6$ gas into the fourth gas supply pipe 232d. A flow rate of the $C_3H_6$ gas flowing into the fourth gas supply pipe 232d is adjusted by the mass flow controller 241d. The flow rate-adjusted $C_3H_6$ gas is supplied from the gas supply holes 250d of the fourth nozzle 249d into the process chamber 201. The $C_3H_6$ gas supplied into the process chamber 201 is activated by heat and is exhausted from the exhaust pipe 231. As such, the $C_3H_6$ gas activated by heat is supplied to the wafer 200.

At the same time, the valve 243i is opened to flow $N_2$ gas into the fourth inert gas supply pipe 232i. The $N_2$ gas flown into the fourth inert gas supply pipe 232i is supplied into the process chamber 201 together with the $C_3H_6$ gas, and is exhausted from the exhaust pipe 231. In this case, in order to prevent infiltration of the $C_3H_6$ gas into the first nozzle 249a, the second nozzle 249b, the third nozzle 249c, and the buffer chamber 237, the valves 243f, 243g and 243h are opened to flow $N_2$ gas into the first inert gas supply pipe 232f, the second inert gas supply pipe 232g, and the third inert gas supply pipe 232h. The $N_2$ gas is supplied into the process chamber 201 through the first gas supply pipe 232a, the second gas supply pipe 232b, the third gas supply pipe 232c, the first nozzle 249a, the second nozzle 249b, and the third nozzle 249c and is exhausted from the exhaust pipe 231.

In this case, the APC valve 244 is appropriately adjusted to set the internal pressure of the process chamber 201 to fall, for example, within a range of 1 to 6,000 Pa. A flow rate of the $C_3H_6$ gas controlled by the mass flow controller 241d is set to fall, for example, within a range of 100 to 10,000 sccm. A flow rate of the $N_2$ gas controlled by each of the mass flow controllers 241h, 241f, 241g, and 241i is set to fall, for example, within a range of 100 to 10,000 sccm. In this case, a partial pressure of the $C_3H_6$ gas in the process chamber 201 is set to fall, for example, within a range of 0.01 to 5,941 Pa. A time of supplying the $C_3H_6$ gas to the wafer 200, i.e., a gas supply time (irradiation time), is set to fall, for example, within a range of 1 to 200 seconds, more preferably, for example, within a range of 1 to 120 seconds, or further more preferably, for example, within a range of 1 to 60 seconds. In this case, similar to Step 1C, the heater 207 is set to a temperature such that the temperature of the wafer 200 is set to fall, for example, within a range of 250 to 700 degrees C., more preferably, for example, within a range of 300 to 650 degrees C., or further more preferably, for example, within a range of 350 to 600 degrees C. In addition, if the $C_3H_6$ gas is activated by heat and supplied, relatively soft reaction can be caused, thereby making it possible to easily form the carbon-containing layer, which will be described later.

At this time, a gas flown into the process chamber 201 is the thermally-activated $C_3H_6$ gas, rather than HCDS gas. Therefore, the thermally-activated $C_3H_6$ gas is supplied to the wafer 200 without causing any gaseous reaction. In this case, a carbon-containing layer having a thickness of less than one atomic layer, i.e., a discontinuous carbon-containing layer, is formed on the silicon-containing layer including Cl that is formed as the first layer on the wafer 200 in Step 1C. Accordingly, a layer including silicon, chlorine, and carbon, i.e., a layer where a carbon-containing layer is formed on a silicon-containing layer including chlorine (hereinafter, referred to as a first layer where a carbon-containing layer is formed). In addition, depending on conditions, the silicon-containing layer including Cl is often modified (carbonized) by reaction of a portion of the silicon-containing layer including Cl with the $C_3H_6$ gas so that a silicon carbide layer including Cl (i.e., SiC layer including Cl) as a layer including silicon, chlorine, and carbon.

The carbon-containing layer formed on the first layer (the silicon-containing layer including Cl) may be a carbon layer (C layer) or a chemical adsorption layer of the carbon-containing gas ($C_3H_6$ gas), i.e., a chemical adsorption layer of a material ($C_xH_y$) into which $C_3H_6$ is disassembled. Here, the carbon layer needs to be a discontinuous layer including carbon. In addition, the chemical adsorption layer of $C_xH_y$ needs to be a discontinuous chemical adsorption layer of $C_xH_y$ molecules. Further, if the carbon-containing layer formed on the first layer is a continuous layer, for example, if a continuous chemical adsorption layer of $C_xH_y$ is formed on the first layer under a condition where an adsorption state of $C_xH_y$ on the first layer is saturated, the entire surface of the first layer is covered with the continuous chemical adsorption layer of $C_xH_y$. In this case, no Si and no Cl exists on the surface of the first layer on which the carbon-containing layer, which may result in difficulty in modification in Step 3C, which will be described later, of the first layer on which the carbon-containing layer is formed. This is because the reaction gas including a borazine compound is hard to be bonded to carbon under the above-described process conditions, although the reaction gas can be bonded to Si and Cl. In order to achieve desired modification in Step 3C, which will be described later, there is a need to expose Si and Cl in the surface of the first layer on which the carbon-containing layer is formed, under a condition where an adsorption state of $C_xH_y$ on the silicon-containing layer including Cl is unsaturated.

In order to make an adsorption state of $C_xH_y$ on the silicon-containing layer including Cl unsaturated, although the above-described process conditions may be employed as process conditions in Step 2C. However, if the below process conditions are employed for Step 2C, it is easy to make an adsorption state of $C_xH_y$ on the silicon-containing layer including Cl unsaturated.

Wafer Temperature: 500 to 650 degrees C.
Internal Pressure of Process Chamber: 133 to 5,332 Pa
Partial Pressure of $C_3H_6$ Gas: 33 to 5,177 Pa
Supply Flow Rate of $C_3H_6$ Gas: 1,000 to 10,000 sccm
Supply Flow Rate of $N_2$ Gas: 300 to 3,000 sccm
Supply Time of $C_3H_6$ Gas: 6 to 200 seconds
(Residual Gas Removal)

After the carbon-containing layer is formed on the first layer (i.e., the silicon-containing layer including Cl), the valve 243d of the fourth gas supply pipe 232d is closed to stop the supply of the $C_3H_6$ gas. At this time, while the APC valve 244 of the exhaust pipe 231 is in an open state, the interior of the process chamber 201 is vacuum-exhausted by the vacuum pump 246 to remove the $C_3H_6$ gas remaining in the process chamber 201, which has not reacted or which remains after contributing to the formation of the carbon-containing layer, and reaction byproducts from the process chamber 201. In this case, the valves 243h, 243f, 243g, and 243i are in an open state, and the supply of the $N_2$ gas as inert gas into the process chamber 201 is maintained. The $N_2$ gas acts as a purge gas which is capable of improving the effect of removing the $C_3H_6$ gas remaining in the process chamber 201, which has not reacted or which remains after contributing to the formation of the carbon-containing layer, and the reaction byproducts from the process chamber 201.

Further, the residual gas in the process chamber 201 may not be completely removed and the interior of the process chamber 201 may not be completely purged. When the residual gas in the process chamber 201 is very small in amount, there is no adverse effect caused in Step 3C performed thereafter. Here, an amount of the $N_2$ gas supplied into the process chamber 201 need not be a large amount, and for example, approximately the same amount of the $N_2$ gas as a volume of the reaction tube 203 (the process chamber 201) may be supplied to perform the purge such that there is no adverse effect caused in Step 3C. As described above, as the interior of the process chamber 201 is not completely purged, the purge time can be reduced, thereby improving the throughput. In addition, the consumption of the $N_2$ gas can also be suppressed to a minimal necessity.

Examples of the carbon-containing gas may include hydrocarbon-based gas such as acetylene ($C_2H_2$) gas, ethylene ($C_2H_4$) gas, and the like, in addition to the propylene ($C_3H_6$) gas. The carbon-containing gas acts as a carbon source. The use of hydrocarbon-based gas as the carbon-containing gas makes it easy to control a ratio of the carbon component in the SiCBN film to increase.

[Step 3C]
(TMB Gas Supply)

After Step 2C is terminated and the residual gas the process chamber 201 is removed, Step 3C of supplying TMB gas to the wafer 200 in the process chamber 201 is performed. Step 3C is performed in the same manner as Step 2A of the first embodiment.

Under the same processes and conditions as Step 2A, when the TMB gas is supplied to the wafer 200, the first layer with the carbon-containing layer, which is formed on the wafer 200 in Step 2C reacts with the TMB gas. As such, Cl (chloro group) existing on an exposed surface of the first layer with the carbon-containing layer can react with a ligand (methyl group) included in the TMB. Accordingly, Cl of the first layer with the carbon-containing layer reacts with the ligand of the TMB so that it is separated from the first layer with the carbon-containing layer, while the ligand of the TMB reacts with Cl of the first layer with the carbon-containing layer so that it is separated from the TMB. Then, the TMB from which the ligand is separated can be bonded to Si of the first layer with the carbon-containing layer. Specifically, a portion of a borazine ring of the TMB from which the ligand is separated can be bonded to Si existing on the exposed surface of the first layer with the carbon-containing layer. More specifically, nitrogen constituting the borazine ring of the TMB from which the ligand is separated can be bonded to Si existing on the exposed surface of the first layer with the carbon-containing layer. Thus, N subjected to having a dangling bond due to separation of the methyl ligand, among B and N constituting the borazine ring of the TMB, can be bonded to Si subjected to having a dangling bond or having had a dangling bond that is included in the first layer with the carbon-containing layer), thereby enabling formation Si—N bonding. Here, the borazine ring skeleton constituting the borazine ring of the TMB is maintained without being broken.

As the TMB gas is supplied under the above-described conditions, the first layer with the carbon-containing layer can appropriately react with the TMB while the borazine ring skeleton in the TMB is maintained without being broken, and thus, it is possible to cause a series of the above-described reactions. In addition, the most important factors (conditions) for causing the series of above-described reactions in a state where the TMB borazine ring skeleton is maintained are the temperature of the wafers 200 and the internal pressure of the process chamber 201, particularly, the temperature of the wafers 200. Thus, it is possible to cause suitable reactions by appropriately controlling the factors.

Through the above series of reactions, the borazine ring is newly introduced into the first layer with the carbon-containing layer, and the first layer with the carbon-containing layer is changed (modified) into a second layer with a borazine ring skeleton including Si, B, C, and N, i.e., the silicon borocarbonitride layer (SiBCN layer) having a borazine ring skeleton. The second layer becomes a SiBCN layer having a borazine ring skeleton with a thickness of, for example, less than one atomic layer to several atomic layers. The SiBCN layer including a borazine ring skeleton may be referred to as a layer including Si, C, and a borazine ring skeleton.

When the borazine ring is newly introduced into the first layer with the carbon-containing layer, a boron (B) component constituting the borazine ring is newly introduced into the first layer with the carbon-containing layer. Further, a nitrogen (N) component constituting the borazine ring is also introduced into the first layer with the carbon-containing layer. Furthermore, a carbon (C) component included in the ligand of the TMB may be introduced into the first layer with the carbon-containing layer. As such, when the borazine ring is introduced into the first layer with the carbon-containing layer by causing the first layer with the carbon-containing layer to react with the TMB, the B component and the N component are newly added to the first layer with the carbon-containing layer. Further, in some cases, a ratio of the C component in the first layer with the carbon-containing layer may be increased. As such, as the borazine ring is introduced into the first layer with the carbon-containing layer by causing the first layer with the carbon-containing layer to react with the TMB, the B component and the N component can be newly added to the first layer with the carbon-containing layer, while a ratio of the C component in the second layer can be increased over a ratio of the C component in the first layer with the carbon-containing layer.

In addition, when the borazine ring is newly introduced into the first layer with the carbon-containing layer, C originally included in the first layer with the carbon-containing layer may be maintained or a portion thereof may be extracted. In other words, when the first layer with the carbon-containing layer reacts with the TMB, a ratio of the C component originally included in the first layer with the carbon-containing layer may be maintained or decreased. As such, by including the borazine ring into the first layer with the carbon-containing layer by causing the first layer with the carbon-containing layer to react with the TMB, a ratio of the C component in the second layer can become higher or lower than a ratio of the C component in the first layer with the carbon-containing layer. Adjusting the ratios of the C components may depend on process conditions such as the internal pressure of the process chamber 201 and so on.

Further, when the first layer with the carbon-containing layer reacts with the TMB, impurities such as Cl in the first layer with the carbon-containing layer are extracted or desorbed from the first layer with the carbon-containing layer by the above-described reactions, thereby being separated from the first layer with the carbon-containing layer. Accordingly, the second layer becomes to have fewer impurities such as Cl when compared with the first layer with the carbon-containing layer.

Furthermore, when the first layer with the carbon-containing layer is modified to form the second layer having a borazine ring skeleton and including Si, B, C, and N (SiBCN layer having a borazine ring skeleton) by causing the first layer with the carbon-containing layer to react with an alkylborazine compound such as TMB, the borazine ring skeleton constituting the borazine ring included in the borazine compound (TMB) is maintained without being broken, whereby the central space of the borazine ring can be maintained and thus the SiBCN layer that is porous can be formed.

(Residual Gas Removal)

Thereafter, under the same processes and conditions as Step 2A of the first embodiment, the TMB gas remaining in the process chamber 201, which has not reacted or which remains after contributing to the reaction, and reaction byproducts are removed from the process chamber 201 (residual gas removal). In this case, similar to Step 2A of the first embodiment, the residual gas in the process chamber 201 may not be completely removed and the interior of the process chamber 201 may not be completely purged.

(Performing Predetermined Number of Times)

When one cycle including the above-described Steps 1C to 3C is performed one or more times (i.e., a predetermined number of times), it is possible to form a silicon borocarbonitride (SiBCN) film having a borazine ring skeleton and including a predetermined composition with a predetermined film thickness, i.e., a thin film having a borazine ring skeleton and including Si, B, C, and N, on the wafer 200. Also, the above-described cycle may be performed multiple times. That is, it is possible that a thickness of the SiBCN layer having a borazine ring skeleton formed per one cycle is set to be smaller than a desired thickness, and the above-described cycle is repeated multiple times until the film of a desired thickness is obtained. In this case, the SiBCN film having the formed borazine ring skeleton may be referred to as a thin film including Si, C, and a borazine ring skeleton.

(Effects According to the Embodiment)

The film forming sequence of this embodiment has the same advantages as those of the first embodiment. That is to say, it is possible to form a SiBCN film or a SiBN film having high resistance to hydrogen fluoride (HF) and a small dielectric constant in a low temperature range with a high productivity, when compared with a conventional SiCN film, SiOCN film, and the like. Thus, it is possible to form a thin film which realizes increased resistance of HF and a decreased dielectric constant, which may be in a trade-off relationship, in a low temperature range.

In addition, according to the film forming sequence of this embodiment, by performing Step 2C of supplying the $C_3H_6$ gas to the wafer 200 in the process chamber 201 after performing Step 1C of forming the first layer including Cl on the wafer 200, it is possible to increase a ratio of the carbon component in the second layer (e.g., SiBCN layer) formed in Step 3C. That is, the second layer becomes a SiBCN layer with an increased (adjusted) carbon component and accordingly, a SiBCN film with the increased (adjusted) carbon component is formed on the wafer 200. The film forming sequence of this embodiment easily controls of a ratio of the carbon component in the SiCBN film to increase.

Fourth Embodiment of the Present Disclosure

Hereinafter, a fourth embodiment will be described later.

Although it is described in the first embodiment that a thin film having a borazine ring skeleton and including a certain element, boron, carbon, and nitrogen (e.g., SiBCN film) is formed on the substrate by performing a cycle a predetermined number of times. The cycle includes Steps 1A and 2A, the fourth embodiment shows an example where a thin film having a borazine ring skeleton and including a certain element, boron, carbon, and nitrogen (e.g., SiBCN film) by performing a predetermined number of times a cycle further including Step 3D of supplying a nitrogen and carbon-containing gas (e.g., TEA gas) to the substrate, in addition to Steps 1D and 2D that perform the same operations as those of the above-described Steps 1A and 2A.

In the film forming sequence of this embodiment, a film having a borazine ring skeleton and including a predetermined element, boron, carbon, and nitrogen is formed on a substrate by performing a cycle a predetermined number of times. The cycle includes a process of supplying a source gas including a predetermined element and a halogen group to the substrate, a process of supplying a reaction gas including a borazine compound to the substrate, and a process of supplying a gas including nitrogen and carbon to the substrate under a condition where the borazine ring skeleton in the borazine compound is maintained.

Specifically, a film having a borazine ring skeleton and including a predetermined element, boron, carbon, and nitrogen is formed on a substrate by performing a cycle a predetermined number of times. The cycle includes a process of forming a first layer including a predetermined element and a halogen group on the substrate by supplying a source gas including the certain element and the halogen group to the substrate, and a process of supplying a reaction gas including a borazine compound to the substrate and forming a second layer having a borazine ring skeleton and including a predetermined element, boron, carbon, and nitrogen on the substrate by modifying the first layer through reaction of the first layer with the borazine compound under a condition where the borazine ring skeleton in the borazine compound is maintained. The cycle further includes a process of supplying a nitrogen and carbon-containing gas to the substrate and forming a third layer having a borazine ring skeleton and including a predetermined element, boron, carbon, and nitrogen on the substrate by modifying the second layer through reaction of the second layer with the gas including nitrogen and carbon to adjust a nitrogen component and a carbon component of the second layer under a condition where the borazine ring skeleton in the second layer is maintained.

(First Sequence)

Figure 13A:
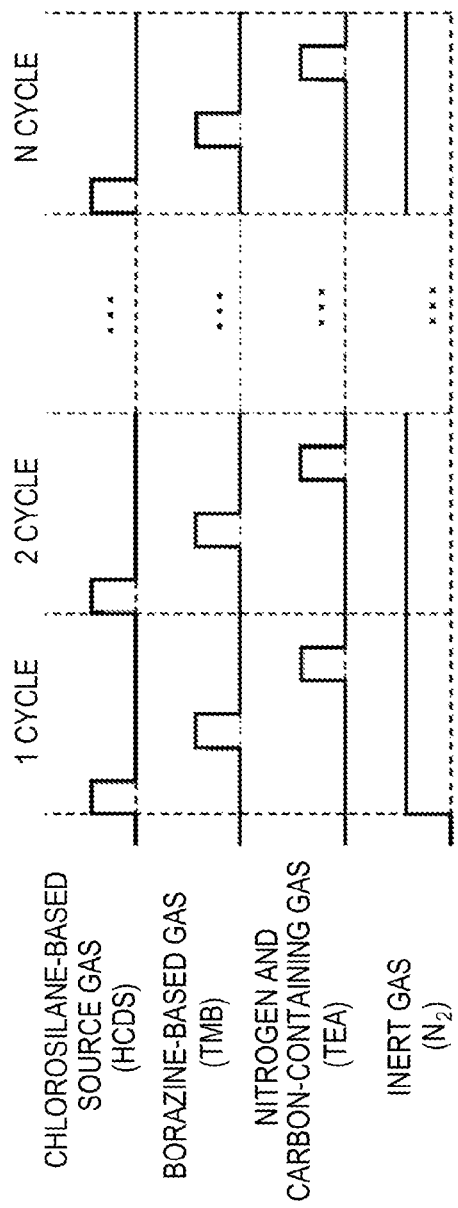
FIG. 13A illustrates a timing diagram for supplying a plurality of gases in the first sequence according to the fourth embodiment of the present disclosure.

A first sequence of this embodiment will be described. FIG. 12 illustrates a flowchart forming a film in the first sequence according to the fourth embodiment. FIG. 13A illustrates a timing diagram for supplying a plurality of gases in the first sequence according to the fourth embodiment.

In the first sequence of this embodiment, a silicon borocarbonitride (SiBCN) film including a borazine ring skeleton is formed as a thin film having a borazine ring skeleton and including silicon, boron, carbon, and nitrogen on the wafer 200 by performing a cycle a predetermined number of times. The cycle includes a process of supplying a chlorosilane-based source gas including silicon and a chloro group to the wafer 200 in the process chamber 201 and forming a silicon (Si)-containing layer including chlorine (Cl) as a first layer including silicon and a chloro group (chlorine) on the wafer 200, and a process of supplying a reaction gas including a borazine compound to the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the first layer through reaction of the first layer with the borazine compound under a condition where the borazine ring skeleton in the borazine compound is maintained. The cycle further includes a process of supplying a nitrogen and carbon gas to the wafer 200 in the process chamber 201 and forming a silicon borocarbonitride (SiBCN) layer having a borazine ring skeleton as a third layer having a borazine ring skeleton and including silicon, boron, carbon, and nitrogen on the wafer 200 by modifying the second layer through reaction of the second layer with the gas including nitrogen and carbon to adjust a nitrogen component and a carbon component of the second layer under a condition where the borazine ring skeleton in the second layer is maintained.

The first sequence in this embodiment has the same configurations as the film forming sequence of the first embodiment except that the former further includes Step 3D in addition to Steps 1D and 2D performing the same operations as Steps 1A and 2A. Hereinafter, Step 3D of this embodiment will be described. An example of using TEA gas (amine-based gas) as a gas including nitrogen and carbon in Step 3D will be described later.

[Step 3D]

(TEA Gas Supply)

After Step 2D is terminated and the residual gas in the process chamber 201 is removed, the valve 243e of the fifth gas supply pipe 232e is opened to flow the TEA gas into the fifth gas supply pipe 232e. A flow rate of the TEA gas flowing in the fifth gas supply pipe 232e is adjusted by the mass flow controller 241e. The flow rate-adjusted TEA gas flows in the fourth gas supply pipe 232d and is supplied from the gas supply holes 250d of the fourth nozzle 249d into the process chamber 201. The TEA gas supplied into the process chamber 201 is activated by heat and is exhausted from the exhaust pipe 231. As such, the TEA gas activated by heat is supplied to the wafer 200.

At the same time, the valve 243i is opened to flow N$_2$ gas into the fourth inert gas supply pipe 232i. The N$_2$ gas flown into the fourth inert gas supply pipe 232i is supplied into the process chamber 201 together with the TEA gas, and is exhausted from the exhaust pipe 231. In this case, in order to prevent infiltration of the TEA gas into the first nozzle 249a, the second nozzle 249b, the third nozzle 249c, and the buffer chamber 237, the valves 243f, 243g, and 243h are opened to flow N$_2$ gas into the first inert gas supply pipe 232f, the second inert gas supply pipe 232g, and the third inert gas supply pipe 232h. The N$_2$ gas is supplied into the process chamber 201 via the first gas supply pipe 232a, the second gas supply pipe 232b, the third gas supply pipe 232c, the first nozzle 249a, the second nozzle 249b and the third nozzle 249c, and is exhausted from the exhaust pipe 231.

In this case, the APC valve 244 is appropriately adjusted to set the internal pressure of the process chamber 201 to fall, for example, within a range of 1 to 6,000 Pa. A flow rate of the TEA gas controlled by the mass flow controller 241e is set to fall, for example, within a range of 100 to 10,000 sccm. A flow rate of the N$_2$ gas controlled by each of the mass flow controllers 241i, 241f, 241g, and 241h is set to fall, for example, within a range of 100 to 10,000 sccm. In this case, a partial pressure of the TEA gas in the process chamber 201 is set to fall, for example, within a range of 0.01 to 5,941 Pa. A time of supplying the TEA gas to the wafer 200, i.e., a gas supply time (irradiation time), is set to fall, for example, within a range of 1 to 200 seconds, more preferably, for example, within a range of 1 to 120 seconds, or further more preferably, for example, within a range of 1 to 60 seconds. In this case, similar to Step 1D, the heater 207 is set to a temperature such that the temperature of the wafer 200 is set to fall, for example, within a range of 250 to 700 degrees C., more preferably, for example, within a range of 300 to 650 degrees C., or further more preferably, for example, within a range of 350 to 600 degrees C.

At this time, a gas flown into the process chamber 201 is the thermally-activated TEA gas, rather than HCDS gas and TMB gas. Therefore, the thermally-activated TEA gas reacts with at least a portion of the second layer (having a borazine ring skeleton and including Si, B, C, and N) formed on the wafer 200 in Step 2D, without causing any gaseous reaction. Accordingly, the second layer is modified into a third layer (SiBCN layer) having a borazine ring skeleton and including Si, B, C, and N. The third layer becomes a SiBCN layer including a borazine ring skeleton and having a thickness of less than one atomic layer to several atomic layers. In this case, the formed SiBCN layer including a borazine ring skeleton may be referred to as a layer including Si, C, N, and a borazine ring skeleton.

In the process of forming the third layer, the second layer is modified by reaction of the second layer with the TEA gas under the conditions where the borazine ring skeleton in the second layer is maintained. In this case, when nitrogen and carbon included in the TEA gas are added to the second layer, a nitrogen component and a carbon component of the modified second layer, i.e., the third layer, are increased. Further, the borazine ring skeleton constituting the borazine ring included in the second layer is maintained without being broken. In addition, when the thermally-activated TEA gas is flown into the process chamber 201, separating (extracting) of the carbon component from the second layer can be mitigated and a ratio of the carbon component in the third layer can be easily controlled in to increase.

When the TEA gas is supplied under the above conditions, the second layer can properly react with the TEA gas while maintaining the borazine ring skeleton of the second layer without being broken, thereby causing the above-described reaction. In addition, it is believed that the most important factors (conditions) for this reaction, with the second layer borazine ring skeleton maintained, are the temperature of the wafer 200 and the internal pressure of the process chamber 201, particularly, the temperature of the wafer 200. Thus, it is possible to cause suitable reactions by appropriately controlling the factors.

At this time, the modification reaction of the second layer may not be saturated. For example, in Steps 1D and 2D, when the second layer having a thickness of less than one atom layer to several atomic layers is formed, the second layer may be partially modified. In this case, the modification is performed in such a manner that the modification reaction of the second layer is unsaturated in order to prevent the entire second layer having the thickness of less than one atom layer to several atomic layers from being modified.

Although the unsaturation of the modification reaction of the second layer may be achieved under the above-mentioned process conditions employed in Step 3D, it can be more easily achieved by changing the above-mentioned process conditions of Step 3D to the following process conditions.

Wafer Temperature: 500 to 650 degrees C.
Internal Pressure of Process Chamber: 133 to 5,332 Pa
Partial Pressure of TEA Gas: 33 to 5,177 Pa
Supply Flow Rate of TEA Gas: 1,000 to 10,000 sccm
Supply Flow Rate of $N_2$ Gas: 300 to 3,000 sccm
Supply Time of TEA Gas: 6 to 200 seconds (Residual Gas Removal)

Thereafter, the valve 243e of the fifth gas supply pipe 232e is closed to stop the supply of the TEA gas. At this time, while the APC valve 244 of the exhaust pipe 231 is in an open state, the interior of the process chamber 201 is vacuum-exhausted by the vacuum pump 246 to remove the TEA gas remaining in the process chamber 201, which has not been reacted or which remains after contributing to the formation of the third layer, and reaction byproducts from the process chamber 201 (residual gas removal). In this case, the valves 243i, 243f, 243g, and 243h are in an open state, and the supply of the $N_2$ gas as inert gas into the process chamber 201 is maintained. The $N_2$ gas acts as purge gas which is capable of improving the effect of removing the TEA gas remaining in the process chamber 201, which has not reacted or which remains after contributing to the formation of the third layer, and the reaction byproducts from the process chamber 201.

Further, the residual gas in the process chamber 201 may not be completely removed and the interior of the process chamber 201 may not be completely purged. When the residual gas in the process chamber 201 is very small in amount, there is no adverse effect caused in Step 1D performed thereafter. Here, an amount of the $N_2$ gas supplied into the process chamber 201 need not be a large amount, and for example, approximately the same amount of the $N_2$ gas as a volume of the reaction tube 203 (the process chamber 201) may be supplied to perform the purge such that there is no adverse effect caused in Step 1D. As described above, as the interior of the process chamber 201 is not completely purged, the purge time can be reduced, thereby improving the throughput. In addition, the consumption of the $N_2$ gas can also be suppressed to a minimal necessity.

Examples of the amine-based gas may preferably include ethylamine-based gas obtained by vaporizing triethylamine $((C_2H_5)_3N$, abbreviated to TEA) gas, diethylamine $((C_2H_5)_2NH$, abbreviated to DEA) gas, monoethylamine $(C_2H_5NH_2$, abbreviated to MEA) gas or the like, methylamine-based gas obtained by vaporizing trimethylamine $((CH_3)_3N$, abbreviated to TMA) gas, dimethylamine $((CH_3)_2NH$, abbreviated to DMA) gas, monomethylamine $(CH_3NH_2$, abbreviated to MMA) gas or the like, propylamine-based gas obtained by vaporizing tripropylamine $((C_3H_7)_3N$, abbreviated to TPA) gas, dipropylamine $((C_3H_7)_2NH$, abbreviated to DPA) gas, monopropylamine $(C_3H_7NH_2$, abbreviated to MPA) gas or the like, isopropylamine-based gas obtained by vaporizing triisopropylamine $([(CH_3)_2CH]_3N$, abbreviated to TIPA) gas, diisopropylamine $([(CH_3)_2CH]_2NH$, abbreviated to DIPA) gas, monoisopropylamine $((CH_3)_2CHNH_2$, abbreviated to MIPA) gas or the like, butylamine-based gas obtained by vaporizing tributylamine $((C_4H_9)_3N$, abbreviated to TBA) gas, dibutylamine $((C_4H_9)_2NH$, abbreviated to DBA) gas, monobutylamine $(C_4H_9NH_2$, abbreviated to MBA) gas or the like, or isobutylamine-based gas obtained by vaporizing triisobutylamine $([(CH_3)_2CHCH_2]_3N$, abbreviated to TIBA) gas, diisobutylamine $([(CH_3)_2CHCH_2]_2NH$, abbreviated to DIBA) gas, monoisobutylamine $((CH_3)_2CHCH_2NH_2$, abbreviated to MIBA) gas or the like. As such, examples of the amine-based gas may preferably include at least one gas of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (where, x is an integer from 1 to 3).

The amine-based gas acts as a nitrogen source as well as a carbon source. By using amine-based gas as the carbon and nitrogen-containing gas, ratios of the carbon component and the nitrogen component in the SiCBN film can be easily controlled to increase.

Instead of the amine-based gas, a gas containing an organic hydrazine compound, i.e., an organic hydrazine-based gas, may be used as the carbon and nitrogen-containing gas. An organic hydrazine-based gas refers to a gas having a hydrazine group, such as an organic hydrazine gas or the like, containing carbon (C), nitrogen (N), and hydrogen (H). Thus, the organic hydrazine-based gas is a gas including no silicon and metal. Examples of the organic hydrazine-based gas may preferably include methylhydrazine-based gas obtained by vaporizing monomethylhydrazine (($CH_3$)$HN_2H_2$, abbreviated to MMH) gas, dimethylhydrazine (($CH_3$)$_2N_2H_2$, abbreviated to DMH) gas, trimethylhydrazine (($CH_3$)$_2N_2(CH_3)H$, abbreviated to TMH) gas or the like, or ethylhydrazine-based gas obtained by vaporizing ethylhydrazine (($C_2H_5$)$HN_2H_2$, abbreviated to EH) gas or the like, etc. For example, in the case of employing organic hydrazine such as MMH which is in a liquid state under normal temperature and pressure, the liquid organic hydrazine may be vaporized by a vaporizing system such as a vaporizer or a bubbler to be supplied as an organic hydrazine-based gas (i.e., a carbon and nitrogen-containing gas (e.g., MMH gas)). A gas including an organic hydrazine compound may be simply referred to as an organic hydrazine compound gas or an organic hydrazine gas.

(Performing Predetermined Number of Times)

When one cycle including the above-described Steps 1D to 3D is performed one or more times (i.e., a predetermined number of times), it is possible to form a silicon borocarbonitride (SiBCN) film having a borazine ring skeleton and including a predetermined composition with a predetermined film thickness, i.e., a thin film having a borazine ring skeleton and including Si, B, C, and N, on the wafer 200. Also, the above-described cycle may be performed multiple times. That is, it is possible that a thickness of the SiBCN layer containing the borazine ring skeleton formed per cycle is set to be smaller than a desired film thickness, and the above-described cycle is repeated multiple times until the film of a desired thickness is obtained. In this case, the SiBCN film including the formed borazine ring skeleton may be referred to as a thin film including Si, C, N, and a borazine ring skeleton.

(Second Sequence)

Next, a second sequence of this embodiment will be described. FIG. 14 illustrates a flowchart for forming a film in the second sequence according to the fourth embodiment. FIG. 15A illustrates a timing diagram for supplying a plurality of gases in the second sequence according to the fourth embodiment.

In the second sequence of this embodiment, a film having a borazine ring skeleton and including a predetermined element, boron, carbon, and nitrogen is formed on a substrate by performing a cycle a predetermined number of times. The cycle in which a process of supplying a source gas including a predetermined element and a halogen group to the substrate and a process of supplying a reaction gas including a borazine compound to the substrate are alternately performed a predetermined number of times, and a process of supplying a gas including nitrogen and carbon to the substrate is then performed, under a condition where the borazine ring skeleton in the borazine compound is maintained.

Specifically, a silicon borocarbonitride (SiBCN) film having a borazine ring skeleton is formed as a film having a borazine ring skeleton and including silicon, boron, carbon, and nitrogen on the wafer 200 by performing a cycle a predetermined number of times. The cycle includes a process of supplying a chlorosilane-based source gas including silicon and a chloro group to the wafer 200 in the process chamber 201 and forming a silicon (Si)-containing layer including chlorine (Cl) as a first layer including silicon and a chloro group (chlorine) on the wafer 200, and a process of supplying a reaction gas including a borazine compound to the wafer 200 in the process chamber 201 and forming a silicon borocarbonitride (SiBCN) layer having a borazine ring skeleton as a second layer having a borazine ring skeleton and including silicon, boron, carbon, and nitrogen on the wafer 200 by modifying the first layer through reaction of the first layer with the borazine compound. The above two processes are alternately performed a predetermined number of times (multiple times) under a condition where the borazine ring skeleton in the borazine compound is maintained. In the cycle, a process of supplying a gas including nitrogen and carbon to the wafer 200 in the process chamber 201 and forming a silicon borocarbonitride (SiBCN) layer having a borazine ring skeleton as a third layer having a borazine ring skeleton and including silicon, boron, carbon, and nitrogen on the wafer 200 by modifying the second layer through reaction of the second layer with the gas including nitrogen and carbon to adjust a nitrogen component and a carbon component of the second layer is then performed under a condition where the borazine ring skeleton in the second layer is maintained.

As such, in this sequence, by performing a predetermined number of times a cycle in which a set of Steps 1D and 2D in the above-described first sequence is repeated multiple times and Step 3D is then performed, a SiBCN film having a borazine ring skeleton and including a predetermined composition with a predetermined film thickness is formed on the wafer 200. FIG. 15A shows an example of performing n times a cycle in which a set of Steps 1D and 2D is performed twice and Step 3D is then performed, leading to forming a SiBCN film having a borazine ring skeleton and including a predetermined composition with a predetermined film thickness on the wafer 200. This second sequence is the same as the first sequence except that Step 3D is performed after repeating the set of Steps 1D and 2D multiple times. In addition, this second sequence may have the same process conditions as the first sequence.

(Effects According to the Embodiment)

The film forming sequence of this embodiment has the same advantages as those of the first embodiment. That is to say, it is possible to form a SiBCN film or a SiBN film having high resistance to hydrogen fluoride (HF) and a small dielectric constant in a low temperature range with a high productivity, when compared with a conventional SiCN film, SiOCN film, and the like. Thus, it is possible to form a thin film which realizes increased resistance of HF and a decreased dielectric constant, which may be in a trade-off relationship, in a low temperature range with a high productivity.

In addition, in Step 3D according to the film forming sequence of this embodiment, when nitrogen and carbon included in the TEA gas are added to the second layer, a nitrogen component and a carbon component of the modified second layer, i.e., the third layer, can be increased. As such, the third layer becomes a SiBCN layer with increased (adjusted) nitrogen and carbon components and accordingly, a SiBCN film with increased (adjusted) nitrogen and carbon components can be formed on the wafer 200. In addition, when the thermally-activated TEA gas without being plasma-excited is flown into the process chamber 201, separating (extracting) of the carbon component from the second layer can be relatively mitigated and a ratio of the carbon component in the third layer (e.g., SiBCN film) can be easily controlled to increase.

Modification

Although it is described in the above first and second sequences that Step 3D of supplying a gas including carbon and nitrogen (e.g., TEA gas) is performed after Step 2D of supplying a reaction gas (e.g., TMB gas) including a borazine compound is performed, the present disclosure is not limited to this embodiment. That is, in the present disclosure, Step 3D may be performed before Step 2D without being limited to the case where Step 2D is performed before Step 3D. For example, as shown in FIG. 13B, by performing one cycle including Steps 1D, 3D, and 2D in this order one or more times (i.e., a predetermined number of times), a silicon borocarbonitride (SiBCN) film having a borazine ring skeleton and including a predetermined composition with a predetermined film thickness may be formed on the wafer 200. In addition, for example, as shown in FIG. 15B, by performing a predetermined number of times a cycle in which a set of Steps 1D and 3D is repeated multiple times and Step 2D is the performed, a SiBCN film having a borazine ring skeleton and including a predetermined composition with a predetermined film thickness may be formed on the wafer 200.

In addition, by performing Step 3D after Step 1D, the TEA gas reacts with the first layer (silicon-containing layer including Cl) formed in Step 1D. This reaction allows the first layer (silicon-containing layer including Cl) to be changed (modified) to a layer containing Si, Cl, C, and N (i.e., SiCN layer including Cl). In addition, the SiCN layer including Cl becomes a layer which contains Si, Cl, C, and N and has a thickness of, for example, less than one atom layer to several atom layers. In addition, the SiCN layer including Cl has a relatively high ratio of Si and C components, i.e., Si-rich as well as C-rich.

In addition, by performing Step 2D after Step 3D, the TMB gas reacts with the SiCN layer including Cl formed in Step 3D. This reaction allows the SiCN layer including Cl to be changed (modified) to the second layer having a borazine ring skeleton and including Si, B, C, and N, i.e., a silicon borocarbonitride (SiBCN) layer having a borazine ring skeleton.

Accordingly, by performing a predetermined number of times a cycle including Step 1D, 3D, and 2D in this order or by performing a predetermined number of times a cycle in which a set of Steps 1D and 3D is repeated multiple times and Step 2D is then performed, a SiBCN film having a borazine ring skeleton and including a predetermined composition with a predetermined film thickness can be formed on the wafer 200.

Other Embodiments of the Present Disclosure

Although various embodiments are described in the above, the present disclosure is not limited to these embodiments and various modifications and changes may be made without departing from the spirit and scope of the present disclosure.

For example, although an example of using a chlorosilane-based source as a source to form a first layer in each sequence is illustrated in the above embodiments, the chlorosilane-based source may be replaced with any other suitable silane-based source having a halogen-based ligand. For example, the chlorosilane-based source may be replaced with a fluorosilane-based source. Here, the fluorosilane-based source refers to a silane-based source which has a fluoro group as a halogen group and includes at least silicon (Si) and fluorine (F). Examples of the fluorosilane-based source gas may include silicon fluoride gas such as tetrafluorosilane (e.g., silicon tetrafluoride ($SiF_4$)) gas, hexafluorosilane ($Si_2F_6$) gas, or the like. In this case, the fluorosilane-based source is supplied to the wafer 200 in the process chamber 201 to form the first layer in each sequence. In this case, the first layer becomes a layer including Si and F, i.e., a silicon-containing layer including F.

In addition, although an example of forming one kind of film (single film) at a time on the wafer 200 in the process chamber 201 is illustrated in the embodiments, a stacked film including two or more kinds of films can be also formed at a time on the wafer 200 in the process chamber 201 by proper combinations of the above-described sequences. For example, a stacked film including alternating SiBCN and SiBN films can be formed by alternately performing a film forming sequence in each of the first, third, and fourth embodiments and a film forming sequence in the second embodiment in-situ in the process chamber 201.

In this manner, the present disclosure can be appropriately applied to formation of a stacked film as well as a single film, providing the same operations and effects as those of the above embodiments.

In addition, when a SiBCN film or a SiBN film formed according to the above embodiments is used as a sidewall spacer, it is possible to provide device forming techniques with small leak current and excellent workability.

In addition, when a SiBCN film or a SiBN film formed according to the above embodiments is used as an etching stopper, it is possible to provide device forming techniques with excellent workability.

According to the above embodiments, it is possible to form a SiBCN film or a SiBN having an ideal stoichiometry without using plasma even in a low temperature range. In addition, since the SiBCN film or the SiBN film can be formed without using plasma, the above embodiments may be applied to processes which are concerned about plasma damage, for example, forming a SADP film of DPT.

In addition, although an example of forming a silicon-containing insulating film such as a silicon borocarbonitride film (SiBCN film) and a silicon boronitride film (SiBN film) is illustrated in the above embodiments, the present disclosure may be applied to a case where a metal-based film including a metal element, for example, titanium (Ti), zirconium (Zr), hafnium (Hf), tantalum (Ta), aluminum (Al), molybdenum (Mo), and the like is formed.

For example, the present disclosure may be appropriately applied to a case where a Ti-based film such as a titanium borocarbonitride film (TiBCN film) and a titanium boronitride film (TiBN film), a combination thereof, a mixture thereof, or a stacked film thereof is formed.

For example, the present disclosure may be suitably appropriately to a case where a Zr-based film such as a zirconium borocarbonitride film (ZrBCN film) and a zirconium boronitride film (ZrBN film), a combination thereof, a mixture thereof, or a stacked film thereof is formed.

For example, the present disclosure may be appropriately applied to a case where a Hf-based film such as a hafnium borocarbonitride film (HfBCN film) and a hafnium boronitride film (HfBN film), a combination thereof, a mixture thereof, or a stacked film thereof is formed.

For example, the present disclosure may be appropriately applied to a case where a Ta-based film such as a tantalum borocarbonitride film (TaBCN film) and a tantalum boronitride film (TaBN film), a combination thereof, a mixture thereof, or a stacked film thereof is formed.

For example, the present disclosure may be appropriately applied to a case where an Al-based film such as an aluminum borocarbonitride film (AlBCN film) and an aluminum boronitride film (AlBN film), a combination thereof, a mixture thereof, or a stacked film thereof is formed.

For example, the present disclosure may be appropriately applied to a case where a Mo-based film such as a molybdenum borocarbonitride film (MoBCN film) and a molybdenum boronitride film (MoBN film), a combination thereof, a mixture thereof, or a stacked film thereof is formed.

In this case, instead of a chlorosilane-based source as used in the above embodiments, a source gas including a metal element and a halogen group may be used to form a film using the same sequences as the above embodiments. For example, a source gas including a metal element and a chloro group and a source gas including a metal element and a fluoro group may be used.

In this case, a metal-based film having a borazine ring skeleton and including a metal element, boron, carbon, and nitrogen is formed on the wafer 200 by performing a predetermined number of times a cycle including a process of supplying a source gas including a metal element and a halogen group to the wafer 200 in the process chamber 201 and a process of supplying a reaction gas including a borazine compound to the wafer 200 in the process chamber 201 under a condition where the borazine ring skeleton in the borazine compound is maintained.

In addition, a metal-based film having a borazine ring skeleton and including a metal element, boron, carbon, and nitrogen or a metal-based film having a borazine ring skeleton and including a metal element, boron, and nitrogen may be formed on the wafer 200 by performing a predetermined number of times a cycle including a process of supplying a source gas including a metal element and a halogen group to the wafer 200 in the process chamber 201, a process of supplying a reaction gas including a borazine compound to the wafer 200 in the process chamber 201, and a process of supplying a nitridation gas to the wafer 200 in the process chamber 201 under a condition where the borazine ring skeleton in the borazine compound is maintained.

In addition, a metal-based film having a borazine ring skeleton and including a metal element, boron, carbon, and nitrogen may be formed on the wafer 200 by performing a predetermined number of times a cycle including a process of supplying a source gas including a metal element and a halogen group to the wafer 200 in the process chamber 201, a process of supplying a carbon-containing gas to the wafer 200 in the process chamber 201, and a process of supplying a reaction gas including a borazine compound to the wafer 200 in the process chamber 201 under a condition where the borazine ring skeleton in the borazine compound is maintained.

In addition, a metal-based film having a borazine ring skeleton and including a metal element, boron, carbon, and nitrogen may be formed on the wafer 200 by performing a predetermined number of times a cycle including a process of supplying a source gas including a metal element and a halogen group to the wafer 200 in the process chamber 201, a process of supplying a reaction gas including a borazine compound to the wafer 200 in the process chamber 201, and a process of supplying a gas including nitrogen and carbon to the wafer 200 in the process chamber 201 under a condition where the borazine ring skeleton in the borazine compound is maintained.

For example, if a Ti-based film is formed as a metal-based film, a gas including Ti and chloro groups such as titanium tetrachloride ($TiCl_4$) or the like, or a gas including Ti and fluoro groups such as titanium tetrafluoride ($TiF_4$) or the like may be used as source gas. In this case, the same reaction gas (having a borazine compound), nitridation gas, carbon-containing gas, and gas including nitrogen and carbon as described in the above embodiments may be used. In addition, the same process conditions as in the above embodiments may be used.

For example, if a Zr-based film is formed as a metal-based film, a gas including Zr and chloro groups such as zirconium tetrachloride ($ZrCl_4$) or the like, or a gas including Zr and fluoro groups such as zirconium tetrafluoride ($ZrF_4$) or the like may be used as a source gas. In this case, the same reaction gas (having a borazine compound), nitridation gas, carbon-containing gas, and gas including nitrogen and carbon as described in the above embodiments may be used. In addition, the same process conditions as in the above embodiments may be used.

For example, if a Hf-based film is formed as a metal-based film, a gas including Hf and chloro groups such as hafnium tetrachloride ($HfCl_4$) or the like, or a gas including Hf and fluoro groups such as hafnium tetrafluoride ($HfF_4$) or the like may be used as a source gas. In this case, the same reaction gas (including a borazine compound), nitridation gas, carbon-containing gas, and gas including nitrogen and carbon as described in the above embodiments may be used. In addition, the same process conditions as in the above embodiments may be used.

In this manner, the present disclosure can be appropriately applied to formation of a metal-based film as well as a silicon-based film, providing the same operations and effects as those of the above embodiments.

In brief, the present disclosure may be appropriately applied to a case where films including predetermined elements such as semiconductor elements, metal elements, and the like are formed.

In addition, although the example of forming the films using the batch type substrate processing apparatus to process a plurality of substrates at once is described in the above embodiments, the present disclosure is not limited thereto but may be appropriately applied to film formation using a single type substrate processing apparatus to process a single substrate or several substrates at once.

In addition, the above embodiments, modifications and applications may be used in proper combinations.

In addition, the present disclosure may be implemented by change of process recipes of an existing substrate processing apparatus, for example. The change of process recipes may include installing the process recipes of the present disclosure in the existing substrate processing apparatus via a telecommunication line or a recording medium storing the process recipes, and operating the existing substrate processing apparatus to change its process recipes into the process recipes of one or more of the embodiments described.

Further Additional Aspects of the Present Disclosure

Hereinafter, some aspects of the present disclosure will be additionally stated.

According to an aspect of the present disclosure, there is provided a method of manufacturing a semiconductor device, the method including forming a thin film including a predetermined element and a borazine ring skeleton on a substrate by performing a cycle a predetermined number of times, the cycle including supplying a source gas including the predetermined element and a halogen group to the substrate; and supplying a reaction gas including a borazine compound to the substrate, wherein the cycle is performed under a condition where the borazine ring skeleton in the borazine compound is maintained.

In some embodiments, in the act of supplying the source gas, a first layer including the predetermined element and the halogen group is formed, and in the act of supplying the reaction gas, a second layer including the predetermined element and the borazine ring skeleton is formed by causing the first layer to react with the borazine compound to modify the first layer.

In some embodiments, in the act of supplying the reaction gas, the halogen group included in the first layer is caused to react with a ligand included in the borazine compound.

In some embodiments, in the act of supplying the reaction gas, the halogen group included in the first layer is caused to react with a ligand included in the borazine compound to separate the halogen group reacted with the ligand from the first layer and separate (extract) the ligand reacted with the halogen group from the borazine compound.

In some embodiments, in the act of supplying the reaction gas, the halogen group included in the first layer is caused to react with a ligand included in the borazine compound to separate the halogen group reacted with the ligand from the first layer and separate (extract) the ligand reacted with the halogen group from the borazine compound, thereby bonding the predetermined element included in the first layer with the borazine compound from which the ligand is separated.

In some embodiments, in the act of supplying the reaction gas, the halogen group included in the first layer is caused to react with a ligand included in the borazine compound to separate the halogen group reacted with the ligand from the first layer and separate (extract) the ligand reacted with the halogen group from the borazine compound, thereby bonding the predetermined element included in the first layer with a portion of the borazine ring skeleton in the borazine compound from which the ligand is separated.

In some embodiments, in the act of supplying the reaction gas, the halogen group included in the first layer is caused to react with a ligand included in the borazine compound to separate the halogen group reacted with the ligand from the first layer and separate (extract) the ligand reacted with the halogen group from the borazine compound, thereby bonding the predetermined element included in the first layer with nitrogen constituting the borazine ring skeleton in the borazine compound from which the ligand is separated.

In some embodiments, the act of supplying the reaction gas is performed under a condition where the halogen group included in the first layer is caused to react with a ligand included in the borazine compound.

In some embodiments, the act of supplying the reaction gas is performed under a condition where the halogen group included in the first layer is caused to react with a ligand included in the borazine compound to separate (extract) the halogen group reacted with the ligand from the first layer and separate the ligand reacted with the halogen group from the borazine compound.

In some embodiments, the act of supplying the reaction gas is performed under a condition where the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with the borazine compound from which the ligand is separated.

In some embodiments, the act of supplying the reaction gas is performed under a condition where the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with a portion of the borazine ring skeleton of the borazine compound from which the ligand is separated.

In some embodiments, the act of supplying a reaction gas is performed under a condition where the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with nitrogen constituting the borazine ring skeleton in the borazine compound from which the ligand is separated.

In some embodiments, the act of supplying a reaction gas includes: setting a temperature of the substrate to a temperature to react the halogen group included in the first layer with a ligand included in the borazine compound.

In some embodiments, the act of supplying the reaction gas includes setting a temperature of the substrate to a temperature at which the halogen group included in the first layer is caused to react with a ligand included in the borazine compound to separate (extract) the halogen group reacted with the ligand from the first layer and separate the ligand reacted with the halogen group from the borazine compound.

In some embodiments, the act of supplying the reaction gas includes setting a temperature of the substrate to a temperature at which the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with the borazine compound from which the ligand is separated.

In some embodiments, the act of supplying the reaction gas includes setting a temperature of the substrate to a temperature at which the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with a portion of the borazine ring of the borazine compound from which the ligand is separated.

In some embodiments, the act of supplying the reaction gas includes setting a temperature of the substrate to a temperature at which the halogen group included in the first layer is caused to react with a ligand included in the borazine compound to separate (extract) the halogen group reacted with the ligand from the first layer and separate the ligand reacted with the halogen group from the borazine compound, thereby bonding the predetermined element included in the first layer with nitrogen constituting the borazine ring of the borazine compound from which the ligand is separated.

According to another aspect of the present disclosure, there is provided a method of manufacturing a semiconductor device, the method including forming a thin film including a predetermined element and a borazine ring skeleton on a substrate by performing a cycle a predetermined number of times, the cycle including forming a first layer including the predetermined element and a halogen group by supplying a source gas including the predetermined element and the halogen group to the substrate; and supplying a reaction gas including a borazine compound to the substrate; and, under a condition where a borazine ring skeleton in the borazine compound is maintained, forming a second layer including the predetermined element and the borazine ring skeleton by modifying the first layer through reaction of the first layer with the borazine compound.

In some embodiments, in the act of forming the thin film, the act of supplying the source gas and the act of supplying the reaction gas are alternately performed the predetermined number of times.

In some embodiments, in the act of forming the thin film, the act of supplying the source gas and the act of supplying the reaction gas are simultaneously performed.

In some embodiments, the cycle further includes supplying a gas including nitrogen and/or carbon.

In some embodiments, the cycle further includes supplying a nitridation gas to the substrate.

In some embodiments, the cycle includes alternately performing a predetermined number of times the act of supplying the source gas and the act of supplying the reaction gas; and performing the act of supplying the nitridation gas.

In some embodiments, the act of supplying a nitridation gas includes: supplying the nitridation gas activated by heat to the substrate.

In some embodiments, the act of supplying a nitridation gas includes: supplying the nitridation gas activated by plasma to the substrate.

In some embodiments, the cycle further includes supplying a gas including carbon.

In some embodiments, the cycle further includes supplying a gas including nitrogen and carbon.

In some embodiments, the cycle includes alternately performing a predetermined number of times the act of supplying the source gas and the act of supplying the reaction gas; and performing the act of supplying the gas including nitrogen and carbon.

In some embodiments, the cycle is performed a predetermined number of times under a condition of non-plasma.

In some embodiments, the thin film is a thin film having the borazine ring skeleton and including the predetermined element, boron, carbon, and nitrogen or a thin film having the borazine ring skeleton and including the predetermined element, boron, and nitrogen.

According to still another aspect of the present disclosure, there is provided a method of manufacturing a semiconductor device, the method including forming a thin film having a borazine ring skeleton and including a predetermined element, boron, carbon, and nitrogen or a thin film having the borazine ring skeleton and including the predetermined element, boron, and nitrogen on a substrate by performing a cycle a predetermined number of times, the cycle including supplying a source gas containing the predetermined element and a halogen group to the substrate; supplying a reaction gas including a borazine compound to the substrate; and supplying a gas including nitrogen and/or carbon to the substrate under a condition where the borazine ring skeleton in the borazine compound is maintained.

According to yet another aspect of the present disclosure, there is provided a method of manufacturing a semiconductor device, the method including forming a thin film having a borazine ring skeleton and including a predetermined element, boron, carbon, and nitrogen or a thin film having the borazine ring skeleton and including the predetermined element, boron, and nitrogen on a substrate by performing a cycle a predetermined number of times, the cycle including supplying a source gas including the predetermined element and a halogen group to the substrate; supplying a reaction gas including a borazine compound to the substrate; and supplying a nitridation gas to the substrate under a condition where the borazine ring skeleton in the borazine compound is maintained.

According to yet another aspect of the present disclosure, there is provided a method of manufacturing a semiconductor device, the method including forming a thin film having a borazine ring skeleton and including a predetermined element, boron, carbon, and nitrogen or a thin film having the borazine ring skeleton and including the predetermined element, boron, and nitrogen on a substrate by performing a cycle a predetermined number of times, in which supplying a source gas including the predetermined element and a halogen group to the substrate and supplying a reaction gas including a borazine compound to the substrate are alternately performed a predetermined number of times; and supplying a nitridation gas to the substrate is performed under a condition where the borazine ring skeleton in the borazine compound is maintained.

According to yet another aspect of the present disclosure, there is provided a method of manufacturing a semiconductor device, the method including forming a thin film having a borazine ring skeleton and including a predetermined element, boron, carbon, and nitrogen on a substrate by performing a cycle a predetermined number of times, the cycle including supplying a source gas including the predetermined element and a halogen group to the substrate; supplying a carbon-containing gas to the substrate; and supplying a reaction gas including a borazine compound to the substrate under a condition where the borazine ring skeleton in the borazine compound is maintained.

According to yet another aspect of the present disclosure, there is provided a method of manufacturing a semiconductor device, the method including forming a thin film having a borazine ring skeleton and including a predetermined element, boron, carbon, and nitrogen on a substrate by performing a cycle a predetermined number of times, the cycle including supplying a source gas including the predetermined element and a halogen group to the substrate; supplying a reaction gas including a borazine compound to the substrate; and supplying a gas including nitrogen and carbon to the substrate under a condition where the borazine ring skeleton in the borazine compound is maintained.

According to yet another aspect of the present disclosure, there is provided a method of manufacturing a semiconductor device, the method including forming a thin film having a borazine ring skeleton and including a predetermined element, boron, carbon, and nitrogen on a substrate by performing a cycle a predetermined number of times in which supplying a source gas including the predetermined element and a halogen group to the substrate and supplying a reaction gas including a borazine compound to the substrate are alternately performed a predetermined number of times; supplying a gas including nitrogen and carbon to the substrate is performed under a condition where the borazine ring skeleton in the borazine compound is maintained.

According to yet another aspect of the present disclosure, there is provided a method of processing a substrate, the method including forming a thin film including a predetermined element and a borazine ring skeleton on a substrate by performing a cycle a predetermined number of times, the cycle including supplying a source gas including the predetermined element and a halogen group to the substrate; and supplying a reaction gas including a borazine compound to the substrate under a condition where the borazine ring skeleton in the borazine compound is maintained.

According to yet another aspect of the present disclosure, there is provided a substrate processing apparatus including a process chamber configured to accommodate a substrate; a source gas supply system configured to supply a source gas including a predetermined element and a halogen group to the substrate in the process chamber; a reaction gas supply system configured to supply a reaction gas including a borazine compound to the substrate in the process chamber; a heater configured to heat the substrate in the process chamber; a pressure adjustor configured to adjust an internal pressure of the process chamber; and a controller configured to control the source gas supply system, the reaction gas supply system, the heater, and the pressure adjustor such that a thin film including the predetermined element and a borazine ring skeleton is formed on the substrate by performing a cycle a predetermined number of times, the cycle including supplying the source gas including the predetermined element and the halogen group to the substrate; and supplying the reaction gas including the borazine compound to the substrate, wherein the cycle is performed under a condition where the borazine ring skeleton in the borazine compound is maintained.

According to yet another aspect of the present disclosure, there is provided a program that causes a computer to perform a process of forming a thin film including a predetermined element and a borazine ring skeleton on a substrate by performing a cycle a predetermined number of times, the cycle including supplying a source gas including the predetermined element and a halogen group to the substrate; and supplying a reaction gas including a borazine compound to the substrate, wherein the cycle is performed under a condition where the borazine ring skeleton in the borazine compound is maintained.

According to yet another aspect of the present disclosure, there is provided a non-transitory computer-readable recording medium storing a program that causes a computer to perform a process of forming a thin film including a predetermined element and a borazine ring skeleton on a substrate by performing a cycle a predetermined number of times, the cycle including supplying a source gas including the predetermined element and a halogen group to the substrate; and supplying a reaction gas including a borazine compound to the substrate, wherein the cycle is performed under a condition where the borazine ring skeleton in the borazine compound is maintained.

According to the present disclosure in some embodiments, it is possible to provide a method of manufacturing a semiconductor device, a substrate processing apparatus, and a recording medium, which are capable of forming a thin film having high HF resistance and a low dielectric constant in a low temperature range with a high productivity.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising forming a thin film including a predetermined element and a borazine ring skeleton on a substrate by performing a cycle a first predetermined number of times, the cycle comprising:
   supplying a source gas including the predetermined element and a halogen group to the substrate; and
   supplying a reaction gas including a borazine compound to the substrate,
   wherein the cycle is performed under a condition where the borazine ring skeleton in the borazine compound is maintained.

2. The method according to claim 1, wherein in the act of supplying the source gas, a first layer including the predetermined element and the halogen group is formed, and
   wherein in the act of supplying the reaction gas, a second layer including the predetermined element and the borazine ring skeleton is formed by causing the first layer to react with the borazine compound to modify the first layer.

3. The method according to claim 2, wherein in the act of supplying the reaction gas, the halogen group included in the first layer is caused to react with a ligand included in the borazine compound.

4. The method according to claim 2, wherein in the act of supplying the reaction gas, the halogen group included in the first layer is caused to react with a ligand included in the borazine compound to separate the halogen group reacted with the ligand from the first layer and separate the ligand reacted with the halogen group from the borazine compound.

5. The method according to claim 1, wherein in the act of forming the thin film, the act of supplying the source gas and the act of supplying the reaction gas are alternately performed the first predetermined number of times.

6. The method according to claim 1, wherein in the act of forming the thin film, the act of supplying the source gas and the act of supplying the reaction gas are simultaneously performed.

7. The method according to claim 1, wherein the cycle further comprises supplying a gas including nitrogen, a gas including carbon, or a gas including nitrogen and carbon to the substrate.

8. The method according to claim 1, wherein the cycle further comprises supplying a nitridation gas to the substrate.

9. The method according to claim 8, wherein the cycle comprises:
   alternately performing a second predetermined number of times the act of supplying the source gas and the act of supplying the reaction gas; and
   performing the act of supplying the nitridation gas.

10. The method according to claim 8, wherein in the act of supplying the nitridation gas, the nitridation gas which is activated by heat is supplied to the substrate.

11. The method according to claim 8, wherein in the act of supplying the nitridation gas, the nitridation gas which is activated by plasma is supplied to the substrate.

\* \* \* \* \*